(12) United States Patent
Hagenbuch et al.

(10) Patent No.: US 9,529,964 B2
(45) Date of Patent: *Dec. 27, 2016

(54) PROCESS FOR THREE-DIMENSIONAL MODELING AND DESIGN OF OFF-HIGHWAY DUMP BODIES

(76) Inventors: LeRoy G. Hagenbuch, Peoria Heights, IL (US); Philip T. Brinkman, Canton, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/364,878

(22) Filed: Feb. 2, 2012

(65) Prior Publication Data

US 2012/0201647 A1 Aug. 9, 2012

Related U.S. Application Data

(63) Continuation of application No. 12/106,794, filed on Apr. 21, 2008, now Pat. No. 8,113,763, which is a continuation of application No. 09/593,647, filed on Jun. 13, 2000, now Pat. No. 7,369,978, which is a continuation-in-part of application No. 09/333,379, filed on Jun. 15, 1999, now Pat. No. 7,412,357.

(51) Int. Cl.
    *G06F 17/50* (2006.01)
    *G06T 19/00* (2011.01)

(52) U.S. Cl.
    CPC ........... *G06F 17/5095* (2013.01); *G06T 19/00* (2013.01)

(58) Field of Classification Search
    USPC .................. 703/2, 6; 414/809; 296/183.2
    See application file for complete search history.

(56) References Cited

U.S. PATENT DOCUMENTS

| 3,890,006 A | 6/1975 | Stockwell |
| 4,190,265 A | 2/1980 | Goodbary et al. |
| 4,392,769 A | 7/1983 | Lowery |
| 4,614,477 A | 9/1986 | Hagenbuch |
| 4,684,152 A | 8/1987 | Goodbary et al. |
| 4,691,792 A | 9/1987 | Shintani et al. |

(Continued)

FOREIGN PATENT DOCUMENTS

WO     WO 00/76805 A1     12/2000

OTHER PUBLICATIONS

International Organization for Standardization, ISO 6483-1980(E), "Earth Moving Machinery-Dumper Bodies Volumetric Rating", Sep. 15, 1980.

(Continued)

*Primary Examiner* — Thai Phan
(74) *Attorney, Agent, or Firm* — Leydig, Voit & Mayer, Ltd.

(57) ABSTRACT

A method is provided for loading material into a dump body of a truck using a loading bucket whose volumetric capacity is approximately ⅓ or more than that of the dump body. The loading bucket is filled with an amount of earthen material and centered over the dump body. The bucket is then lowered to a position that: (1) substantially minimizes the clearance between the floor of the dump body and a swinging gate of the loading bucket in its freed position; (2) allows the swinging gate to clear the side walls of the dump body as it swings through an arc after it is freed, and (3) allows the material to be discharged substantially in the center of the dump body. After it is positioned, the swinging gate is then freed so as to release the material held in the bucket.

6 Claims, 28 Drawing Sheets

(56) References Cited

U.S. PATENT DOCUMENTS

| | | | |
|---|---|---|---|
| 4,813,004 | A | 3/1989 | Fujioka et al. |
| 5,259,322 | A | 11/1993 | Domingues et al. |
| 5,297,920 | A | 3/1994 | Pomerville et al. |
| 5,404,661 | A | 4/1995 | Sahm et al. |
| 5,474,363 | A | 12/1995 | Hagenbuch |
| 5,531,122 | A | 7/1996 | Chatman |
| 5,650,930 | A | 7/1997 | Hagenbuch |
| 5,779,092 | A | 7/1998 | Hehn et al. |
| 5,815,960 | A | 10/1998 | Soczka |
| 5,844,564 | A | 12/1998 | Bennis et al. |
| 5,857,825 | A | 1/1999 | Rice |
| 5,887,914 | A | 3/1999 | Hagenbuch |
| 5,936,869 | A | 8/1999 | Sakaguchi |
| 5,996,702 | A | 12/1999 | Hall |
| 6,022,068 | A | 2/2000 | D'Amico |
| 6,106,072 | A | 8/2000 | Lutter |
| 6,157,889 | A | 12/2000 | Baker |
| 6,313,414 | B1 | 11/2001 | Campbell |
| 6,374,201 | B1 | 4/2002 | Grizon et al. |
| 6,547,091 | B2 | 4/2003 | Hagenbuch |
| 6,565,146 | B2 | 5/2003 | Fujan et al. |
| 6,616,400 | B1 | 9/2003 | Caponey |
| 7,257,467 | B2 | 8/2007 | Hagenbuch |
| 7,369,978 | B1 | 5/2008 | Hagenbuch et al. |
| 7,412,357 | B1 | 8/2008 | Hagenbuch |
| 7,735,507 | B2 | 6/2010 | Hagenbuch |
| 7,901,009 | B2 * | 3/2011 | Hagenbuch ............ 298/23 D |
| 2015/0317428 | A1 | 11/2015 | Hagenbuch |

OTHER PUBLICATIONS

Society of Automotive Engineers., *SAE Construction Agriculture and Off-Road Machinery Standards Manual* HS-2800, "Capacity Rating-Dumper Body and Trailer Body", Jan. 1985, p. 380-381.
Duff, Elliot, "*Automated Volume Measurement of Haul-Truck Loads*," CSIRO Manufacturing Science and Technology, Presented at Open Coal Cut Operations Conference, Mackay, Queensland, Jun. 16, 2000.
Hagenbuch, LeRoy, SME Preprint 02-137 entitled "*Off-Highway Truck Body True Capacity . . . Why Can't I Get Rated Payload on my Off-Highway Truck Without Hungry Boards and Tail Extensions*".
Caterpillar, Inc. Product Division, Field Representative Information Release, N149F & 69 Series B Truck, Aug. 1966, p. 1-21.
Caterpillar Inc. Brochure AE026730, Caterpillar 769 Series B Applicants believe available in 1967.
Caterpillar Inc., Brochure AEHQ5186, "*Caterpillar 793C Mining Truck*", Copyright 1996.
Euclid Inc. Form 12-015 "*Euclid R-85 Specifications*", Aug. 1977.
Euclid Inc. Form 12-028, "*Euclid Inc R-85 Hauler Specifications*", Sep. 1985.
VME Americas Inc. Form RH-483, "*Euclid R85 B*", Jan. 1991.
Euclid Inc., Form RH-483 R1, "*Euclid R85B Haul Units*", Aug. 1994.
Liffman, Kurt et al., "Stress in Sandpiles" presented at the *Second International Conference on CFD in the Minerals and Process Industries CSIRO*, Melbourne, Australia Dec. 6-8, 1999, pp. 83-88.
Singh, Sanjiv, "The State of the Art in Automation of Earthmoving", *In ASCE Journal of Aerospace Engineering*, vol. 10, No, 4, Oct. 1997, pp. 1-29.
Fesak, George M., et al, "*Analysis of Surface Powered Haulage Accidents*", Mine Safety and Health Administration, US Department of Labor, Sep. 1996, 11 pages total.
Stentz, Anthony, et al., "*A Robotic Excavator for Autonomous Truck Loading*", Autonomous Robots 7, 1999, pp. 175-186.
"Capacity Rating—Dumper Body and Trailer Body—SAE J1363 Nov. 1995, " *1999 SAE Handbook—vol. 3 On-Highway Vehicles and Off-Highway Machinery, Society of Automotive Engineers, Inc.*.
"Earth-Moving Machinery-Dumper Bodies—Volumetric Rating," *International Standard ISO 6483*; 1980, p. 1-5.

"Komatsu Price Changes," *Equipment Watch Price Alert*, Aug. 2002.
Komatsu 930E-2 truck spec sheet, Jun. 2002.
"Caterpillar Price Changes," *Equipment Watch Price Alert*, Jan. 2003.
Caterpillar 777D Off-Highway Truck, spec sheet, Jun. 2000.
"Mining Lifts Goldfields Crane Hire," *Australia Mining Monthly*; Dec. 2002, p. 67.
"Detroit Diesel—We'll Move Mountains for You," *Australia Mining Monthly*; Aug. 2003.
"Trucks & Shovels," *World Mining Equipment*; Sep. 2003, vol. 27, No. 7 (including Komatsu PC 3000 ad and truck/shovel loading photos).
*North American Quarry News*, 2003-DBT Mineral Processing ad.
*Mining Engineer*, front cover; May 2003.
"P&H 2800 XP Shovel," *Perspective in Mining*, vol. 7, No. 2, p. 4.
"Excavator Selection," *Peak & Performance Practices*, front cover.
"Angles of Repose (Heap)"; Chart, Philippi-Hagenbuch, Inc. 2003.
Oner, Mete, "Deep Dark Secrets of Geotechnical Engineering," *EJGE/Magazine*, internet article 1997; p. 1-4.
"B.2.60 Angle of Repose," web page from *Michigan State University Department of Physics and Astronomy Lecture Demonstrations Databases*, downloaded Sep. 28, 2003.
"Angle of Repose," web page from *Michigan Tech University*, downloaded Sep. 28, 2003.
"Angle of Repose," web page from *NCSU Physics DemoRoom*, downloaded Sep. 28, 2003.
"Angle of Repose and Angle of Marginal Stability," web page from http://www.hlrs.de/people/mueller/papers/parallelMD99/node3.html, downloaded Sep. 28, 2003.
"Angle of Repose," web page from www.HyperDictionary.com, downloaded Sep. 28, 2003.
"Angle of Repose," web page from *University of Texas at Austin Physics Department*, downloaded Sep. 28, 2003.
Faris, Roger, "Find Your Safe Angle of Repose," internet article from *The Seattle Press*, downloaded Sep. 28, 2003.
"Mass Wasting and the Angle of Repose," internet article from http://phoenix.liuent.edu/~divernere/notes/angle_of_repose.htm; p. 1-3, downloaded Sep. 28, 2003.
Angle of Repose diagram from Brunner Mond, undated.
"Angle of Repose," charts from web page http://www.geol.umd.edu/~kaufman/ppt/chapter8/sld006.htm; p. 1-2, downloaded Oct. 4, 2003.
Lee, J. et al., "Angle of Repose and Angle of Marginal Stability: Molecular Dynamics of Granular Particles," abstract article from www.IOP.org/EJ/abstract/0305-4470/26/2/01; p. 1-2, Jan. 21, 1993.
"Angle of Repose," web page from www.RCRC.nm.org/glossary/gl-angle-of-repose.html, downloaded Sep. 28, 2003.
Olson, C.J. et al., "Effect of Grain Geometry on Angle of Repose and Dynamics," internet article from www.eps.org/aps/meet/MAR01/baps/abs/S338005.html, downloaded Sep. 28, 2003.
"Effect of Water on the Angle of Repose," slide 2 of 35 from internet site www.ideo.columbia.edu/dees/ees/ies2/masswasting/sld002.html, downloaded Sep. 28, 2003.
"Dynamics Angles of Repose," internet article from http://groups.physics.umn.edu/sand/theory.shtml; p. 1-2, downloaded Sep. 28, 2003.
Morisawa, Marie, "Stable Angles of Slopes," from www.beloit.edu/~SEPM/EArth_Works/Stable_angles_of_slopes.html; p. 1-4, downloaded Sep. 28, 2003.
Park; Brien, "What do you suppose is the "angle of repose"?," web article from www.nps.gov/brca/Geodetect/Earth%20Systems/angle%20of%20repose.htm; p. 1-4, Jul. 9, 2002.
"Sand Angels," web article from www.edgerton.org/kidscorner/sandangels.html; p. 1-2, downloaded Sep. 28, 2003.
Excerpt from "Highways in the River Environment," p. 1-4; 1975.
"Sand Piles," web page from http://van.hep.uluc.edu/van/qa/section/Everything_Else/Hard_to_Categorize/924816567.htm, downloaded Sep. 28, 2003.
"Slope Stability Lab," web page from www.geo.arizona.edu/K-12/azpepp/education/activity/la.html; p. 1-4, downloaded Sep. 28, 2003.

(56) References Cited

OTHER PUBLICATIONS

"The Angle of Repose and the Static Coefficient of Friction," web page from www.redcompservices.com/Pcourses/Phys1/repose.htm; p. 1-2, downloaded Sep. 28, 2003.
Prompalagorn, Wiroj et al., "Priction Coefficient & Angle of Repose Equipments," web abstract from http://library.kmitnb.ac.th/projects/eng/MHT/mht0096e.html, 1996.
"Slope Stability Lab," p. 1-4 (undated).
"Angle of Repose," slide 3 of presentation, http://www3.uakron.edu/geography/lrb/physf97/lectures/masswaste/sld003.htm, downloaded Sep. 28, 2003.
Chase, George G., "Solids Notes," University of Akron (undated), pp. 4-1 and 4-2.
"Mass Wasting," (undated); p. 1-7.
"CHASM: Cone Handling Algorithms for Stockpile Modeling," web article from www.cmis.csiro.au/PPI/RecentProjects/CHASM.htm; p. 1-3, downloaded Sep. 28, 2003.
"Axial Segregation in Binary Granular Flows," abstract from www.aae.uiuc.edu/floatn/C%20PROJ/pp02-03f.htm, p. 1-2, downloaded Sep. 28. 2003.
Bulk-Store Structures Inc. internet brochure from www.bulk-store.ca/fert.html; p. 1-3; 2000.
Commercial Hopper Tank Storage Capacities and Heights spec sheet; 2002.
"Volcanism Behind the Main Arc," web page from www.rci.rutgers.edu/~carr/fieldtext/cuilapa_fldtxt.htm, downloaded Sep. 28, 2003.
"Screening Equipment," SMICO Manufacturing web page www.smico.com, downloaded Oct. 1, 2003.
"Material Bulk Density Reference Chart," SMICO Manufacturing; p. 1-20 (undated).
Hudson, Ralph G., *The Engineers' Manual*: Second Edition 1963; p. 101-102.
"Storage of Farm Crops," *Agricultural Engineers' Handbook*: p. 691, 1961.
"Approximate Angle of Repose of Various Materials," *Caterpillar Performance Handbook*, Jan. 1972, p. 25.
"Tables-Angle of Repose of Various Materials," *Caterpillar Performance Handbook*, Oct. 2002, p. 26-1
"Material Angles of Repose," chart from Philippi-Hagenbuch, Inc., 2003.
Photographs from Caterpillar brochures featuring: 785 Truck (4-88)—AEHQ7006 (undated).
Photographs from Caterpillar brochures featuring 785C Mining Truck (4-02)—AEHQ5328-02 (undated).
Photographs from Caterpillar brochures featuring 785/789 Truck (AEDK1468) (undated).
Photographs from Caterpillar brochures featuring 775B Truck (4-94)—AEHQ3874 (undated).
Photographs from Caterpillar brochures featuring 773E Truck (11-01)—AEHQ5456 (undated).
Photographs from Caterpillar brochures featuring 773E Truck (11-01)—AEHQ5457 (undated).
"Density of Common Materials," *The Excavators 5th Edition-Hitachi*; sections 11-36:11-39 (undated).
"Tables: Weight of Materials," *Caterpillar Performance Handbook Edition 33*, Oct. 2002.
Caterpillar General Dimensions 769B Truck (undated).
Caterpillar Body Assembly 769B Truck (undated).
Sideview drawing showing Ten Different Load Configurations-Load Heaps for the Caterpillar 769B Body, created by Philippi-Hagenbuch, 2003.
"Four "A" Size Isometric Drawings displaying one each possible 1.7:1 load configuration-load heap," for the Caterpillar 769B Truck; created by Philippi-Hagenbuch, 2003.
1.7:1 Heap (1:1 at rear) 30.2 cu yd.
1.7:1 (True Heap) 27.5 cu yd.
1.7:1 Profiled Heap (to a point) 26.0 cu yd.
1.7:1 Profiled Heap (with top plateau) 25.8 cu yd.
"3M Mining" advertisement in *Mining Monthly*; Aug. 2003.

CSIRO—Common Wealth Scientific & Industrial Research Organization of Australia; website home page, downloaded Oct. 5, 2003.
"New Technology to Measure Mining Haul Truck Loads," CSIRO Press Release Jul. 1, 2003.
"New Technology to Measure Mining Haul Truck Loads," article from http://www.cmit.cisro.au/innovation/2003.08; p. 1-2, downloaded Aug. 22, 2003.
"A Proud History," *Euclid Haulers* brochure; p. 2; 1988.
"2:1 Heap," *Euclid-Hitachi* brochure; p. 4; 1995.
"2:1 SAE Heap," *Euclid-Hitachi* brochure: p. 4; 1999.
"2:1 SAE—Euclid R130," *VME Americas Inc.*; p. 4, 1989.
"2:1 SAE—Euclid R190," *VME Americas Inc.*; p. 4; 1990.
"2:1 SAE—Euclid R25," *Euclid Inc.*; 1982.
"2:1 Field Heap—Euclid R35," *Euclid Inc.*; 1983.
"SAE 2:1 Rated Heap," *VME Industries North America*; 1992.
Caterpillar, "*Mine Specific Design (MSD) Body Program*". from CD distributed Oct. 2000 at Mine Expo 2000.
Conymet, "*Photometry Software Tool for Volumetric and Load Distribution Study*", downloaded from www.conymet.com; Nov. 26, 2002.
Conymet, "*High Efficiency Body (HE Series)*", from presentation given May 2002 at Haulage 2002 Conference.
Disca. "*DT-HILOAD Haulage 2002*", from presentation given May 2002 at Haulage 2002 Conference.
Angles of Repose Diagrams, updated (created after filing date of present application).
Selected charts and diagrams from a Philippi-Hagenbuch, Inc. Presentation undated (created after filing date of present application).
Caterpillar 769B Truck product brochure; Aug. 1966.
Caterpillar 769B Truck product brochure specification; undated (applicants believe available in the late 1960's to early 1970's).
Caterpillar 769 B Truck product brochure; Mar. 1974.
Hagenbuch, LeRoy G., "Adapting the Off-Highway Truck Body Volumetric Process to Real World Conditions", *SAE Technical Paper Series*, 2000; undated (applicants believe available in the late 1960's to early 1970's).
*Philippi-Hagenbuch, Inc. and LeRoy G. Hagenbuch v. Western Technology Services International, Inc.*("*Philippi-Hagenbuch v. Western*")—Case #: 1:12:cv:01099-JES-BGC—Central District of Illinois—Court Docket—Feb. 5, 2015.
*Philippi-Hagenbuch v. Western*—DI 87—Proposed Discovery Plan—Apr. 3, 2014.
*Philippi-Hagenbuch v. Western*—DI 89—Notice (of Subpoena for Production of Records)—Apr. 29, 2014.
*Philippi-Hagenbuch v. Western*—DI 95—Response to Defendants' Motion to Compel Damages-Related Documents—Jun. 13, 2014.
*Philippi-Hagenbuch v. Western*—DI 96—Defendants' Joint Motion for Leave to File a Reply—Jun. 20, 2014.
*Philippi-Hagenbuch v. Western*—DI 97—Reply in Support of Motion to Compel Damages-Related Documents—Jun. 23, 2014.
*Philippi-Hagenbuch v. Western*—DI 98—Notice to Take Deposition of Kerry Cole—Jun. 26, 2014.
*Philippi-Hagenbuch v. Western*—DI 99—Notice to Take Deposition of Kerry Cole—Jun. 27, 2014.
*Philippi-Hagenbuch v. Western*—DI 100—Motion to Compel Pursuant to FRCP 37 and 45—Jun. 27, 2014.
*Philippi-Hagenbuch v. Western*—DI 103—Motion to Quash Subpoena and for Protective Order—Jul. 11, 2014.
*Philippi-Hagenbuch v. Western*—DI 106—Motion for Leave to File Document Under Seal—Jul. 18, 2014.
*Philippi-Hagenbuch v. Western*—DI 108—Notice of Third Party Trinity's Motion to Quash Subpoena Seeking Deposition—Jul. 21, 2014.
*Philippi-Hagenbuch v. Western*—DI 109—Response to Motion to Compel Pursuant to FRCP 37 and 45 (filed by Miscellaneous Party Trinity Mining & Construction Equipment, Inc.)—Jul. 23, 2014.
*Philippi-Hagenbuch v. Western*—DI 110—Motion for Leave to File a Reply to Trinity's Response to Defendants' Motion to Compel—Jul. 23, 2014.
*Philippi-Hagenbuch v. Western*—DI 114—Exhibits E-F to Sealed Defendants' Opposition to Plaintiffs' Motion for Leave to File a Second Amended Complaint—Aug. 8, 2014.

(56) References Cited

OTHER PUBLICATIONS

*Philippi-Hagenbuch* v. *Western*—DI 115—Consent Motion to Seal—Aug. 8, 2014.
*Philippi-Hagenbuch* v. *Western*—DI 116—Response to Motion to Quash Subpoena and for Protective Order filed by Defendants and Movant Mega Corp.—Aug. 11, 2014.
*Philippi-Hagenbuch* v. *Western*—DI 117—Order entered by Chief Judge James E. Shadid (ruling on pending discovery)—Aug. 13, 2014.
*Philippi-Hagenbuch* v. *Western*—DI 118—Notice of Service of Discovery Documents—Aug. 15, 2014.
*Philippi-Hagenbuch* v. *Western*—DI 119—Motion for Leave to File Reply to Defendants' Opposition to Plaintiffs' Motion for Leave to File a Second Amended Complaint—Aug. 19, 2014.
*Philippi-Hagenbuch* v. *Western*—DI 121—Exhibits D, G, L to Plaintiff's Sealed Proposed Reply —Aug. 19, 2014.
*Philippi-Hagenbuch* v. *Western*—DI 122—Motion for Leave to File Document Under Seal (Proposed Reply in Support of Plaintiffs' Motion for Leave to File a Second Amended Complaint)—Aug. 19, 2014.
*Philippi-Hagenbuch* v. *Western*—DI 123—Notice of Defendants' Request for Oral Argument on Plaintiffs' Motion for Leave to File a Second Amended Complaint—Aug. 22, 2014.
*Philippi-Hagenbuch* v. *Western*—DI 124—Motion for Leave to File Document Under Seal—Aug. 22, 2014.
*Philippi-Hagenbuch* v. *Western*—DI 126—Redaction to Sealed Motion for Leave to File a Second Amended Complaint—Sep. 4, 2014.
*Philippi-Hagenbuch* v. *Western*—DI 127—Redaction to Sealed Document Proposed Reply in Support of Plaintiffs' Motion for Leave to File a Second Amended Complaint—Sep. 4, 2014.
*Philippi-Hagenbuch* v. *Western*—DI 128—Redaction to Sealed Document Defendants' Opposition to Plaintiffs' Motion for Leave to File a Second Amended Complaint—Sep. 4, 2014.
*Philippi-Hagenbuch* v. *Western*—DI 129—Redaction to Sealed Document Defendants' Motion for Partial Summary Judgment to Limit Recovery of Damages for Alleged Infringement of the Water Tank Patents —Sep. 4, 2014.
*Philippi-Hagenbuch* v. *Western*—DI 130—Notice of Defendants' Expert Designation—Sep. 5, 2014.
*Philippi-Hagenbuch* v. *Western*—DI 132—Plaintiffs' Combined Opposition to Defendants' Motion for Partial Summary Judgment to Limit Recovery of Damages for Alleged Infringement of the Water Tank Patents—Sep. 19, 2014.
*Philippi-Hagenbuch* v. *Western*—DI 134—Joint Motion for Extension of Time to File Parties' Joint Motion to Extend the Deadline to Filing Responsive Expert Briefs—Sep. 24, 2014.
*Philippi-Hagenbuch* v. *Western*—DI 135—Defendants' Reply in Support of Their Motion for Partial Summary Judgment to Limit Recovery of Damages for Alleged Infringement of the Water Tank Patents—Oct. 3, 2014.
*Philippi-Hagenbuch* v. *Western*—DI 136—Status Report—Oct. 8, 2014.
*Philippi-Hagenbuch* v. *Western*—DI 137—Motion for Leave to File Defendants' Response in Opposition to Plaintiffs' Affirmative Motion for Partial Summary Judgment as to the Proper Damages Period for Alleged Infringement of the Water Tank Patents Under Seal—Oct. 10, 2014.
*Philippi-Hagenbuch* v. *Western*—DI 140—Joint Motion for Extension of Time to Complete Discovery —Oct. 24, 2014.
*Philippi-Hagenbuch* v. *Western*—DI 141—Plaintiffs' Reply in Support of Its Affirmative Motion for Partial Summary Judgment As to the Proper Damages Period for the Alleged Infringement of the Water Tank Patents—Oct. 24, 2014.
*Philippi-Hagenbuch* v. *Western*—DI 142—Order entered by Chief Judge James E. Shadid: Plaintiffs' Motion for Leave to File Second Amended Complaint is Granted—Oct. 24, 2014.
*Philippi-Hagenbuch* v. *Western*—DI 143—Plaintiff's Second Amended Complaint—Oct. 28, 2014.
*Philippi-Hagenbuch* v. *Western*—DI 144—Redaction to Sealed Defendants' Response in Opposition to Plaintiffs' Affirmative Motion for Partial Summary Judgment As to the Proper Damages Period for the Alleged Infringement of the Water Tank Patents—Oct. 28, 2014.
*Philippi-Hagenbuch* v. *Western*—DI 145—Motion for Leave to File Defendants' Motion to Strike and Bar Plaintiffs' New Infringement Theories Under Seal—Nov. 3, 2014.
*Philippi-Hagenbuch* v. *Western*—DI 147— Redaction to Sealed Defendants' Motion to Strike and Bar Plaintiffs' New Infringement Theories—Nov. 4, 2014.
*Philippi-Hagenbuch* v. *Western*—DI 148—Defendants' Motion to Dismiss Plaintiffs' False Advertising Claims—Nov. 7, 2014.
*Philippi-Hagenbuch* v. *Western*—DI 151— Exhibit 1 to Sealed Plaintiffs' Opposition to Defendants' Motion to Strike and Bar Plaintiffs' New Infringement Theories—Nov. 20, 2014.
*Philippi-Hagenbuch* v. *Western*—DI 152— Motion for Leave to File Opposition to Defendants' Motion to Strike and Bar Plaintiffs' New Infringement Theories and Accompanying Exhibits Under Seal—Nov. 20, 2014.
*Philippi-Hagenbuch* v. *Western*—DI 153—Joint Request for Telephonic Status Conference—Nov. 21, 2014.
*Philippi-Hagenbuch* v. *Western*—DI 154—Joint Motion for Extension of Time to File Motion to Compel Regarding Unresolved Discovery Issues—Nov. 21, 2014.
*Philippi-Hagenbuch* v. *Western*—DI 155—Plaintiffs' Response to Motion to Dismiss Plaintiffs' False Advertising Claims—Nov. 24, 2014.
*Philippi-Hagenbuch* v. *Western*—DI 157—Motion for Leave to File Exhibits to Plaintiffs' Opposition to Defendants' Motion to Dismiss Plaintiffs' False Advertising Claims Under Seal—Nov. 24, 2014.
*Philippi-Hagenbuch* v. *Western*—DI 158—Redaction to Sealed Plaintiffs' Opposition to Defendants' Motion to Strike and Bar Plaintiffs' New Infringement Theories—Nov. 25, 2014.
*Philippi-Hagenbuch* v. *Western*—DI 159—Motion for Leave to File a Reply in Support of Defendants' Motion to Strike and Bar Plaintiffs' New Infringement Theories—Nov. 26, 2014.
*Philippi-Hagenbuch* v. *Western*—DI 160—Defendants' Motion for Leave to File a Reply Brief in Support of Motion to Dismiss Plaintiffs' False Advertising Claims—Dec. 2, 2014.
*Philippi-Hagenbuch* v. *Western*—DI 161—Motion for Leave to File Unopposed Motion for Leave to Serve a Supplemental Expert Report—Dec. 3, 2014.
*Philippi-Hagenbuch* v. *Western*—DI 162—Defendants' Reply Brief in Support of Their Motion to Dismiss Plaintiffs' False-Advertising Claims—Dec. 3, 2014.
*Philippi-Hagenbuch* v. *Western*—DI 163—Joint Motion to Amend/Correct Scheduling Order—Dec. 5, 2014.
*Philippi-Hagenbuch, Inc. and LeRoy G. Hagenbuch* v. *Western Technology Services International, Inc.*("*Philippi-Hagenbuch* v. *Western*")—Case #: 1:12:cv:01099-JES-BGC—Central District of Illinois—Court Docket—Apr. 16, 2014.
*Philippi-Hagenbuch* v. *Western*—Complaint—Mar. 30, 2012.
*Philippi-Hagenbuch* v. *Western*—Certificate of Interest—Mar. 30, 2012.
*Philippi-Hagenbuch* v. *Western*—Report on the Filing or Determination of an Action Regarding a Patent or Trademark—Mar. 30, 2012.
*Philippi-Hagenbuch* v. *Western*—Answer to Plaintiff's Complaint—May 18, 2012.
*Philippi-Hagenbuch* v. *Western*—Certificate of Interest—May 18, 2012.
*Philippi-Hagenbuch* v. *Western*—Answer to Defendant's Counterclaim—Jun. 6, 2012.
*Philippi-Hagenbuch* v. *Western*—Joint Proposed Discovery Plan—Jul. 6, 2012.
*Philippi-Hagenbuch* v. *Western*—Exhibit A of Joint Proposed Discovery Plan—Local Patent Rules of Northern District of Illinois—Available at least as early as Jul. 6, 2012.
*Philippi-Hagenbuch* v. *Western*—Exhibit B of Joint Proposed Discovery Plan—Proposed Dates—Jul. 6, 2012.

(56) References Cited

OTHER PUBLICATIONS

*Philippi-Hagenbuch* v. *Western*—Exhibit C of Joint Proposed Discovery Plan—Federal Circuit's E-Discovery Model Order—Available at least as early as Jul. 6, 2012.
*Philippi-Hagenbuch* v. *Western*—Scheduling Order—Jul. 10, 2012.
*Philippi-Hagenbuch* v. *Western*—Joint Motion for Entry of a Protective Order—Sep. 5, 2012.
*Philippi-Hagenbuch* v. *Western*—Protective Order—Sep. 6, 2012.
*Philippi-Hagenbuch* v. *Western*—Motion for Temporary Restraining Order and Preliminary Injunction—Sep. 25, 2012.
*Philippi-Hagenbuch* v. *Western*—Exhibit a of Motion for Temporary Restraining Order and Preliminary Injunction—Proposed Temporary Restraining Order and Preliminary Injunction—Sep. 25, 2012.
*Philippi-Hagenbuch* v. *Western*—Opposition to Motion for Temporary Restraining Order and Preliminary Injunction—Sep. 26, 2012.
*Philippi-Hagenbuch* v. *Western*—Exhibit a of Opposition to Motion for Temporary Restraining Order and Preliminary Injunction—U.S. Pat. No. 7,735,507.
*Philippi-Hagenbuch* v. *Western*—Exhibit B of Opposition to Motion for Temporary Restraining Order and Preliminary Injunction—Declaration of Frederick Reynolds—Sep. 25, 2012.
*Philippi-Hagenbuch* v. *Western*—Exhibit C of Opposition to Motion for Temporary Restraining Order and Preliminary Injunction—U.S. Pat. No. 5,779,092.
*Philippi-Hagenbuch* v. *Western*—Exhibit D of Opposition to Motion for Temporary Restraining Order and Preliminary Injunction—Westech Water Tank Presentation cited in U.S. Pat. No. 7,735,507—Available at least as early as Jun. 15, 2010.
*Philippi-Hagenbuch* v. *Western*—Exhibit E of Opposition to Motion for Temporary Restraining Order and Preliminary Injunction—Letter from Plaintiff—Dec. 1, 2010.
*Philippi-Hagenbuch* v. *Western*—Westech Motion for Leave to File Amended Answer and Counterclaim—Nov. 5, 2012.
*Philippi-Hagenbuch* v. *Western*—Exhibit of Motion for Leave to File Amended Answer and Counterclaim—Proposed Amended Answer to Complaint and Amended Counterclaims—Nov. 5, 2012.
*Philippi-Hagenbuch* v. *Western*—Response to Motion for Leave to File an Amended Answer and Counterclaims—Nov. 6, 2012.
*Philippi-Hagenbuch* v. *Western*—Amended Answer to Plaintiff's Original Complaint and Amended Counterclaims—Nov. 19, 2012.
*Philippi-Hagenbuch* v. *Western*—Amended Answer to Defendant's Amended Counterclaim—Dec. 10, 2012.
*Philippi-Hagenbuch* v. *Western*—Defendants Opening Claim Construction Brief—Apr. 11, 2013.
*Philippi-Hagenbuch* v. *Western*—Exhibit 1 of Defendants Opening Claim Construction Brief—U.S. Pat. No. 7,412,357—Appendix part 1, pp. 1-37.
*Philippi-Hagenbuch* v. *Western*—Exhibit 2 of Defendants Opening Claim Construction Brief—File History of U.S. Pat. No. 7,412,357—Appendix part 1, p. 38 to Appendix part 7, p. 200.
*Philippi-Hagenbuch* v. *Western*—Exhibit 3 of Defendants Opening Claim Construction Brief—U.S. Pat. No. 7,369,978—Appendix part 7, pp. 201-243.
*Philippi-Hagenbuch* v. *Western*—Exhibit 4 of Defendants Opening Claim Construction Brief—File History of U.S. Pat. No. 7,369,978—Appendix part 7, p. 244 to Appendix part 16, p. 70.
*Philippi-Hagenbuch* v. *Western*—Exhibit 5 of Defendants Opening Claim Construction Brief—U.S. Pat. No. 7,735,507—Appendix part 16, pp. 71-132.
*Philippi-Hagenbuch* v. *Western*—Exhibit 6 of Defendants Opening Claim Construction Brief—File History of U.S. Pat. No. 7,735,507—Appendix part 16, p. 133 to Appendix part 21, p. 113.
*Philippi-Hagenbuch* v. *Western*—Exhibit 7 of Defendants Opening Claim Construction Brief—U.S. Pat. No. 6,547,091—Appendix part 21, pp. 114-144.
*Philippi-Hagenbuch* v. *Western*—Exhibit 8 of Defendants Opening Claim Construction Brief—File History of U.S. Pat. No. 6,547,091—Appendix part 21, p. 145 to Appendix part 24, p. 69.
*Philippi-Hagenbuch* v. *Western*—Plaintiff's Motion to Compel Discovery—Apr. 15, 2013.
*Philippi-Hagenbuch* v. *Western*—Plaintiff's Memorandum in Support of Motion to Compel Discovery—Apr. 15, 2013.
*Philippi-Hagenbuch* v. *Western*—Text of Proposed Order Granting Plaintiff's Motion to Compel—Apr. 15, 2013.
*Philippi-Hagenbuch* v. *Western*—Exhibit A of Plaintiff's Memorandum in Support of Motion to Compel Discovery—Letter from Plaintiff Attorney Addressing Inadequacies in Response to Interrogatories, Request for Production and Request for Admission—Mar. 11, 2013.
*Philippi-Hagenbuch* v. *Western*—Exhibit B of Plaintiff's Memorandum in Support of Motion to Compel Discovery—Defendant Response to Plaintiff Letter—Mar. 25, 2013.
*Philippi-Hagenbuch* v. *Western*—Exhibit C of Plaintiff's Memorandum in Support of Motion to Compel Discovery—Plaintiff's Request for Production Documents—Nov. 21, 2012.
*Philippi-Hagenbuch* v. *Western*—Exhibit D of Plaintiff's Memorandum in Support of Motion to Compel Discovery—Plaintiff's Interrogatories—Nov. 21, 2012.
*Philippi-Hagenbuch* v. *Western*—Exhibit E of Plaintiff's Memorandum in Support of Motion to Compel Discovery—Westech Response to Plaintiff's Requests for Production of Documents—Jan. 14, 2013.
*Philippi-Hagenbuch* v. *Western*—Request to File Exhibit F of Plaintiff's Memorandum in Support of Motion to Compel Discovery Under Seal—Apr. 15, 2013.
*Philippi-Hagenbuch* v. *Western*—Exhibit G of Plaintiff's Memorandum in Support of Motion to Compel Discovery—Womp-int web page re Westech Tailors its Truck Bodies to Meet the Fleet—Available at least as early as Apr. 15, 2013.
*Philippi-Hagenbuch* v. *Western*—Exhibit H, Part 1 of Plaintiff's Memorandum in Support of Motion to Compel Discovery—Mining Media web page re Westech Sets New World Record for Truck Bodies—Available at least as early as Apr. 15, 2013.
*Philippi-Hagenbuch* v. *Western*—Exhibit H, Part 2 of Plaintiff's Memorandum in Support of Motion to Compel Discovery—Mining Media web page re Westech Sets New World Record for Truck Bodies—Available at least as early as Apr. 15, 2013.
*Philippi-Hagenbuch* v. *Western*—Exhibit of Sealed Document dated Apr. 17, 2013—Amended Complaint—Apr. 17, 2013.
*Philippi-Hagenbuch* v. *Western*—Amended Complaint—Apr. 22, 2013.
*Philippi-Hagenbuch* v. *Western*—Defendant's Opposition to Plaintiff's Motion to Compel—May 2, 2013.
*Philippi-Hagenbuch* v. *Western*—Exhibit A—Declaration of Frederick Reynolds—May 2, 2013.
*Philippi-Hagenbuch* v. *Western*—Plaintiff's Responsive Claim Construction Brief—May 9, 2013.
*Philippi-Hagenbuch* v. *Western*—Exhibit A of Plaintiff's Responsive Claim Construction Brief—U.S. Pat. No. 7,369,978.
*Philippi-Hagenbuch* v. *Western*—Exhibit B of Plaintiff's Responsive Claim Construction Brief—U.S. Pat. No. 7,412,357.
*Philippi-Hagenbuch* v. *Western*—Exhibit C of Plaintiff's Responsive Claim Construction Brief—U.S. Pat. No. 6,547,091.
*Philippi-Hagenbuch* v. *Western*—Exhibit D of Plaintiff's Responsive Claim Construction Brief—U.S. Pat. No. 7,735,507.
*Philippi-Hagenbuch* v. *Western*—Exhibit E of Plaintiff's Responsive Claim Construction Brief—Patent Family Diagram—May 9, 2013.
*Philippi-Hagenbuch* v. *Western*—Exhibit F of Plaintiff's Responsive Claim Construction Brief—Highlighted Copy of U.S. Pat. No. 7,412,357—May 9, 2013.
*Philippi-Hagenbuch* v. *Western*—Exhibit G of Plaintiff's Responsive Claim Construction Brief—Summary of Examination of '357 Patent—May 9, 2013.
*Philippi-Hagenbuch* v. *Western*—Exhibit H of Plaintiff's Responsive Claim Construction Brief—Prosecution History of U.S. Pat. No. 7,412,357.
*Philippi-Hagenbuch* v. *Western*—Exhibit I of Plaintiff's Responsive Claim Construction Brief—New Collegiate Dictionary definitions of "hatch" and "door"—1979.

(56) References Cited

OTHER PUBLICATIONS

*Philippi-Hagenbuch* v. *Western*—Defendant's Motion for Partial Summary Judgment of Invalidity—May 9, 2013.
*Philippi-Hagenbuch* v. *Western*—Exhibit A of Defendant's Motion for Partial Summary Judgment of Invalidity—U.S. Pat. No. 7,412,357.
*Philippi-Hagenbuch* v. *Western*—Exhibit B of Defendant's Motion for Partial Summary Judgment of Invalidity—U.S. Pat. No. 7,369,978.
*Philippi-Hagenbuch* v. *Western*—Exhibit C of Defendant's Motion for Partial Summary Judgment of Invalidity—Plaintiff's Letter regarding Construction of Preamble—Mar. 7, 2013.
*Philippi-Hagenbuch* v. *Western*—Exhibit D of Defendant's Motion for Partial Summary Judgment of Invalidity—Plaintiff-s Final Infringement Contentions—Jan. 29, 2013.
*Philippi-Hagenbuch* v. *Western*—Exhibit E of Defendant's Motion for Partial Summary Judgment of Invalidity—Plaintiff's Response to Invalidity Contentions—Nov. 1, 2012.
*Philippi-Hagenbuch* v. *Western*—Proposed Order—May 9, 2013.
*Philippi-Hagenbuch* v. *Western*—Plaintiff's Reply to Opposition to Motion to Compel—May 15, 2013.
*Philippi-Hagenbuch* v. *Western*—Exhibit I of Plaintiff's Reply to Opposition to Motion to Compel—Westech Blackout Period—Available at least as early as May 15, 2013.
*Philippi-Hagenbuch* v. *Western*—Exhibit J of Plaintiff's Reply to Opposition to Motion to Compel—Defendant's Final Invalidity Contentions—Jan. 29, 2013.
*Philippi-Hagenbuch* v. *Western*—Exhibit K of Plaintiff's Reply to Opposition to Motion to Compel—Plaintiff's Final Infringement Contentions with Exhibits A and B thereof—Jan. 29, 2013.
*Philippi-Hagenbuch* v. *Western*—Defendant's Motion for Leave to File Sur-Reply—May 20, 2013.
*Philippi-Hagenbuch* v. *Western*—Proposed Sur-Reply—May 20, 2013.
*Philippi-Hagenbuch* v. *Western*—Sur-Reply—May 21, 2013.
*Philippi-Hagenbuch* v. *Western*—Plaintiff-s Answer to Defendant's Counterclaims—May 23, 2013.
*Philippi-Hagenbuch* v. *Western*—Defendant's Reply Claim Construction Brief—May 23, 2013.
*Philippi-Hagenbuch* v. *Western*—Exhibit A of Defendant's Reply Claim Construction Brief—Claim Chart—May 23, 2013.
*Philippi-Hagenbuch* v. *Western*—Exhibit B of Defendant's Reply Claim Construction Brief—Plaintiff's Letter Regarding Preamble Construction—Mar. 7, 2013.
*Philippi-Hagenbuch* v. *Western*—Motion for Extension of Time to File Reply to Motion for Summary Judgment—May 29, 2013.
*Philippi-Hagenbuch* v. *Western*—Joint Claim Construction Chart—May 30, 2013.
*Philippi-Hagenbuch* v. *Western*—Judge's Opinion re Motion to Compel Discovery Allowed in Part—Jun. 3, 2013.
*Philippi-Hagenbuch* v. *Western*—Plaintiff's Opposition to Defendant's Motion for Partial Summary Judgment with Exhibit—Jun. 10, 2013.
*Philippi-Hagenbuch* v. *Western*—Notice of Supplemental Authority with Exhibit—Jul. 11, 2013.
*Philippi-Hagenbuch* v. *Western*—Order denying Motion for Partial Summary Judgment—Jul. 30, 2013.
*Philippi-Hagenbuch* v. *Western*—Order on Markman Hearing—Aug. 26, 2013.
*Philippi-Hagenbuch* v. *Western*—Defendant's Motion to Amend Non-Infringement Contentions—Dec. 17, 2013.
*Philippi-Hagenbuch* v. *Western*—Exhibit A of Defendant's Motion to Amend Non-Infringement Contentions—Claim Chart—Dec. 17, 2013.
*Philippi-Hagenbuch* v. *Western*—Exhibit B Defendant's Motion to Amend Non-Infringement Contentions—Excerpt of Deposition of Phillip Brinkman—Oct. 18, 2013.
*Philippi-Hagenbuch* v. *Western*—Exhibit C of Defendant's Motion to Amend Non-Infringement Contentions—Excerpt of Deposition of LeRoy Hagenbuch—Oct. 28, 2013.
*Philippi-Hagenbuch* v. *Western*—Exhibit D of Defendant's Motion to Amend Non-Infringement Contentions—Proposed Motion Granting Motion to Amend Non-Infringement Contentions—Dec. 17, 2013.
*Philippi-Hagenbuch* v. *Western*—Motion for Extension of Time to File Reply to Amended Non-Infringement Contentions—Dec. 30, 2013.
*Philippi-Hagenbuch* v. *Western*—Plaintiff's Opposition to Motion to Amend Non-Infringement Contentions—Jan. 10, 2014.
*Philippi-Hagenbuch* v. *Western*—Defendant's Unopposed Motion to File Reply—Jan. 15, 2014.
*Philippi-Hagenbuch* v. *Western*—Exhibit A of Defendant's Unopposed Motion to File Reply—Defendant's Reply to Plaintiff's Opposition—Jan. 15, 2014.
*Philippi-Hagenbuch* v. *Western*—Defendant's Motion to Compel Answers to Interrogatories—Mar. 5, 2014.
*Philippi-Hagenbuch* v. *Western*—Plaintiff's Opposition to Motion to Compel—Mar. 24, 2014.
*Philippi-Hagenbuch* v. *Western*—Motion for Leave to File Reply to Opposition to Motion to Compel with Exhibit—Mar. 31, 2014.
*Philippi-Hagenbuch* v. *Western*—Order on Motion to Compel and Motion to Amend Non-Infringement Contentions—Apr. 2, 2014.
*Philippi-Hagenbuch* v. *Western*—DI 188—Motion for Leave to File Under Seal Plaintiffs' Motion for Summary Judgment that the Water Tank Maintenance Claims are Not Invalid.Based on Hoss' Alleged Activities—Jan. 22, 2015.
*Philippi-Hagenbuch* v. *Western*—DI 190—Exhibits re DI 189 [Sealed Document] Plaintiffs' Motion for Summary Judgment that the Water Tank Maintenance Claims are Not Invalid.Based on Hoss' Alleged Activities—Jan. 22, 2015.
*Philippi-Hagenbuch* v. *Western*—DI 195—Motion for Leave to File Under Seal Plaintiffs' Motion for Summary Judgment on Defendants' False Advertising Claim—Jan. 22, 2015.
*Philippi-Hagenbuch* v. *Western*—DI 198—Exhibits re DI 189 [Sealed Document] Plaintiffs' Motion for Summary Judgment on Defendants' False Advertising Claim—Jan. 22, 2015.
*Philippi-Hagenbuch* v. *Western*—DI 203—Motion for Leave to File Under Seal Plaintiffs' Motion for Summary Judgment That Claims 1, 2, 8, 14, 15, 19, 20, 37, 39, 46, 55, 57, 60, 61, of U.S. Pat. No. 7,412,357 Are Not Invalid and That Certain of Westech's Truck Bodies Infringe Claim 46 of U.S. Pat. No. 7,412,357—Jan. 22, 2015.
*Philippi-Hagenbuch* v. *Western*—Order [granting DI 215 Motion for Extension of Time]—Feb. 9, 2015.
*Philippi-Hagenbuch* v. *Western*—DI 238—Corrected Exhibit No. 3 to Plaintiffs' Response To Motion to Expedite Resolution of the Parties' Disputes Regarding the Scope of Certain Claim Terms—Mar. 2, 2015.
*Philippi-Hagenbuch* v. *Western*—DI 280—Exhibits to DI 279 (Sealed Document) Plaintiffs' Reply in Support of Their Motion for Summary Judgment That the Asserted Truck Body Patent Claims Are Not Invalid Based on the "Westech Design Process"—Mar. 20, 2015.
*Philippi-Hagenbuch* v. *Western*—DI 286—Motion for Leave to File Under Seal Plaintiffs' Reply in Support of Their Motion for Summary Judgment That Claims 1, 2, 8, 14, 15, 19, 20, 37, 39, 46, 55, 57, 60, 61, of U.S. Pat. No. 7,412,357 Are Not Invalid and That Certain of Westech's Truck Bodies Infringe Claim 46 of U.S. Pat. No. 7,412,357—Mar. 20, 2015.
*Philippi-Hagenbuch* v. *Western*—DI 288—Exhibits to DI 287 (Sealed Document) Plaintiffs' Reply in Support of Their Motion for Summary Judgment That Claims 1, 2, 8, 14, 15, 19, 20, 37, 39, 46, 55, 57, 60, 61, of U.S. Pat. No. 7,412,357 Are Not Invalid And That Certain of Westech's Truck Bodies Infringe Claim 46 of U.S. Pat. No. 7,412,357—Mar. 20, 2015.
*Philippi-Hagenbuch* v. *Western*—DI 293—Surreply re DI 220 (Sealed Document) Plaintiffs' Surreply to Defendants' Reply in Support of Their Motion for Summary Judgment on Philippi's False Advertising Claims—Mar. 31, 2015.
*Philippi-Hagenbuch* v. *Western*—DI 294—Motion for Leave to File Under Seal Plaintiffs'Surreply to Defendants' Reply in Support of Their Motion for Summary Judgment on Philippi's False Advertising Claims—Mar. 31, 2015.

(56) References Cited

OTHER PUBLICATIONS

*Philippi-Hagenbuch, Inc. and LeRoy G. Hagenbuch v. Western Technology Services International, Inc.*("*Philippi-Hagenbuch v. Western*")—Case #: 1:12:cv:01099-JES-BGC—Central District of Illinois—Court Docket—Dec. 18, 2015.
*Philippi-Hagenbuch v. Western*—DI 333—Order re Defendants' Motion to Strike and Bar Plaintiffs' New Infringement Theories (DI-146) is Granted in Part and Denied in Part—Sep. 9, 2015.
*Philippi-Hagenbuch v. Western*—DI 334—Order re Plaintiffs' Motion for Summary Judgment (DI-192) is Granted in Part and Denied in Part—Sep. 9, 2015.
*Philippi-Hagenbuch v. Western*—DI 335—Order re Defendants' Motion for Summary Judgment (DI-175) is Denied—Sep. 11, 2015.
*Philippi-Hagenbuch v. Western*—DI 336—Order re Motion for Summary Judgment of Invalidity of Water Tank Maintenance Claims (DI-167) is Denied—Sep. 30, 2015.
*Philippi-Hagenbuch v. Western*—DI 337—Order re Defendants Motion for Partial Summary Judgment to Limit Recovery of Damages for Alleged Infringement of Water Tank Patents (DI-125) is Granted in Part and Denied in Part—Sep. 30, 2015.
*Philippi-Hagenbuch v. Western*—DI 338—Plaintiffs' Motion for Certification of the Court's Claim Construction Orders and Memorandum of Law in Support Thereof—Sep. 30, 2015.
*Philippi-Hagenbuch v. Western*—DI 339—Order re Defendants' Motion for Summary Judgment of Non-Infringement of Water Tank Maintenance Claims (DI-166) is Granted—Oct. 2, 2015.
*Philippi-Hagenbuch v. Western*—DI 340—Joint Motion for Entry of New Pretrial Schedule—Oct. 2, 2015.
*Philippi-Hagenbuch v. Western*—DI 341—Motion to Withdraw as Attorney (Ida Gladys Wahlquist-Ortiz)—Oct. 9, 3015.
*Philippi-Hagenbuch v. Western*—DI 342—Order re Motion for Summary Judgment that Asserted Truck Body Patent Claims are Not Invalid Based on the "Westech Design Process" (DI-186) is Denied—Oct. 13, 2015.
*Philippi-Hagenbuch v. Western*—DI 343—Order re Defendants' Motion for Summary Judgment on Plaintiff Philippi-Hagenbuch's Lost Profits Claim (DI-202) is Denied—Oct. 13, 2015.
*Philippi-Hagenbuch v. Western*—DI 344—Order granting (DI-340) Joint Motion for Entry of New Pretrial Schedule—Oct. 13, 2015.
*Philippi-Hagenbuch v. Western*—DI 346—Notice of Defendants' Supplemental Rule 26(a)(3) Pretrial Disclosures—Oct. 13, 2015.
*Philippi-Hagenbuch v. Western*—DI 347—Notice of Plaintiffs' Supplemental Rule 26(a)(3) Pretrial Disclosures—Oct. 13, 2015.
*Philippi-Hagenbuch v. Western*—DI 348—Defendants' Response to Plaintiffs' Motion for Certification of the Court's Claim Construction Orders and Memorandum of Law in Support Thereof—Oct. 16, 2015.
*Philippi-Hagenbuch v. Western*—DI 349—Defendants' Motion for Leave to File Exhibit A to Response in Opposition to Plaintiffs' Motion for Certification of the Court's Claim Construction Orders Under Seal—Oct. 16, 2015.
*Philippi-Hagenbuch v. Western*—DI 351—Defendants' Second Motion to Strike DI 347 and Bar Plaintiffs' Late-Disclosed Witnesses—Oct. 20, 2015.
*Philippi-Hagenbuch v. Western*—DI 352—Request for Oral Argument on Motion for Certification of the Court's Claim Construction Orders—Oct. 23, 2015.
*Philippi-Hagenbuch v. Western*—DI 353—Order: Defendants' Motion to Strike and Bar Plaintiffs' Late-Disclosed Witnesses is Denied—Oct. 26, 2015.
*Philippi-Hagenbuch v. Western*—DI 354—Order denying Plaintiffs' Motion for Certification of the Court's Claim Construction Orders [DI 338], and the Motion for Oral Argument [DI 352]—Nov. 3, 2015.
*Philippi-Hagenbuch v. Western*—DI 355—Plaintiffs' Motion for Leave to Supplement Mr. Fred P. Smith's Expert Reports—Nov. 4, 2015.
*Philippi-Hagenbuch v. Western*—DI 356—Plaintiffs' Opposition to Defendants' Second Motion to Strike and Bar Plaintiffs' Late-Disclosed Witnesses—Nov. 6, 2015.
*Philippi-Hagenbuch v. Western*—DI 359—Defendants' Motion for Leave to File Under Seal Exhibit A to Defendants' Motion for Leave to Supplement Dr. Frey's Expert Reports & Defendants' Response to Plaintiffs' Motion for Leave to Supplement Mr. Smith's Expert Reports [DI 355]—Nov. 12, 2015.
*Philippi-Hagenbuch v. Western*—DI 360—Defendants' Motion for Leave to Supplement Dr. Frey's Expert Reports & Defendants' Response to Plaintiffs' Motion for Leave to Supplement Mr. Smith's Expert Reports [DI 355].
*Philippi-Hagenbuch v. Western*—DI 362—Joint Proposed Pretrial Conference Agenda—Nov. 12, 2015.
*Philippi-Hagenbuch v. Western*—DI 363—Order Denying Defendants' Second Motion to Strike and Bar Plaintiffs' Late Disclosed Witnesses [DI 351]—Nov. 12, 2015.
*Philippi-Hagenbuch v. Western*—DI 364—Plaintiffs' Unopposed Motion for Leave to File Under Seal Pre-Trial Order and Exhibits Thereto—Nov. 12, 2015.
*Philippi-Hagenbuch v. Western*—DI 366—Plaintiffs' Unopposed Motion to Maintain Under Seal Pre-Trial Order and Exhibits Thereto [DI 357 and DI 358].
*Philippi-Hagenbuch v. Western*—DI 367—Plaintiffs' Motion to Bar Proposed Testimony of Certain Caterpillar Inc. Witnesses or, Alternatively, Permit Depositions—Nov. 12, 2015.
*Philippi-Hagenbuch v. Western*—DI 370—Defendants' Motion to Strike Philippi's Reliance on the "Continuing Wrong Doctrine"—Nov. 20, 2015.
*Philippi-Hagenbuch v. Western*—DI 371—Defendants' Motion to Strike and Bar Plaintiffs' New Theory of Infringement Under 35 U.S.C. § 271(G)—Nov. 20, 2015.
*Philippi-Hagenbuch v. Western*—DI 372—Plaintiffs' Motion to Strike and Preclude Defendants' Defense Under 35 U.S.C. § 273—Nov. 20, 2015.
*Philippi-Hagenbuch v. Western*—DI 373—Plaintiffs' Opposition to Defendants' Motion to Strike Reliance on the Continuing Wrong Doctrine—Nov. 30, 2015.
*Philippi-Hagenbuch v. Western*—DI 374—Plaintiffs' Response to Defendants' Motion for Leave to Supplement Dr. Frey's Expert Reports & Defendants' Response to Plaintiffs' Motion for Leave to Supplement Mr. Smith's Expert Reports—Nov. 30, 2015.
*Philippi-Hagenbuch v. Western*—DI 375—Plaintiffs' Unopposed Motion for Leave to File Under Seal Plaintiffs' Opposition to Defendants' Motion to Strike and Bar Plaintiffs' New Theory of Infringement Under 35 U.S.C. § 271(g)—Nov. 30, 2015.
*Philippi-Hagenbuch v. Western*—DI 377—Defendants' Response to Plaintiffs' Motion to Strike Their Section 273 Prior Commercial Use Defense [DI 372]—Nov. 30, 2015.
*Philippi-Hagenbuch v. Western*—DI 378—Plaintiffs' Unopposed Motion for Leave to File Under Seal Plaintiffs' Motions in Limine and Exhibits 1, 2, 3, 8, 9, 10, 11, 12, 18, and 19—Dec. 3, 2015.
*Philippi-Hagenbuch v. Western*—DI 380—Exhibits to Sealed Document (DI 379)—Dec. 3, 2015.
*Philippi-Hagenbuch v. Western*—DI 381—Defendants' Motion in Limine—Dec. 3, 2015.
*Philippi-Hagenbuch v. Western*—DI 382—Defendants' Unopposed Motion for Leave to File Under Seal Certain Exhibits to Defendants' Motion in Limine—Dec. 3, 2015.
*Philippi-Hagenbuch, Inc. and LeRoy G. Hagenbuch v. Western Technology Services International, Inc.*("*Philippi-Hagenbuch v. Western*")—Case #: 1:12:cv:01099-JES-BGC—Central District of Illinois—Court Docket—Jul. 7, 2015.
*Philippi-Hagenbuch v. Western*—DI 164—Plaintiffs' Unopposed Motion for Leave to Serve Supplemental Expert Report—Dec. 11, 2014.
*Philippi-Hagenbuch v. Western*—DI 165—Defendants' Motion for Leave to File Under Seal Defendants' Motion for Summary Judgment of Non-Infringement of the Water Tank Maintenance Claims—Dec. 19, 2014.
*Philippi-Hagenbuch v. Western*—DI 167—Defendants' Motion for Summary Judgment of Invalidity of the Water Tank Maintenance Claims—Dec. 30, 2014.

(56) References Cited

OTHER PUBLICATIONS

*Philippi-Hagenbuch* v. *Western*—DI 168—Defendants' Motion for Leave to File Under Seal Exhibit E re Defendants' Motion for Summary Judgment of Invalidity of the Water Tank Maintenance Claims—Dec. 30, 2014.
*Philippi-Hagenbuch* v. *Western*—DI 170—Plaintiffs' Unopposed Motion for Extension of Certain Briefing Deadlines—Jan. 6, 2015.
*Philippi-Hagenbuch* v. *Western*—DI 171—Plaintiffs' Motion for Leave to Supplement Fred P. Smith's Expert Reports—Jan. 16, 2015.
*Philippi-Hagenbuch* v. *Western*—DI 172—Plaintiffs' Motion for Leave to File Under Seal the Exhibits to Plaintiffs' Motion for Leave to Supplement Mr. Fred P. Smith's Expert Report—Jan. 16, 2015.
*Philippi-Hagenbuch* v. *Western*—DI 174—Defendants' Motion for Leave to File Under Seal Defendants' Motion for Summary Judgment on Plaintiff Philippi-Hagenbuch's False Advertising Claims Along With Accompanying Exhibits A, B, and C—Jan. 16, 2015.
*Philippi-Hagenbuch* v. *Western*—DI 176—Appendix re DI-175 [Sealed Document] Defendants' Motion for Summary Judgment on Plaintiff Philippi-Hagenbuch's False Advertising Claims—Jan. 16, 2015.
*Philippi-Hagenbuch* v. *Western*—DI 177—Redaction to DI-166 [Sealed Document] Defendants' Motion for Summary Judgment of Non-Infringement of the Water Tank Maintenance Claims—Jan. 20, 2015.
*Philippi-Hagenbuch* v. *Western*—DI 178—Redaction to DI-169 [Sealed Document] Exhibit E to Defendants' Motion for Summary Judgment of Invalidity of the Water Tank Maintenance Claims—Jan. 20, 2015.
*Philippi-Hagenbuch* v. *Western*—DI 179—Plaintiffs' Opposition to Defendants' Motion for Summary Judgment of Non-Infringement of the Water Tank Maintenance Claims—Jan. 20, 2015.
*Philippi-Hagenbuch* v. *Western*—DI 180—Plaintiffs' Motion for Leave to File Under Seal Exhibits to Plaintiffs' Opposition to Defendants' Motion for Summary Judgment of Non-Infringement of the Water Tank Maintenance Claims—Jan. 20, 2015.
*Philippi-Hagenbuch* v. *Western*—DI 182—Plaintiffs' Motion for Leave to File Under Seal Plaintiffs' Motion to Strike and Preclude Defendants from Rearguing Claim Construction—Jan. 22, 2015.
*Philippi-Hagenbuch* v. *Western*—DI 184—Exhibits re DI 183 [Sealed Document] Plaintiffs' Motion to Strike and Preclude Defendants from Rearguing Claim Construction—Jan. 22, 2015.
*Philippi-Hagenbuch* v. *Western*—DI 185—Plaintiffs' Motion for Leave to File Under Seal Plaintiffs' Motion for Summary Judgment that the Asserted Truck Body Patent Claims are Not Invalid Based on the Westech Design Process—Jan. 22, 2015.
*Philippi-Hagenbuch* v. *Western*—DI 187—Exhibits re DI 186 [Sealed Document] Plaintiffs' Motion for Summary Judgment that the Asserted Truck Body Patent Claims are Not Invalid Based on the Westech Design Process—Jan. 22, 2015.
*Philippi-Hagenbuch* v. *Western*—DI 188—Motion for Leave to File Under Seal Plaintiffs' Motion for Summary Judgment that the Water Tank Maintenance Claims are Not Invalid Based on Hoss' Alleged Activities—Jan. 22, 2015.
*Philippi-Hagenbuch* v. *Western*—DI 190—Exhibits re DI 189 [Sealed Document] Plaintiffs' Motion for Summary Judgment that the Water Tank Maintenance Claims are Not Invalid Based on Hoss' Alleged Activities—Jan. 22, 2015.
*Philippi-Hagenbuch* v. *Western*—DI 191—Motion for Leave to File Under Seal Plaintiffs' Motion for Summary Judgment that Certain of Westech's Water Tanks Infringe—Jan. 22, 2015.
*Philippi-Hagenbuch* v. *Western*—DI 193—Exhibits re DI 189 [Sealed Document] Plaintiffs' Motion for Summary Judgment that Certain of Westech's Water Tanks Infringe—Jan. 22, 2015.
*Philippi-Hagenbuch* v. *Western*—DI 194—Motion for Leave to File Under Seal Defendants' Motion for Summary Judgment of Invalidity for Indefiniteness—Jan. 22, 2015.
*Philippi-Hagenbuch* v. *Western*—DI 195—Motion for Leave to File Under Seal Plaintiffs' Motion for Summary Judgment on Defendants' False Advertising Claim—Jan. 22, 2015.
*Philippi-Hagenbuch* v. *Western*—DI 198—Exhibits re DI 189 [Sealed Document] Plaintiffs'Motion for Summary Judgment on Defendants' False Advertising Claim—Jan. 22, 2015.
*Philippi-Hagenbuch* v. *Western*—DI 199—Unopposed Motion to Seal Defendants' Motion to Exclude Opinions and Testimony of Plaintiffs' Damages Expert Michael E. Tate—Jan. 22, 2015.
*Philippi-Hagenbuch* v. *Western*—DI 201—Unopposed Motion to Seal Defendants' Motion For Summary Judgment on Philippi's Lost-Profit Claim—Jan. 22, 2015.
*Philippi-Hagenbuch* v. *Western*—DI 203—Motion for Leave to File Under Seal Plaintiffs' Motion for Summary Judgment That Claims 1, 2, 8, 14, 15, 19, 20, 37, 39, 46, 55, 57, 60, 61, of U.S. Pat. No. 7,412,357 Are Not Invalid and That Certain of Westech's Truck. Bodies Infringe Claim 46 of U.S. Pat. No. 7,412,357—Jan. 22, 2015.
*Philippi-Hagenbuch* v. *Western*—DI 205—Exhibits re DI 204 [Sealed Document] Plaintiffs' Motion for Summary Judgment That Claims 1, 2, 8, 14, 15, 19, 20, 37, 39, 46, 55, 57, 60, 61, of U.S. Pat. No. 7,412,357 Are Not Invalid and That Certain of Westech's Truck Bodies Infringe Claim 46 of U.S. Pat. No. 7,412,357—Jan. 22, 2015.
*Philippi-Hagenbuch* v. *Western*—DI 206—Motion for Leave to File Under Seal Defendants' Motion for Summary Judgment of Non-Infringement of the Load Profiling Patents—Jan. 22, 2015.
*Philippi-Hagenbuch* v. *Western*—DI 207—Motion for Leave to File Under Seal Defendants' Daubert Motion to Exclude Certain Opinions of Plaintiffs' Technical Expert Frederick Smith—Jan. 22, 2015.
*Philippi-Hagenbuch* v. *Western*—DI 208—Motion for Leave to File Excess Pages—Jan. 22, 2015.
*Philippi-Hagenbuch* v. *Western*—DI 211—Motion for Leave to File Under Seal Plaintiffs' Opposition to Defendants' Motion for Summary Judgment of Invalidity of the Water Tank Maintenance Claims—Jan. 30, 2015.
*Philippi-Hagenbuch* v. *Western*—DI 213—Exhibits re DI 212 [Sealed Document] Plaintiffs' Opposition to Defendants' Motion for Summary Judgment of Invalidity of the Water Tank Maintenance Claims—Jan. 30, 2015.
*Philippi-Hagenbuch* v. *Western*—DI 214—Order [Defendants' Motion to Dismiss False Advertising Claims (DI 148) is denied]—Feb. 2, 2015.
*Philippi-Hagenbuch* v. *Western*—DI 215—Joint Motion for Extension of Time to File—Feb. 6, 2015.
*Philippi-Hagenbuch* v. *Western*—DI 216—Reply to Response to Motion re DI 165 Motion for Leave to File Under Seal Defendants' Motion for Summary Judgment of Non-Infringement of the Water Tank Maintenance Claims—Feb. 6, 2015.
*Philippi-Hagenbuch* v. *Western*—DI 217—Order [granting DI 215 Motion for Extension of Time]—Feb. 9, 2015.
*Philippi-Hagenbuch* v. *Western*—DI 218—Defendants' Motion to Expedite Resolution of the Parties' Disputes Regarding the Scope of Certain Claim Terms—Feb. 13, 2015.
*Philippi-Hagenbuch* v. *Western*—DI 219—Motion for Leave to File Under Seal Plaintiffs' Opposition to Defendants' Motion for Summary Judgment on Plaintiffs' False Advertising Claims—Feb. 17, 2015.
*Philippi-Hagenbuch* v. *Western*—DI 222—Reply to Response to Motion re DI 167 Motion for Summary Judgment of Invalidity of the Water Tank Maintenance Claims—Feb. 17, 2015.
*Philippi-Hagenbuch* v. *Western*—DI 223—Defendants' Answer to DI 143 Amended Complaint—Feb. 17, 2015.
*Philippi-Hagenbuch* v. *Western*—DI 224—Motion for Leave to File Under Seal Plaintiffs' Response to Defendants' Motion to Exclude Opinions and Testimony of Plaintiff's Damages Expert Michael E. Tate—Feb. 23, 2015.
*Philippi-Hagenbuch* v. *Western*—DI 226—Exhibits re DI 225 [Sealed Document] Plaintiffs' Response to Defendants' Motion to Exclude Opinions and Testimony of Plaintiff's Damages Expert Michael E. Tate—Feb. 23, 2015.

(56) References Cited

OTHER PUBLICATIONS

*Philippi-Hagenbuch* v. *Western*—DI 227—Motion for Leave to File Under Seal Defendants' Response to Plaintiffs' Motion to Strike and Preclude Defendants from Rearguing Claim Construction—Feb. 23, 2015.
*Philippi-Hagenbuch* v. *Western*—DI 228—Plaintiffs' Motion for Leave to File Excess Pages—Feb. 23, 2015.
*Philippi-Hagenbuch* v. *Western*—DI 229—Motion for Leave to File Under Seal Plaintiffs' Response to Defendants' Daubert Motion to Exclude Certain Opinions of Plaintiffs' Technical Expert Frederick Smith—Feb. 23, 2015.
*Philippi-Hagenbuch* v. *Western*—DI 232—Exhibits re DI 230 [Sealed Document] Plaintiffs' Opposition to Defendants' Daubert Motion to Exclude Certain Opinions of Plaintiff's Technical Expert Frederick Smith—Feb. 23, 2015.
*Philippi-Hagenbuch* v. *Western*—DI 234—Notice [Regarding a corrected Appendix re DI 231 (Sealed Document)]—Feb. 24, 2015.
*Philippi-Hagenbuch* v. *Western*—DI 235—Motion for Leave to File Under Seal Exhibits to Plaintiffs' Opposition to Defendants' Expedited Motion to Resolve the Parties' Disputes Regarding the Scope of Certain Claim Terms—Mar. 2, 2015.
*Philippi-Hagenbuch* v. *Western*—DI 236—Response to Motion re 218 Motion to Expedite Resolution of the Parties' Disputes Regarding the Scope of Certain Claim Terms—Mar. 2, 2015.
*Philippi-Hagenbuch* v. *Western*— DI 238—Corrected Exhibit No. 3 to Plaintiffs' Response to Motion to Expedite Resolution of the Parties' Disputes Regarding the Scope of Certain Claim Terms—Mar. 2, 2015.
*Philippi-Hagenbuch* v. *Western*—DI 239—Motion for Leave to File Under Seal Plaintiffs' Opposition to Defendants' Motion for Summary Judgment on Philippi-Hagenbuch's Lost-Profits Claim—Mar. 3, 2015.
*Philippi-Hagenbuch* v. *Western*—DI 241—Exhibits re DI 240 [Sealed Document] Plaintiffs' Opposition to Defendants' Motion for Summary Judgment on Philippi-Hagenbuch's Lost-Profits Claim—Mar. 3, 2015.
*Philippi-Hagenbuch* v. *Western*—DI 242—Motion for Leave to File Under Seal Responses to Plaintiffs' Summary Judgment Motions—Mar. 3, 2015.
*Philippi-Hagenbuch* v. *Western*—DI 244—Motion for Leave to File Under Seal Response to Plaintiffs' Motion for Summary Judgment on Defendants' False Advertising Claim—Mar. 3, 2015.
*Philippi-Hagenbuch* v. *Western*—DI 245—Response to Motion re DI 189 [Sealed Document] Summary Judgment that the Water Tank Maintenance Claims are Not Invalid Based on Hoss' Alleged Activities—Mar. 3, 2015.
*Philippi-Hagenbuch* v. *Western*—DI 246—Motion for Leave to File Under Seal Plaintiffs' Opposition to Defendants' Motion for Summary Judgment of Invalidity for Indefiniteness of the Collecting Data Claims of the Load Profiling Patents—Mar. 3, 2015.
*Philippi-Hagenbuch* v. *Western*—DI 249—Exhibits re DI 247 [Sealed Document] Plaintiffs' Opposition to Defendants' Motion for Summary Judgment of Invalidity for Indefiniteness of the Collecting Data Claims of the Load Profiling Patents—Mar. 3, 2015.
*Philippi-Hagenbuch* v. *Western*—DI 250—Part 1—Response to Motion re DI 186 [Sealed Document] Summary Judgment that the Westech Design Process is Not Prior Art—Mar. 3, 2015.
*Philippi-Hagenbuch* v. *Western*—DI 250—Part 2—Response to Motion re DI 186 [Sealed Document] Summary Judgment that the Westech Design Process is Not Prior Art—Mar. 3, 2015.
*Philippi-Hagenbuch* v. *Western*—DI 250—Part 3—Response to Motion re DI 186 [Sealed Document] Summary Judgment that the Westech Design Process is Not Prior Art—Mar. 3, 2015.
*Philippi-Hagenbuch* v. *Western*—DI 250—Part 4—Response to Motion re DI 186 [Sealed Document] Summary Judgment that the Westech Design Process is Not Prior Art—Mar. 3, 2015.
*Philippi-Hagenbuch* v. *Western*—DI 250—Part 5—Response to Motion re DI 186 [Sealed Document] Summary Judgment that the Westech Design Process is Not Prior Art—Mar. 3, 2015.
*Philippi-Hagenbuch* v. *Western*—DI 250—Part 6—Response to Motion re DI 186 [Sealed Document] Summary Judgment that the Westech Design Process is Not Prior Art—Mar. 3, 2015.
*Philippi-Hagenbuch* v. *Western*—DI 250—Part 7—Response to Motion re DI 186 [Sealed Document] Summary Judgment that the Westech Design Process is Not Prior Art—Mar. 3, 2015.
*Philippi-Hagenbuch* v. *Western*—DI 250—Part 8—Response to Motion re DI 186 [Sealed Document] Summary Judgment that the Westech Design Process is Not Prior Art—Mar. 3, 2015.
*Philippi-Hagenbuch* v. *Western*—DI 251—Motion for Leave to File Under Seal Plaintiffs' Opposition to Defendants' Motion for Summary Judgment of Non-Infringement of the Load Profiling Patents—Mar. 3, 2015.
*Philippi-Hagenbuch* v. *Western*—DI 253—Exhibits re DI 252 [Sealed Document] Plaintiffs' Opposition to Defendants' Motion for Summary Judgment of Non-Infringement of the Load Profiling Patents—Mar. 3, 2015.
*Philippi-Hagenbuch* v. *Western*—DI 255—Status Report (in response to Feb. 19, 2015 Order of the Court)—Mar. 5, 2015.
*Philippi-Hagenbuch* v. *Western*—DI 257—Defendants' Motion to Seal Exhibit A [DI 256] to Status Report—Mar. 5, 2015.
*Philippi-Hagenbuch* v. *Western*—DI 258—Motion to Seal Defendants' Reply Brief in Support of Their Motion for Summary Judgment on Philippi's False Advertising Claims—Mar. 6, 2015.
*Philippi-Hagenbuch* v. *Western*—DI 260—Motion for Leave to File Plaintiffs' Reply in Support of Their Motion to Strike and Preclude Defendants from Rearguing Claim Construction—Mar. 9, 2015.
*Philippi-Hagenbuch* v. *Western*—DI 261—Motion for Leave to File Under Seal Plaintiffs' Reply in Support of Their Motion to Strike and Preclude Defendants from Rearguing Claim Construction—Mar. 9, 2015.
*Philippi-Hagenbuch* v. *Western*—DI 263—Motion for Leave to File a Reply in Support of Defendants' Expedited Motion to Resolve the Parties' Disputes Regarding the Scope of Certain Claim Terms—Mar. 9, 2015.
*Philippi-Hagenbuch* v. *Western*—DI 264—Motion for Leave to File Defendants' Reply in Support of Their Daubert Motion to Exclude Certain Opinions of Plaintiffs' Technical Expert—Mar. 11, 2015.
*Philippi-Hagenbuch* v. *Western*—DI 265—Motion for Leave to File Under Seal Defendants' Reply in Support of Their Daubert Motion to Exclude Certain Opinions of Plaintiffs' Technical Expert—Mar. 11, 2015.
*Philippi-Hagenbuch* v. *Western*—DI 268—Motion for Leave to File Reply Brief in Support of Defendants' Motion to Exclude Opinions and Testimony of Plaintiffs' Damages Expert Michael E. Tate—Mar. 12, 2015.
*Philippi-Hagenbuch* v. *Western*—DI 269—Motion for Leave to File Under Seal Reply Brief in Support of Defendants' Motion to Exclude Opinions and Testimony of Plaintiffs' Damages Expert Michael E. Tate—Mar. 12, 2015.
*Philippi-Hagenbuch* v. *Western*—DI 271—Response by LeRoy G. Hagenbuch, Philippi-Hagenbuch re [DI 255] Status Report.
*Philippi-Hagenbuch* v. *Western*—DI 272—Reply to Response re DI-189 (Sealed Motion) for Summary Judgment that the Water Tank Maintenance Claims are Not Invalid Based on Hoss' Alleged Activities—Mar. 20, 2015.
*Philippi-Hagenbuch* v. *Western*—DI 273—Motion for Leave to File Under Seal Exhibit A to Plaintiffs' Reply in Support of Their Motion for Summary Judgment that the Water Tank Maintenance Claims are Not Invalid Based on Hoss' Alleged Activities—Mar. 20, 2015.
*Philippi-Hagenbuch* v. *Western*—DI 275—Motion for Leave to File Under Seal Plaintiffs' Reply in Support of Their Motion for Summary Judgment That Certain of Westech's Water Tanks Infringe—Mar. 20, 2015.
*Philippi-Hagenbuch* v. *Western*—DI 277—Exhibit B to DI 276 (Sealed Document) Plaintiffs' Reply in Support of Their Motion for Summary Judgment That Certain of Westech's Water Tanks Infringe—Mar. 20, 2015.
*Philippi-Hagenbuch* v. *Western*—DI 278—Plaintiffs' Motion for Leave to File Under Seal Plaintiffs' Reply in Support of Their Motion for Summary Judgment That the Asserted Truck Body Patent Claims Are Not Invalid Based on the "Westech Design Process" and Exhibits 1-7—Mar. 20, 2015.

(56) References Cited

OTHER PUBLICATIONS

*Philippi-Hagenbuch* v. *Western*—DI 280—Exhibits to DI 279 (Sealed Document) Plaintiffs' Reply in Support of Their Motion for Summary Judgment That the Asserted.Truck Body Patent Claims Are Not Invalid Based on the "Westech Design Process"—Mar. 20, 2015.
*Philippi-Hagenbuch* v. *Western*—DI 281—Motion for Leave to File Under Seal Plaintiffs' Reply in Support of Their Motion for Summary Judgment on Defendants' False Advertising Claims—Mar. 20, 2015.
*Philippi-Hagenbuch* v. *Western*—DI 283—Exhibits to DI 282 (Sealed Document) Plaintiffs' Reply in Support of Their Motion for Summary Judgment on Defendants' False Advertising Claims—Mar. 20, 2015.
*Philippi-Hagenbuch* v. *Western*—DI 284—Motion for Leave to File Under Seal Defendants' Replies in Support of Their Motions for Summary Judgment (DI Nos. 197, 202 and 209)—Mar. 20, 2015.
*Philippi-Hagenbuch* v. *Western*—DI 286—Motion for Leave to File Under Seal Plaintiffs' Reply in Support of Their Motion for Summary Judgment That Claims 1, 2, 8, 14, 15, 19,.20, 37, 39, 46, 55, 57, 60, 61, of U.S. Pat. No. 7,412,357 Are Not Invalid and That Certain of Westech's Truck Bodies Infringe Claim 46 of U.S. Pat. No. 7,412,357—Mar. 20, 2015.
*Philippi-Hagenbuch* v. *Western*DI 288—Exhibits to DI 287 (Sealed Document) Plaintiffs' Reply in Support of Their Motion for Summary Judgment That Claims 1, 2, 8, 14, 15, 19, 20, 37, 39, 46, 55, 57, 60, 61, of U.S. Pat. No. 7,412,357 Are Not Invalid And That Certain of Westech's Truck Bodies Infringe Claim 46 of U.S. Pat. No. 7,412,357—Mar. 20, 2015.
*Philippi-Hagenbuch* v. *Western*—DI 291—Redaction to DI 183 (Sealed Document) Plaintiffs' Motion to Strike and Preclude Defendants from Rearguing Claim Construction—Mar. 30, 2015.
*Philippi-Hagenbuch* v. *Western*—DI 292—Motion for Leave to File Plaintiffs' Surreply to Defendants' Reply in Support of Their Motion for Summary Judgment on Philippi's False Advertising Claims—Mar. 31, 2015.
*Philippi-Hagenbuch* v. *Western*—DI 293—Surreply re DI 220 (Sealed Document) Plaintiffs' Surreply to Defendants' Reply in Support of Their Motion for Summary.Judgment on Philippi's False Advertising Claims—Mar. 31, 2015.
*Philippi-Hagenbuch* v. *Western*—DI 294—Motion for Leave to File Under Seal Plaintiffs' Surreply to Defendants' Reply in Support of Their Motion for Summary Judgment on Philippi's False Advertising Claims—Mar. 31, 2015.
*Philippi-Hagenbuch* v. *Western*—DI 296—Motion for Leave to File Plaintiffs' Surreply to Defendants' Reply in Support of Their Motion for Summary Judgment of Invalidity for Indefiniteness of the Collecting Data Claims of the Load Profiling Patents—Mar. 31, 2015.
*Philippi-Hagenbuch* v. Western—DI 297—Surreply re DI 197 (Sealed Document) Plaintiffs' Surreply to Defendants' Reply in Support of Their Motion for Summary Judgment of Invalidity for Indefiniteness of the Collecting Data Claims of the Load Profiling Patents—Mar. 31, 2015.
*Philippi-Hagenbuch* v. *Western*—DI 298—Motion for Leave to File Under Seal Exhibit A to Plaintiffs' Surreply to Defendants' Reply in Support of Their Motion for Summary Judgment of Invalidity for Indefiniteness of the Collecting Data Claims of the Load Profiling Patents—Mar. 31, 2015.
*Philippi-Hagenbuch* v. *Western*—DI 300—Motion for Leave to File Plaintiffs' Surreply to Defendants' Reply in Support of Their Motion for Summary Judgment on Philippi's Lost-Profits Claim—Mar. 31, 2015.
*Philippi-Hagenbuch* v. *Western*—DI 301—Surreply re DI 240 (Sealed Document) Plaintiffs' Surreply to Defendants' Reply in Support of Their Motion for Summary Judgment on Philippi's Lost-Profits Claim—Mar. 31, 2015.
*Philippi-Hagenbuch* v. *Western*—DI 302—Motion for Leave to File Under Seal Exhibits A and B to Plaintiffs' Surreply to Defendants' Reply in Support of Their Motion for Summary Judgment on Philippi's Lost-Profits Claim—Mar. 31, 2015.
*Philippi-Hagenbuch* v. *Western*—DI 304—Motion for Leave to File Plaintiffs' Surreply to Defendants' Reply in Support of Their Motion for Summary Judgment of Non-Infringement of the Load Profiling Patents—Mar. 31, 2015.
*Philippi-Hagenbuch* v. *Western*—DI 305—Surreply re DI 209 (Sealed Document) Plaintiffs' Surreply to Defendants' Reply in Support of Their Motion for Summary Judgment of Non-Infringement of the Load Profiling Patents—Mar. 31, 2015.
*Philippi-Hagenbuch* v. *Western*—DI 306—Motion for Leave to File Under Seal Exhibit A to Plaintiffs' Surreply to Defendants' Reply in Support of Their Motion for Summary Judgment of Non-Infringement of the Load Profiling Patents—Mar. 31, 2015.
*Philippi-Hagenbuch* v. *Western*—DI 308—Order [denying Defendants' Motion to Exclude Certain Opinions of Plaintiffs' Technical Expert Frederick Smith (DI 210)]—Apr. 8, 2015.
*Philippi-Hagenbuch* v. *Western*—DI 309—Defendants' Objections to Late-Proffered Evidence Filed With Plaintiffs' Reply Briefs, and Proposed Surreply Briefs—Apr. 14, 2015.
*Philippi-Hagenbuch* v. *Western*—DI 310—Defendants' Response to DI Nos. 292, 296, and 300—Apr. 14, 2015.
*Philippi-Hagenbuch* v. *Western*—DI 311—Plaintiffs' Motion for Reconsideration re DI 308 (Order on Sealed Motion) Apr. 17, 2015.
*Philippi-Hagenbuch* v. *Western*—DI 312—Motion to Seal Plaintiffs' Motion for Reconsideration of the Court's Order (DI 308).
*Philippi-Hagenbuch* v. *Western*—DI 314—Motion for Leave to File Plaintiffs' Answer to Defendants' Amended Counterclaims—Apr. 22, 2015.
*Philippi-Hagenbuch* v. *Western*—DI 315—Plaintiffs' Response re DI 309 Objection, Plaintiffs' Opposition to Defendants Objections to Late-Proffered Evidence Filed With Plaintiffs' Reply Briefs (DI Nos. 272, 276, 282, and 287), and Proposed Surreply Briefs (DI Nos. 293, 297, 301, and 305)—May 1, 2015.
*Philippi-Hagenbuch* v. *Western*—DI 316—Defendants' Opposition to Plaintiffs' Motion For Reconsideration of the Court's Apr. 8, 2015 Order (DI. No. 311)—May 4, 2015.
*Philippi-Hagenbuch* v. *Western*—DI 317—Motion for Leave to File Plaintiffs' Reply in Support of Their Motion for Reconsideration of the Court's Apr. 8, 2015 Order—May 5, 2015.
*Philippi-Hagenbuch* v. *Western*—DI 318—Defendants' Expedited Motion to Suspend the Pretrial Deadlines—May 6, 2015.
*Philippi-Hagenbuch* v. *Western*—DI 319—Plaintiffs' Response re DI 223 Answer to Amended Complaint, Counterclaim.
*Philippi-Hagenbuch* v. *Western*—DI 320—Order denying Plaintiff's Motion for Reconsideration (DI 311)—May 13, 2015.
*Philippi-Hagenbuch* v. *Western*—DI 321—Defendants' Motion to Strike and Bar Plaintiff's Late-Disclosed Witnesses—May 15, 2015.
*Philippi-Hagenbuch* v. *Western*—DI 322—Notice of Withdrawal of Defendants' Motion for Summary Judgment of Invalidity for Indefiniteness of the Collecting Data Claims of the.Load Profiling Patents—May 18, 2015.
*Philippi-Hagenbuch* v. *Western*—DI 323—Notice of Defendants' Rule 26(a)(3) Pretrial Disclosures—May 22, 2015.
*Philippi-Hagenbuch* v. *Western*—DI 324—Exhibits A and B to Notice of Defendants' Rule 26(a)(3) Pretrial Disclosures—May 22, 2015.
*Philippi-Hagenbuch* v. *Western*—DI 325—Joint Motion to Vacate the Trial Date and Suspend Remaining Pretrial Deadlines—Jun. 1, 2015.
*Philippi-Hagenbuch* v. *Western*—DI 326—Plaintiff's Response to Motion to Strike and Bar Plaintiff's Late-Disclosed Witnesses—Jun. 1, 2015.
*Philippi-Hagenbuch* v. *Western*—DI 327—Defendants' Supplemental Status Report Related to Motion to Compel Against Trinity—Jun. 2, 2015.
*Philippi-Hagenbuch* v. *Western*—DI 329—Motion for Leave to File Document (DI-328) Under Seal—Jun. 2, 2015.
*Philippi-Hagenbuch* v. *Western*—DI 330—Order denying Plaintiff's Motion for Summary Judgment That Claims 1, 2, 8, 14, 15, 19, 20, 37, 39, 46, 55, 57, 60, 61, of U.S. Pat. No. 7,412,357 Are Not Invalid and That Certain of Westech's Truck Bodies Infringe Claim 46 of U.S. Pat. No. 7,412,357—Jun. 2, 2015.

(56) References Cited

OTHER PUBLICATIONS

*Philippi-Hagenbuch* v. *Western*—DI 331—Plaintiff's Response to Defendants' Supplemental Status Report (DI-327)—Jun. 30, 2015.
*Philippi-Hagenbuch* v. *Western*—DI 332—Defendants' Request for Hearing re Motion to Compel (DI-100)—Jul. 2, 2015.
*Philippi-Hagenbuch, Inc. and LeRoy G. Hagenbuch* v. *Western Technology Services International, Inc.*("*Philippi-Hagenbuch* v. *Western*")—Case #: 1:12:cv:01099-JES-BGC—Central District of Illinois—Court Docket—Mar. 1, 2016.
*Philippi-Hagenbuch* v. *Western*—DI 387—Agreed Stipulation of Dismissal With Prejudice—Jan. 13, 2016.
*Philippi-Hagenbuch* v. *Western*—DI 388—Order of Dismissal With Prejudice—Jan. 15, 2016.

\* cited by examiner

Step 6

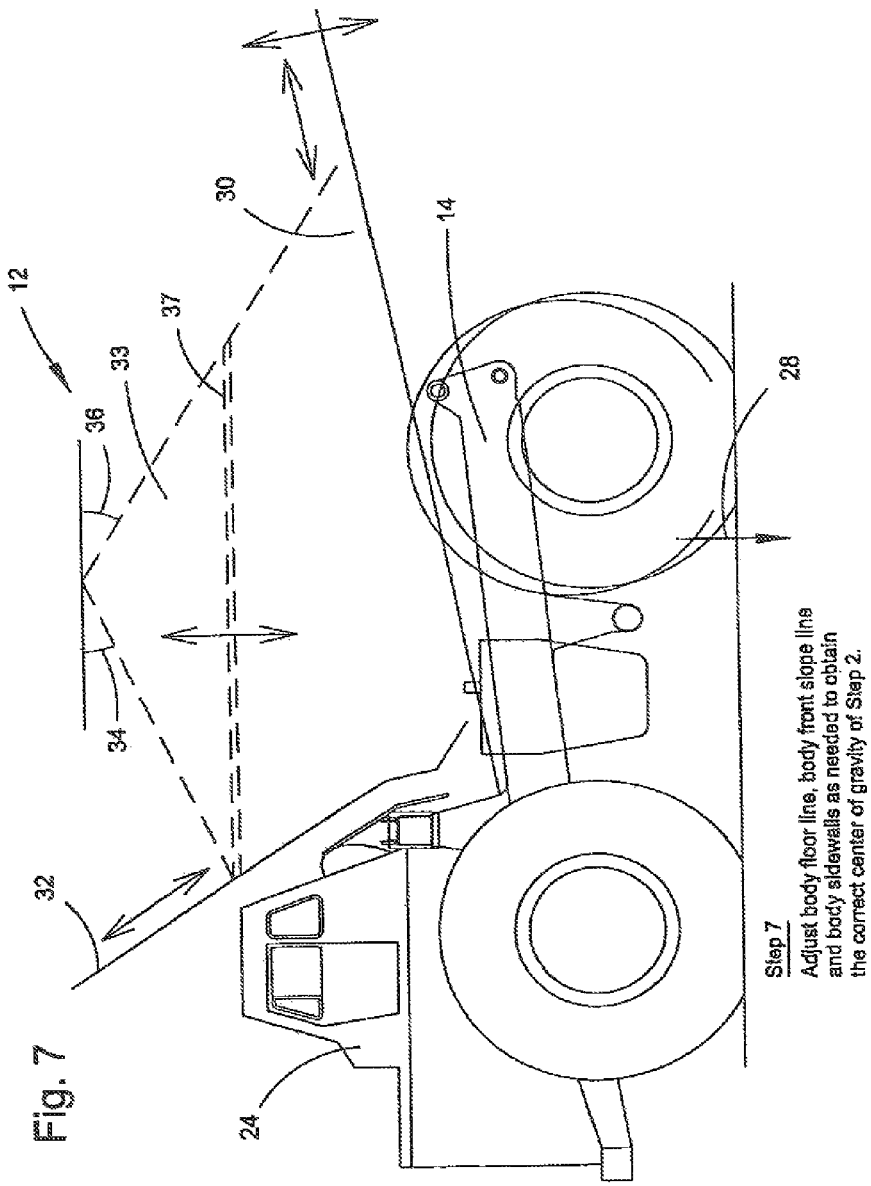

Step 8
Based on the specific customer information and the resulting load profile, a three dimensional model is developed which incorporates the actual side, front and rear angles of material repose and corner voids.

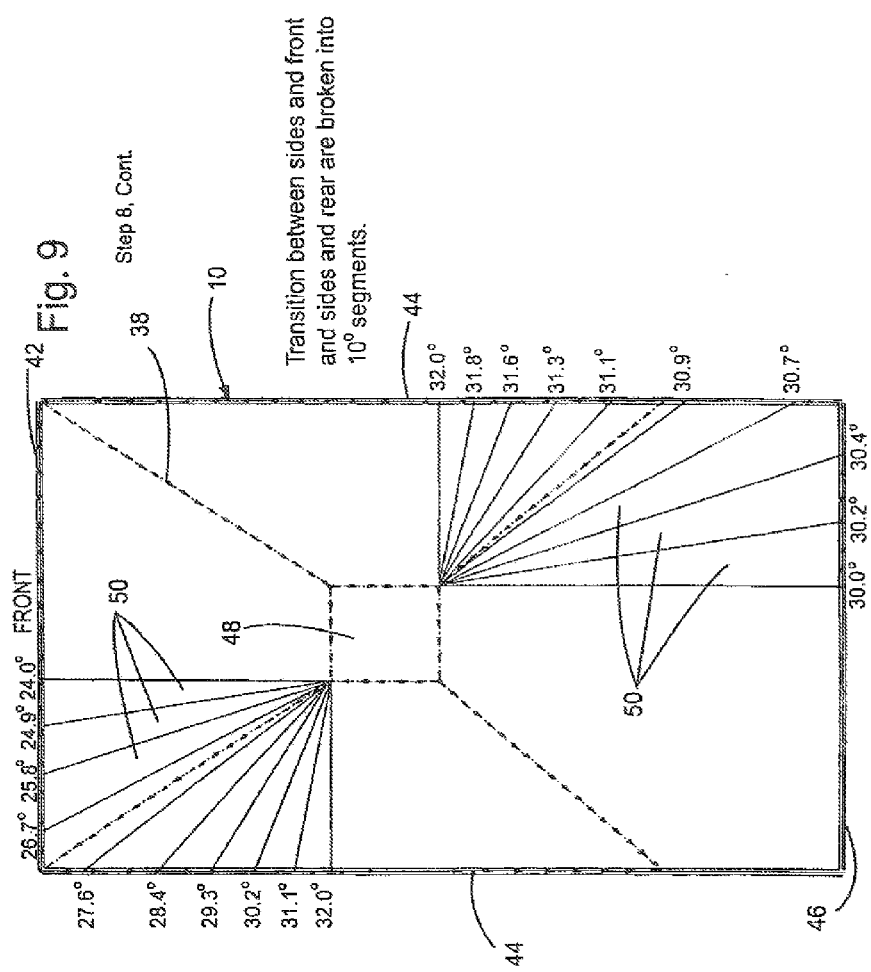

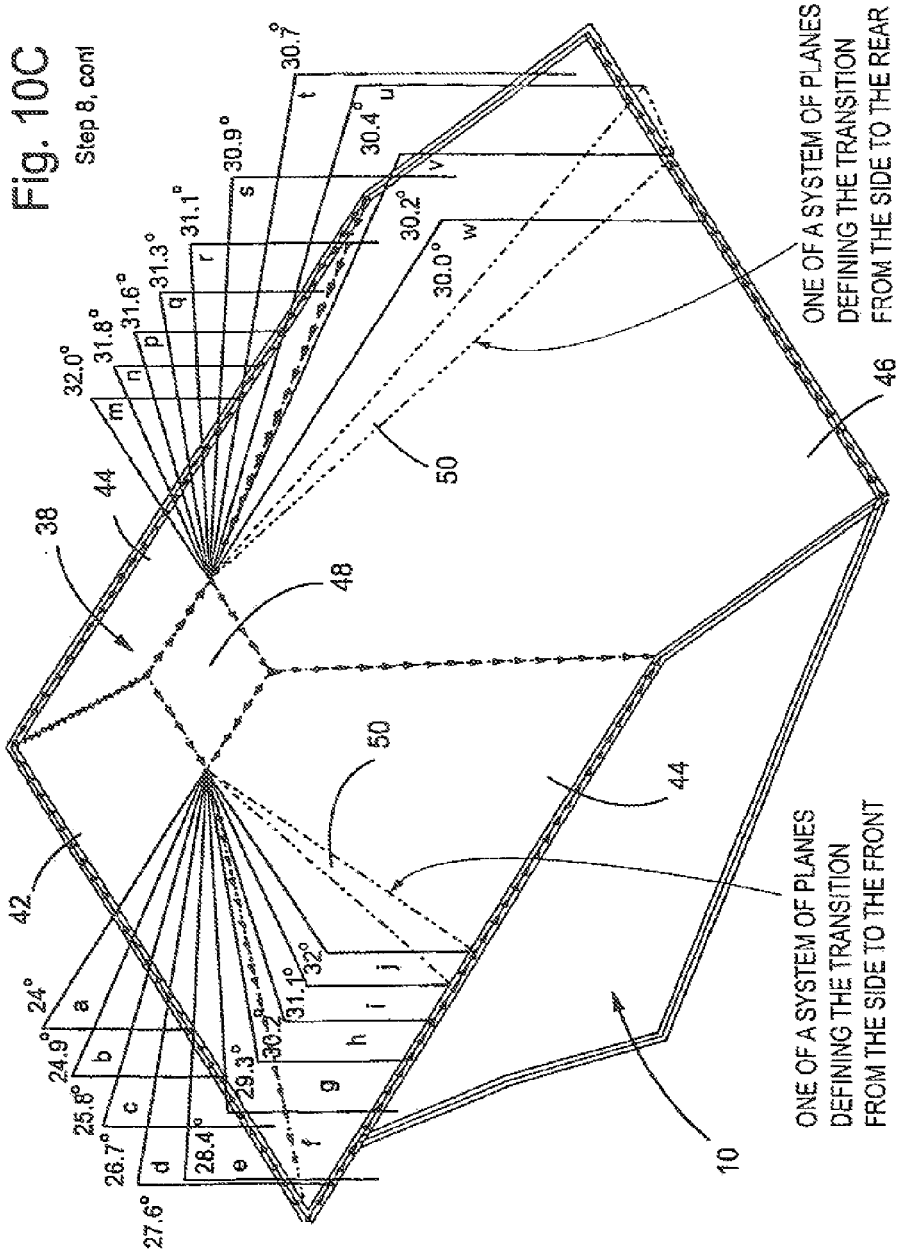

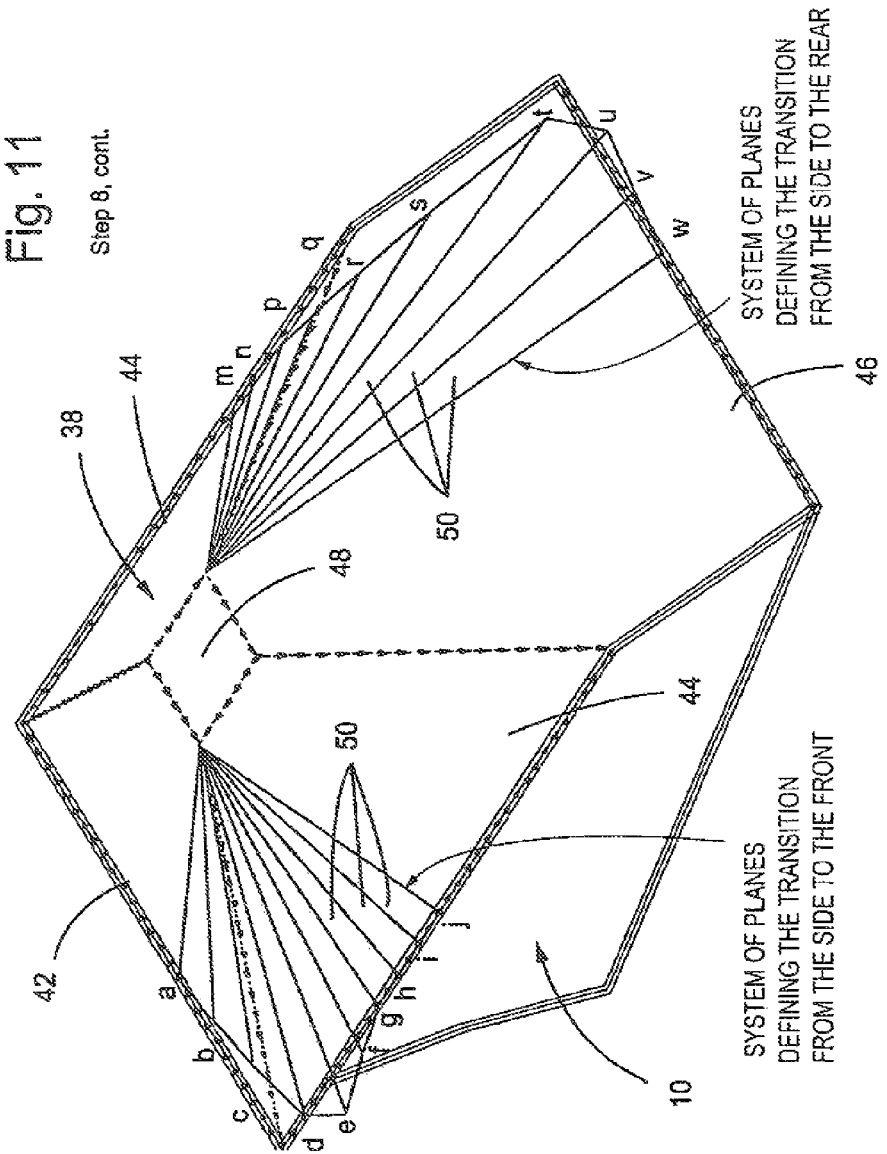

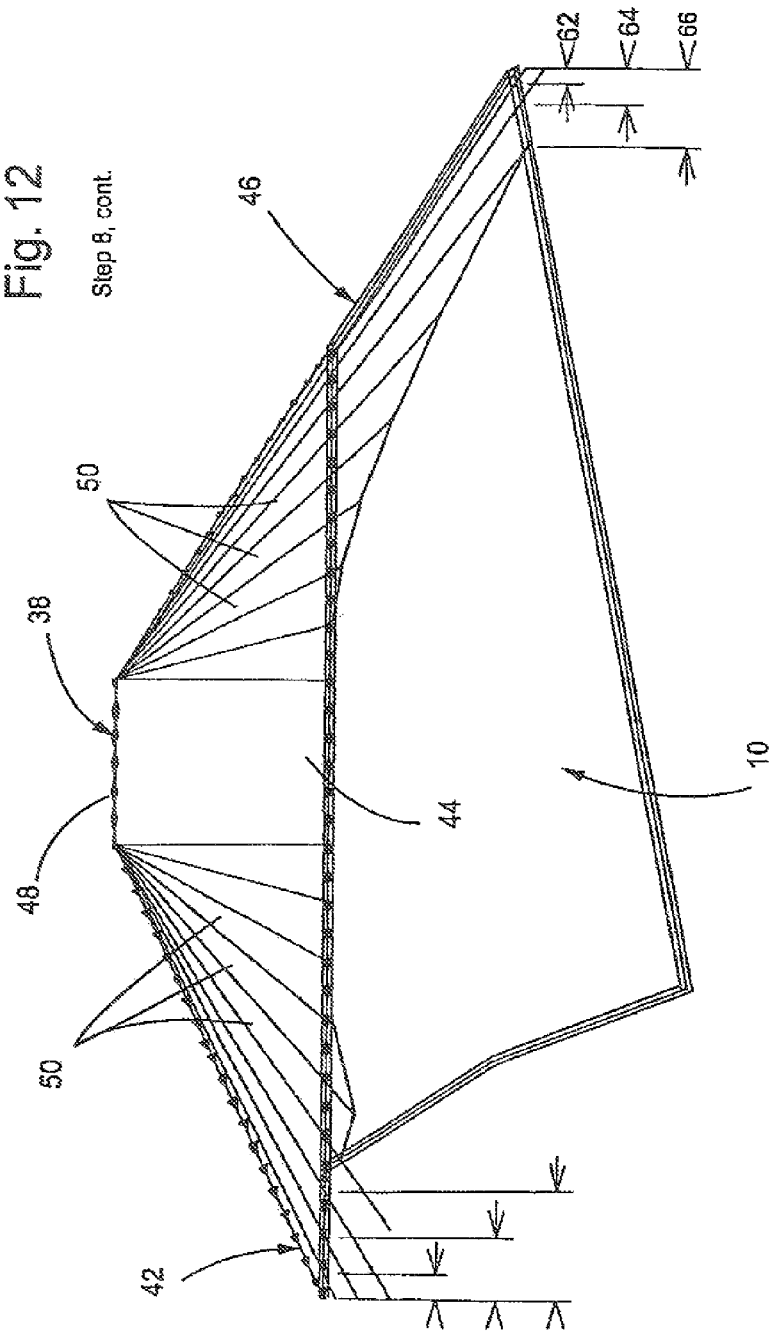

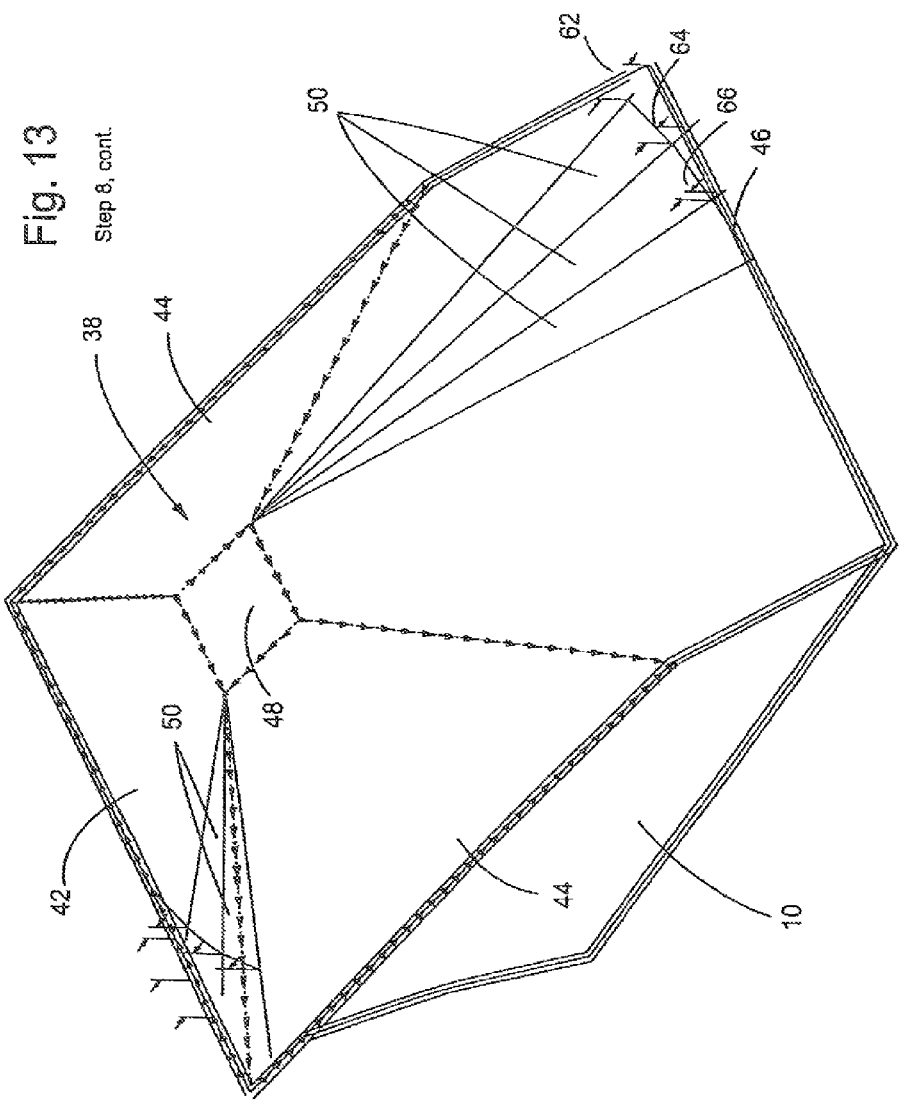

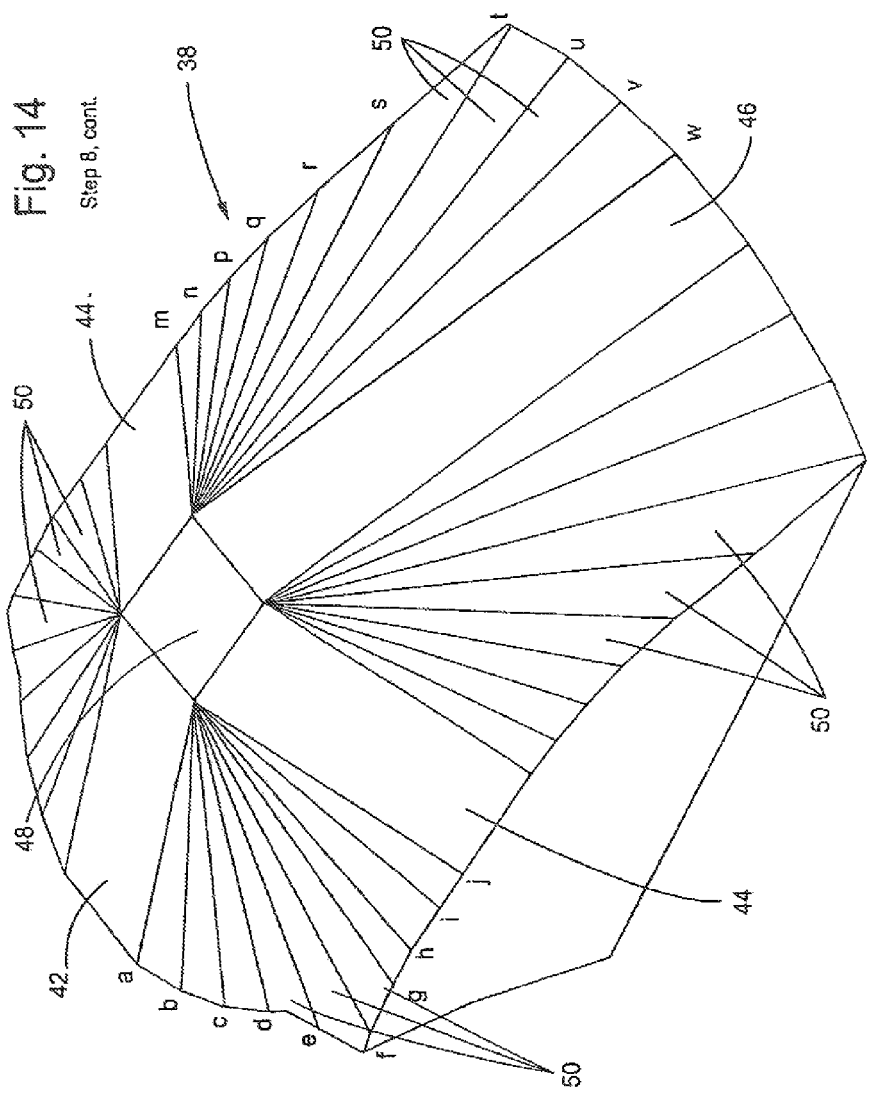

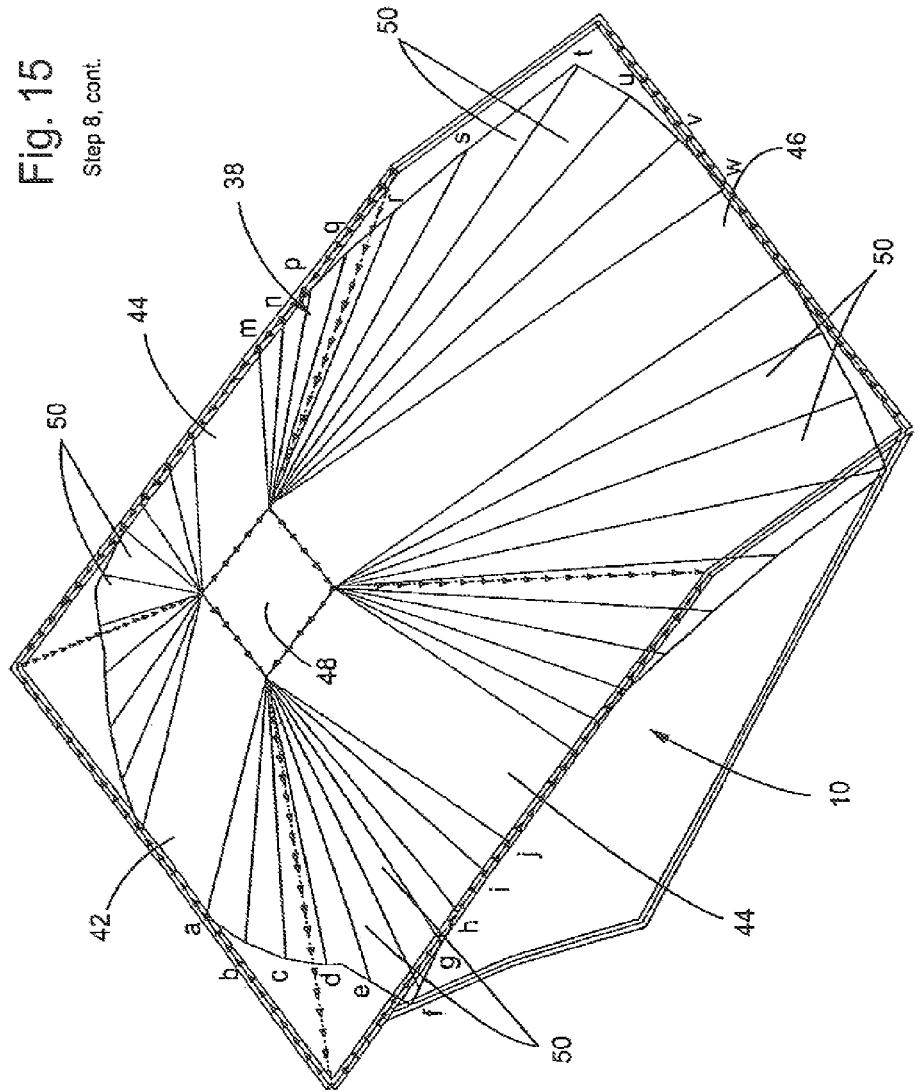

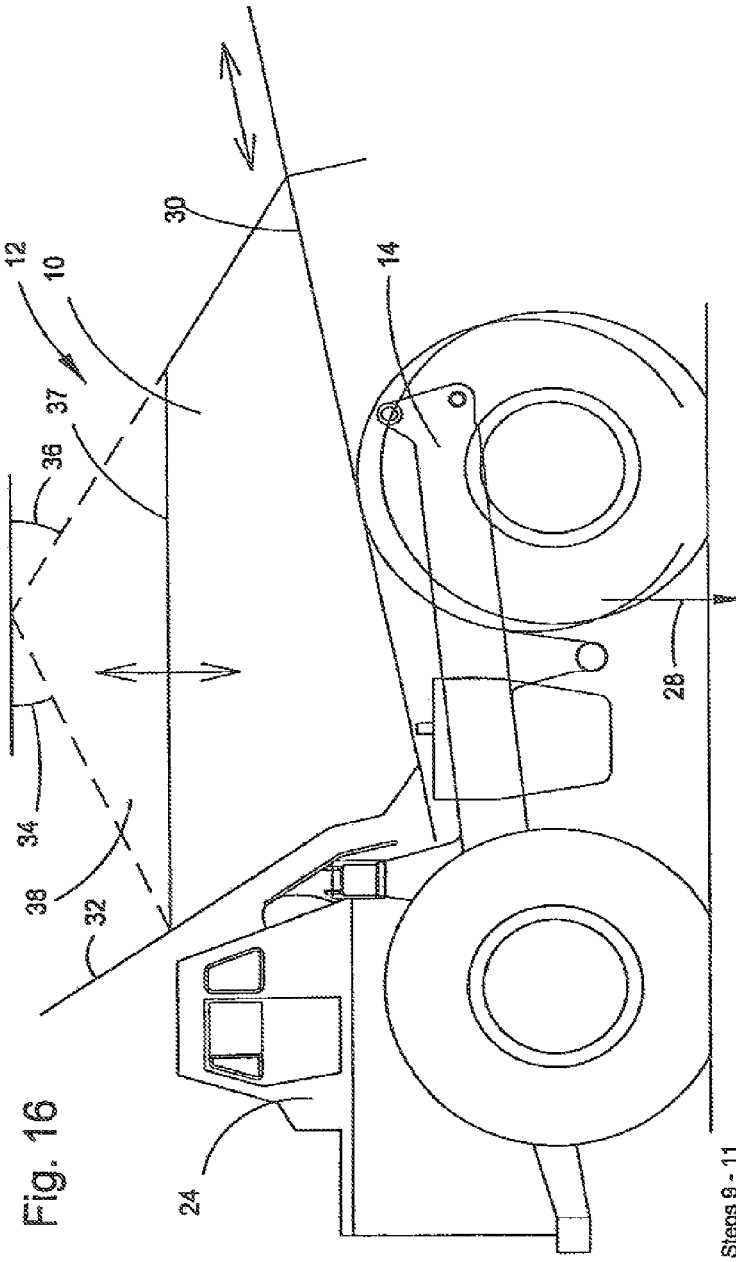

Fig. 16

Steps 9 – 11

The center of gravity of the three dimensional load model of Step 8 is determined and then compared to the correct center of gravity of the load as determined in Step 2.

If the center of gravity of the three dimensional load model is not properly positioned, then a new three dimensional load model is created based on the customer specific data and through adjustment of the design parameters of the dump body in an iterative process so that the load center of gravity of the load model is placed in the desired position.

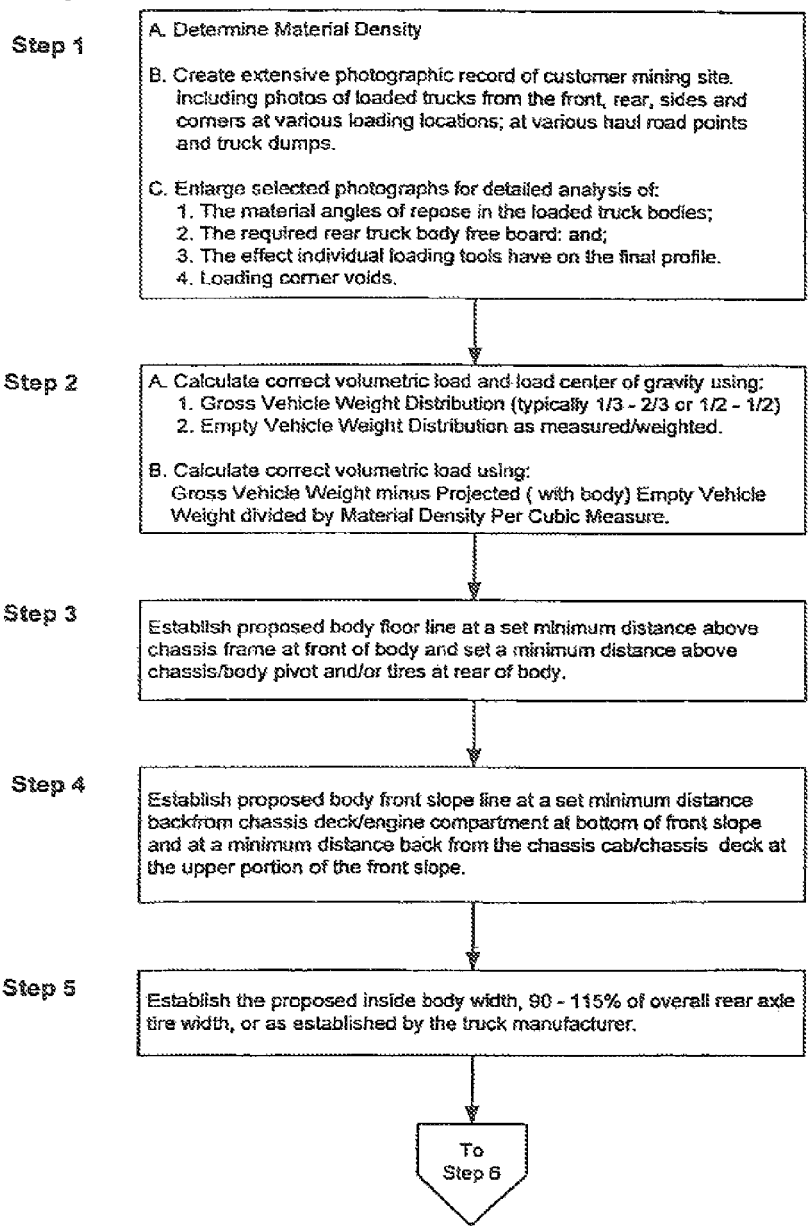

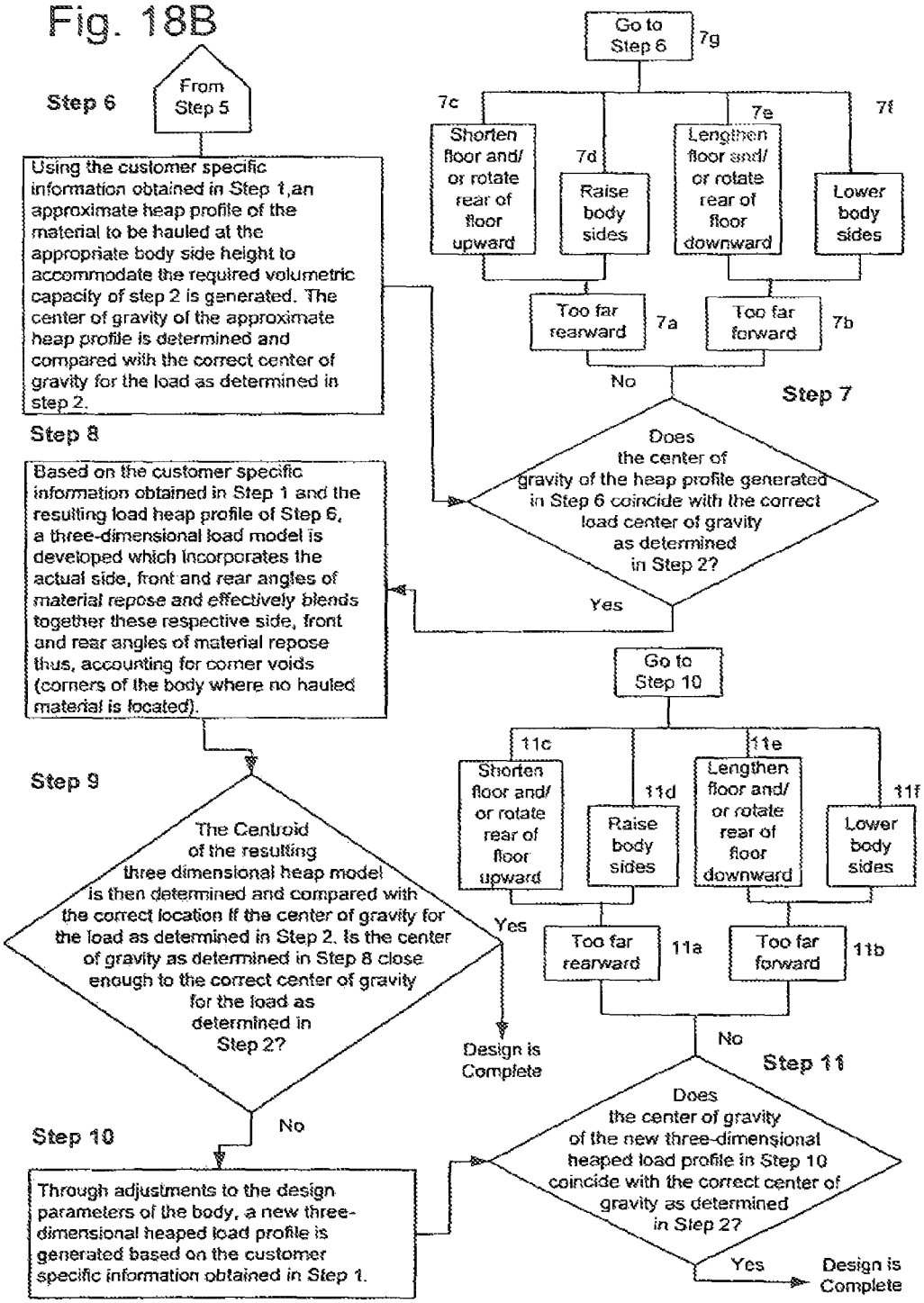

PROCESS FOR THREE-DIMENSIONAL MODELING AND DESIGN OF OFF-HIGHWAY DUMP BODIES

CROSS-REFERENCE TO RELATED APPLICATIONS

This application is a continuation of U.S. Ser. No. 12/106,794, filed Apr. 21, 2008, which is a continuation of U.S. Ser. No. 09/593,647, filed Jun. 13, 2000, (NOW U.S. Pat. No. 7,369,978) and a continuation-in-part of U.S. Ser. No. 09/333,379 filed Jun. 15, 1999, (NOW U.S. Pat. No. 7,412,357).

FIELD OF THE INVENTION

The present invention relates generally to heavy-duty off-highway trucks, and more particularly to a process for designing an off-highway truck dump body.

BACKGROUND OF THE INVENTION

In mining and construction environments, heavy-duty off-highway trucks are used to haul a variety of materials such as, for example, coal, rock, ore, and overburden materials. Such heavy-duty off-highway trucks generally comprise a truck chassis or frame which supports a dump body for receiving and carrying a load. In order to ensure that, the dump body is properly balanced, the dump body should be designed based on an anticipated load distribution of the material carried on the truck, chassis or frame. More specifically, the truck chassis anticipates a particular optimal location on the chassis where the center of gravity of the load carried in the dump body should be positioned.

Trucks with dump bodies which are often sold by the original equipment manufacturers have dump bodies designed around an assumed load configuration or load profile. In designing these dump bodies, however, the load profile which is used to size the body is based on a theoretical material angle of repose or load heap of the material irrespective of material cohesiveness, individual material heaping characteristics or material gradation. For example, in designing a dump body for hauling coal one theoretical material heap which is often used is a 3:1 heap (corresponding to an angle of repose of approximately 18°. With bodies designed to haul overburden, a theoretical material heap of 2:1 (or a different S.A.E. 2:1 heap) is often assumed.

Historically, off-highway truck manufacturers have been unable to reach a consensus with regards to the theoretical load heaps or configurations, let alone any consensus on the individual hauled material characteristics that should be used to design the dump bodies. As evidenced by their commercially available literature, some off-highway truck manufacturers use theoretical material heap profiles based on standards promulgated by the Society of Automotive Engineers (S.A.E. J 1363 January 1985) while others use their own heap profiles. Moreover, many off-highway truck manufacturers have over time alternated between using various different theoretical load heap profiles or configurations to design their dump bodies.

Off-highway truck manufacturers use these theoretical load heap profiles so that they are able to mass produce their dump bodies. However, the theoretical load heap, and the resulting theoretical load profiles, which the truck manufacturers use to design their dump bodies ignore a number of factors. For example, theoretical load profiles do not take into account the particular material characteristics of the material being loaded and hauled. In addition, theoretical load profiles do not take into account the corner voids which occur when a load is placed in the dump body. In particular, since the material is loaded from overhead into the dump body, the material tends to try to form a generally conical shape in the dump body. Because the load conforms to a generally conical shape, voids are created in the corners of the dump body where no material is present. The theoretical load profiles as used by truck manufacturers ignore these corner voids.

Additionally, field loading/haulage conditions impact the actual angles of repose that the loaded material forms in the dump body. In the loading process, material on its own flows to a natural angle of repose, however, in the loading process as the loading equipment pushes/pulls and rests on the material being loaded an imposed material angle of repose results. For instance, the method by which the material is actually loaded into the dump body, e.g. using a front-end loader or a shovel, can impact the ultimate actual profile of the load in the body. Other material characteristics such as the cohesiveness, gradation, size and consistency of the material (e.g., ore, overburden, clay, etc.) also impacts the actual load profile. Accordingly, because of differences in the materials and field loading and haulage conditions, the actual load profile or configuration of given materials in the dump body at different sites can vary extensively.

As a result, the mass-produced dump bodies supplied by off-highway truck manufacturers which are based on a theoretical material load profile are often improperly matched for a particular material haulage application. For example, the dump body may be inadvertently designed such that, the dump body size and resultant load is either undersized/underloaded or oversized/overloaded and that the corresponding center of gravity of the actual load is significantly offset from where it should be placed, based on the design of the truck chassis. This causes incorrect truck loading and improper truck utilization with uneven loading of the truck chassis leading to uneven or offset frame loading, which can potentially result in truck chassis problems including uneven tire wear which often requires premature replacement of the tires; and potentially poor vehicle operating stability. As will be appreciated, since the trucks themselves and the tires used on these types of off-highway trucks are extremely costly, potential truck chassis repair and premature replacement of tires significantly increases the operating expenses associated with material haulage.

Likewise, depending on how the actual material and material heap varies from a theoretical material load profile, the dump body can be either too large or too small resulting in the truck chassis carrying loads which are both improperly placed on the truck frame and significantly heavier or lighter than intended. An improperly designed body which is too small to carry the intended load can lead to spillage of the load over the sides and off the rear end of the body resulting in significant under utilization of the truck. If side/rear spillage occurs during transport, it can result in tire damage and tire ruptures particularly on the following trucks. While too large of a body for the intended load can result in extreme truck overloads or if the load is limited to the correct load amount in the dump body, the load may often be improperly placed in the dump body leading to poor truck stability and individual truck chassis component to overloads.

OBJECTS AND SUMMARY OF THE INVENTION

Accordingly, in view of the foregoing, a general object of the invention is to provide a dump body which is designed for specific field operating environments.

A related object is to provide a method for designing off-highway dump bodies which more accurately takes into account actual field conditions.

A more specific object is to provide a process for three-dimensional modeling of required dump body loads and the related design of dump bodies based on actual field conditions at particular sites.

These and other features and advantages of the invention will be more readily apparent upon reading the following description of a preferred exemplary embodiment of the invention and upon reference to the accompanying drawings wherein:

BRIEF DESCRIPTION OF THE DRAWINGS

FIGS. 1-7 are side views and a rear view (FIG. 6) of a heavy-duty, off-highway truck illustrating a portion of an exemplary sequence of process steps for designing a dump body for the truck in accordance with the present invention.

FIG. 9 is top view of the dump body and material heap of FIGS. 8A and 8B illustrating in part how the corners of the heaped load are modeled based on an incremental blending of the side angles of material repose to the front and rear angles of material repose to develop the three-dimensional modeled material heap profile.

FIGS. 10c and 11 are perspective views of the dump body and material heap of FIGS. 8A and 8B illustrating in part how the corners of the heaped load are modeled based on an incremental blending of the side angles of material repose to the front and rear angles of material repose to develop the three-dimensional modeled material heap profile.

FIG. 12 is a side view of the dump body and material heap of FIGS. 8A and 8B illustrating in part how the corners of the heaped load are modeled based on an incremental blending of the side angles of material repose to the front and rear angles of material repose to develop the three-dimensional modeled material heap profile.

FIG. 13 is a perspective view of the dump body and material heap of FIGS. 8A and 8B illustrating how the corners of the heaped load are modeled based on an incremental blending of the side angles of material repose to the front and rear angles of material repose to develop the three-dimensional modeled material heap profile.

FIG. 14 is a perspective view of the final, three-dimensional modeled material heap profile for use in the dump body design process of the present invention.

FIG. 15 is a perspective view of the three-dimensional modeled material heap profile of FIG. 14 in the dump body of FIGS. 8A and 8B.

FIG. 16 is a side view of the off-highway truck of FIGS. 1-7 having the dump body and material heap profile of FIG. 15 illustrating a further step in the dump body design process of the present invention.

FIGS. 18a-b are a flow diagram of an exemplary embodiment of the design process of the present invention.

While the invention will be described and disclosed in connection with certain preferred embodiments and procedures, it is not intended to limit the invention to those specific embodiments. Rather it is intended to cover all such alternative embodiments and modifications as fall within the spirit and scope of the invention.

DETAILED DESCRIPTION OF THE PREFERRED EMBODIMENT

Figure 17:
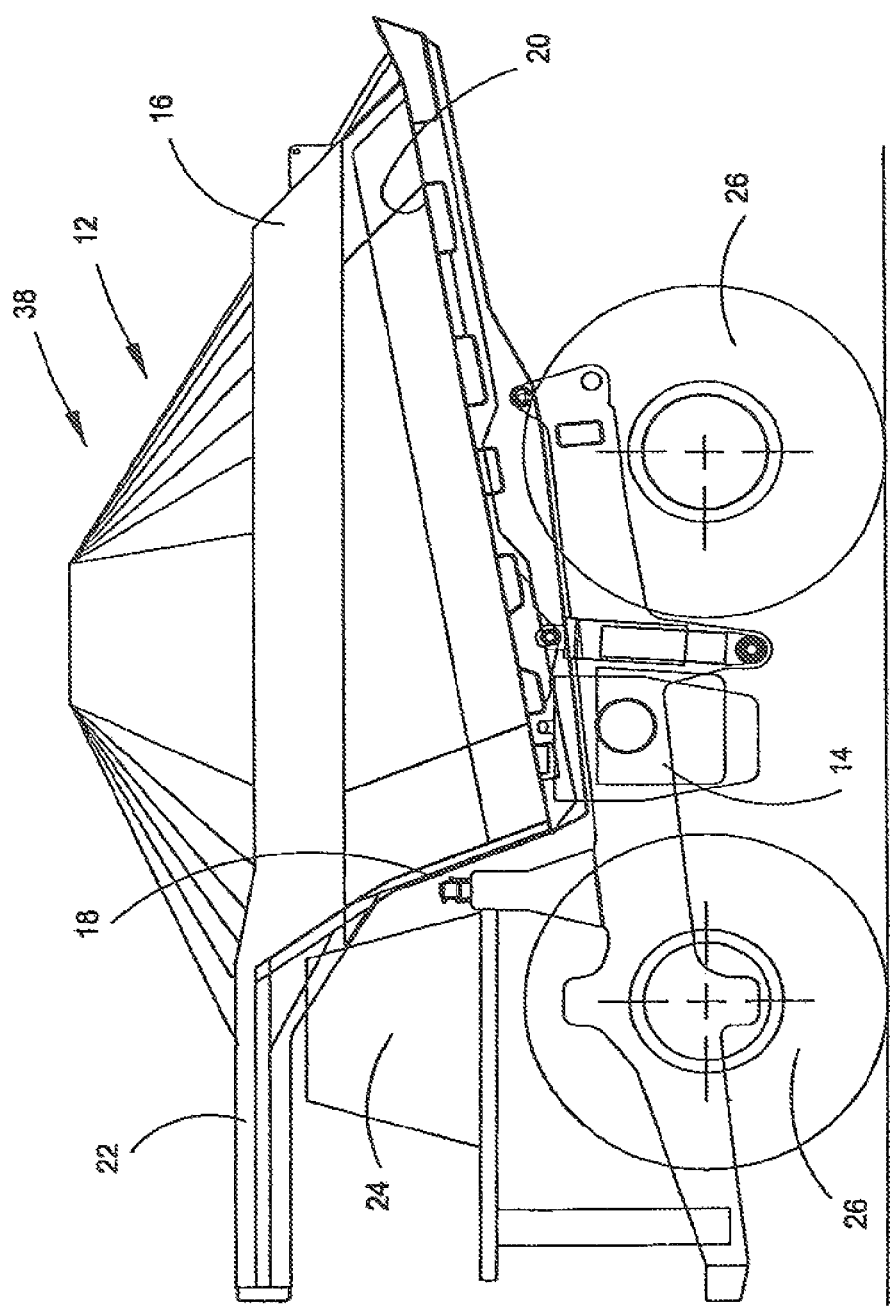
FIG. 17 is a side view illustrating the final design of the dump body.

Referring now more particularly to the drawings there is shown in FIGS. 1-17 an illustrative sequence of process steps for designing a dump body 10 for an heavy-duty off-highway truck 12 in accordance with the teachings of the present invention. The truck 12 includes a chassis 14 to which the dump body 10 is attached for pivotal movement about an axis between a lowered position for receiving and transporting a load of material and a raised position for dumping a load of material. As shown in FIG. 17, the dump body 10 is generally constructed of steel panels which define the shape of the dump body and beams which form the structural framework for the dump body. The dump body comprises, in this case, sidewalls 16, a front wall or front slope 18, a floor 20 and a canopy 22 integrally connected to the top end of the front slope 18 and extending over the cab 24 of the truck 12. The truck chassis 14 is supported by a plurality of tires 26.

In the illustrated embodiment, the truck 12 is generally symmetrical about its longitudinal axis. Accordingly, as will be appreciated, many of the elements identified in the side views of FIGS. 1-7 have complementary elements arranged on the opposite side of the truck 12. As will be appreciated, reference to plural elements where only one is shown indicate that a complementary element is disposed on the side of the truck 12 not shown (e.g., sidewalls 16).

In accordance with an important aspect of the present invention, the dump body 10 is designed so that the volumetric capacity of the dump body matches the truck hauling capacity and that loads in the dump body have a center of gravity that best matches the intended load center of gravity/corresponding load distribution contemplated by the design of the truck chassis 14. More specifically, the dump body 10 is shaped and dimensioned to accommodate the correct volumetric load as well as to maintain a load distribution that results in the center of gravity of the load being proximate a predetermined location, in this case, the preferred position for the load center of gravity based on the truck manufacturer's designed chassis loading/weight distribution. Unlike previous dump body design methods, the dump body design of the present invention is not based on an assumed theoretical or universal load profile/load material heap. Instead, the present invention utilizes a load profile that is based on a detailed analysis of the actual material characteristics and loading conditions present in specific field haulage environments thereby taking into account factors such as the cohesiveness of the material to be hauled and the size, shape and gradation of the pieces of material.

For example, U.S. Pat. No. 5,887,914 issued to LeRoy G. Hagenbuch on Mar. 30, 1999 discloses a dump body design process which can be used to produce a dump body that is capable of hauling both overburden and coal. This design process assumes a theoretical 2:1 heap for overburden and a theoretical 3:1 heap for coal. It has been found that these theoretical load profile assumptions do not always provide an accurate body design of the actual haulage operating conditions which are encountered at specific job sites. Such theoretical body load profiles, are used without any consideration of the actual material, loading and hauling conditions that exist at actual locations of use. Thus, in many cases the dump body can be improperly sized and designed or matched to the material to be hauled and accordingly to the truck chassis.

Figure 21:
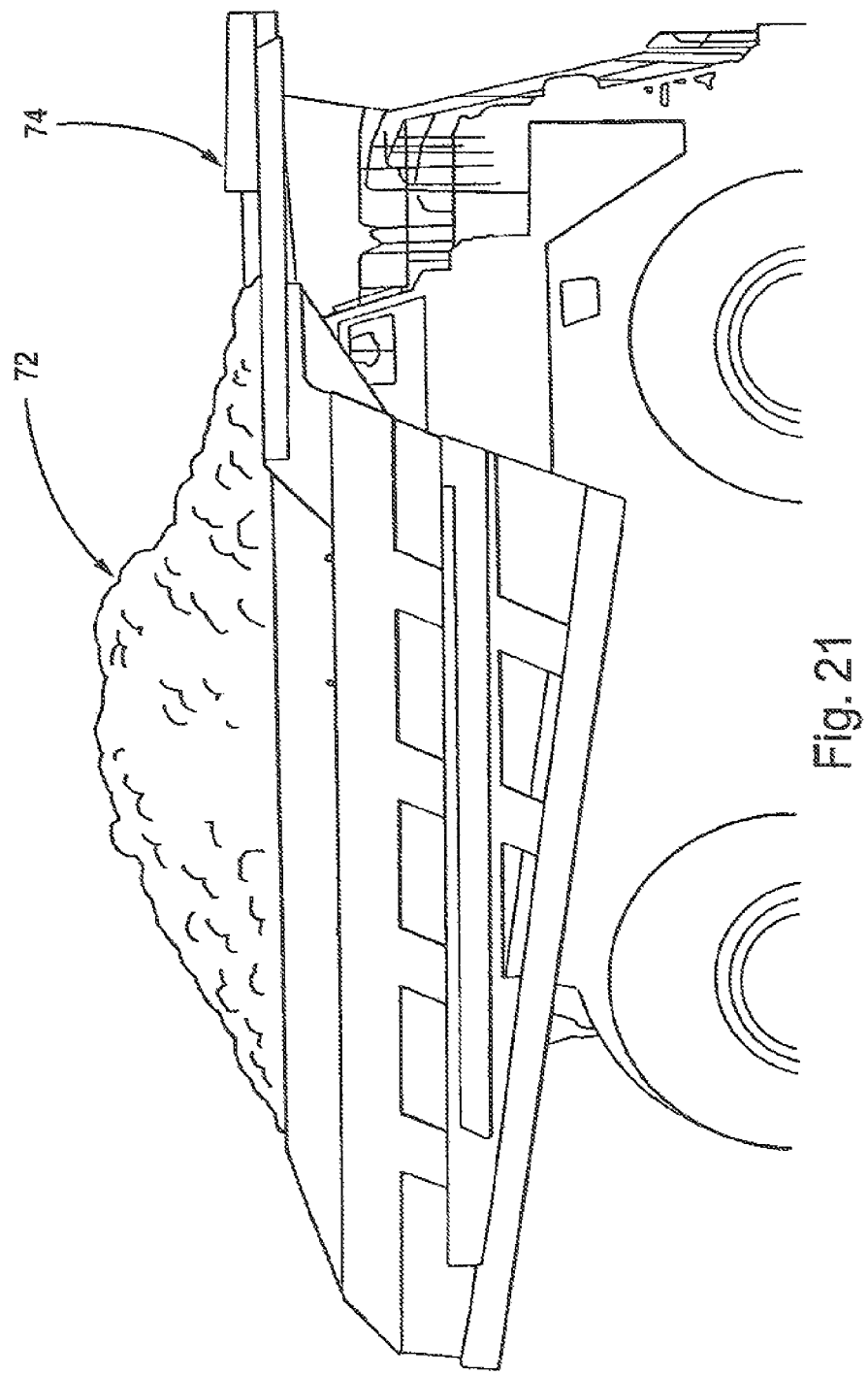
FIG. 21 is a side view of an off-highway truck carrying a load in an exemplary field operating environment.
Figure 22:
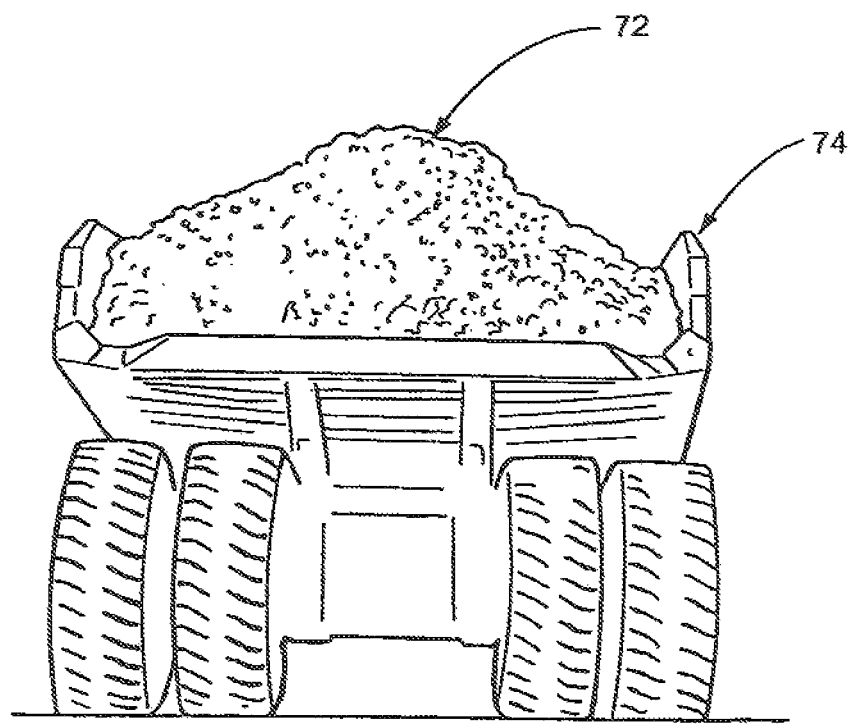
FIG. 22 is an end view of an off-highway truck carrying a load in an exemplary field operating environment.

In order to more accurately take into account actual field conditions, the first step in the design process of the present invention is to collect field data relating to the material characteristics and load configurations currently being hauled by trucks at the site at which the dump body 10 will be used. In particular, data should be collected with regard to the actual angles of material repose, the size and shape of any plateau formed at the top of the load and loading voids that are formed by the material when it is loaded and carried in existing dump bodies. The angles of material repose are dependent upon a number of factors including the cohesiveness of the material being hauled and the size, shape and gradation of the material pieces. With respect to analyzing the angles of repose, load plateau and loading voids of the loaded material, one method by which this can be accomplished is to photograph (or videotape) from various different angles the loads 72 presently being hauled by one or more existing off-highway trucks 74 at a site (see, e.g., FIGS. 21 and 22). More specifically, photographs should be taken of loads 72 carried by several different existing trucks 74 with photographs being taken from the front, back, corners (front, and rear) and sides of those trucks. In order to help identify any shifting of the load that may effect load profiles and which may occur during transport, photographs can be taken of the loaded trucks as they are leaving the loading area as well as when they are traveling on the haul roads.

Furthermore, since the method by which material is loaded into the truck 12 can also impact the loaded material profile, it can also be useful to collect data, via photographs or otherwise, regarding truck loading techniques and the equipment used to load the dump bodies. For example, front-end loaders generally have a wide bucket relative to the dump body length and typically load material into the dump body from the side of the truck. Accordingly, when front end-loaders will be used to load the dump body, the length of the dump body can be an important factor. Likewise, cable and hydraulic shovels tend to have narrower buckets and are also used to load material into the body typically from the side of the truck. Since cable shovels typically have a door which swings toward the shovel when dumping (i.e. towards the side of the body), the width of the body may be an important factor when shovels will be used to load the dump body. Additionally, information should be collected giving an accurate material density. The types of information which can be relevant to determining the density of the load material include visual examinations of the load material, the taking of weight samples of known volumes of the load material and consultations with the end user of the proposed dump body.

In some circumstances, such as in the case of a new mine, it may not be possible or desirable to collect material and loading data from the site at which the dump body 10 will be used. In these situations, data from a similar field haulage environment should be used. As will be appreciated by those skilled in the art, a similar field haulage environment would have conditions that parallel as closely as possible the conditions which are anticipated at the new site. This could include, for example, a nearby site or mine in which the same or similar material is hauled, a sire hauling similar materials and using similar hauling equipment and/or a site using similar loading equipment. Once the new mine or site is operational, the design of future dump bodies for that site can be refined as needed and as information is developed about the material and loading conditions at the site. Of course, the material and loading conditions at sites will, in most cases, evolve over time which could necessitate further analysis of these parameters prior to the design of new additional dump bodies for that site.

Once the appropriate load heap pictorial information has been collected, the information is then analyzed to determine what are the actual angles of material repose of the loaded material and the dimensions of the top plateau of the material heap. In one presently preferred embodiment, this is accomplished by blowing up at least select representative photographs of off-highway trucks with loaded material. From these blown up photographs, the size of the plateau of the heap, the angles of material repose and the corner voids of the loaded materials are then measured. In most cases, the angles of material repose that run to the front, rear and sides of the dump body will all be somewhat different namely due to the natural and imposed angles of repose occurring as a result of the loading process. Accordingly, using the photographs, values should be determined for each of these angles repose. The various values for the front, rear and side angles of repose which are measured from the photographs are compiled and averaged respectively in order to produce a composite front angle of repose, a composite rear angle of repose and a composite side angle of repose which can then be used to create a three-dimensional load profile as described in greater detail below. Of course, as will be appreciated by those skilled in the art, other methods may be used to collect and analyze the data on actual dump body field haulage conditions including, for example, actual, hands-on measurements of the relevant angles of repose and corner voids.

Figure 1:
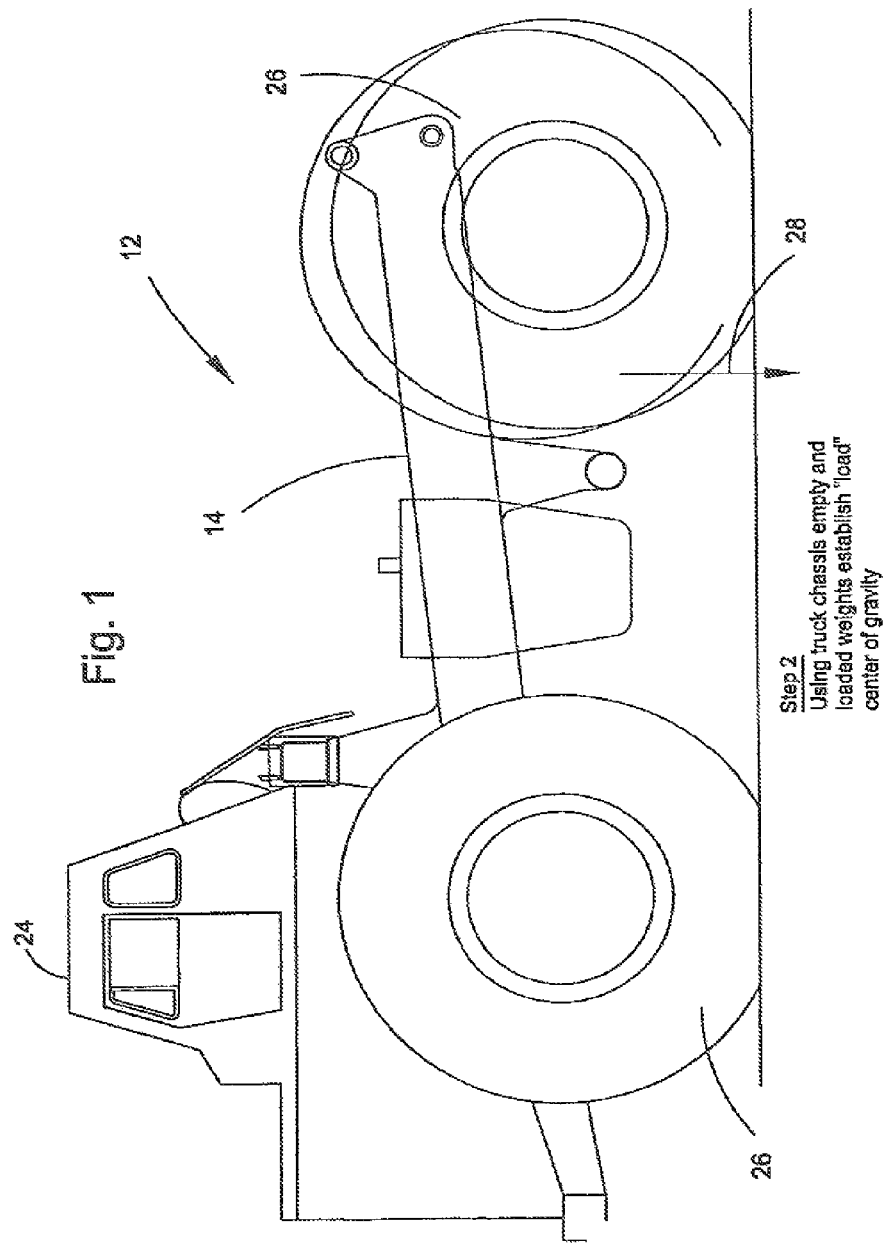

Using the values of the empty and loaded weights of the truck 12 provided by the off-highway truck manufacturer, the ideal position along the chassis 14 for the load center of gravity is then determined. As illustrated in FIG. 1, the correct load center of gravity on the chassis 14 (represented by arrow 28 in the drawings) is located using conventional moment diagrams.

Figure 2:
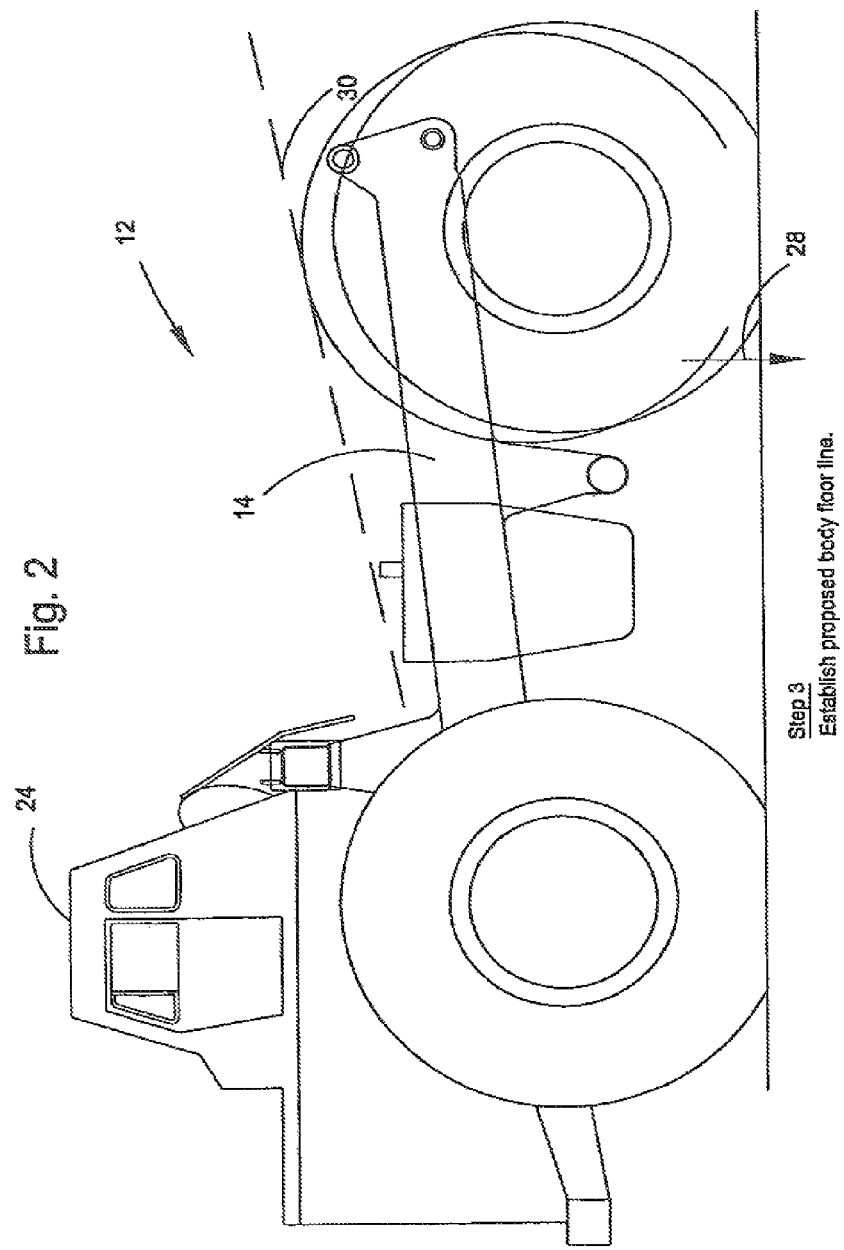
Figure 3:
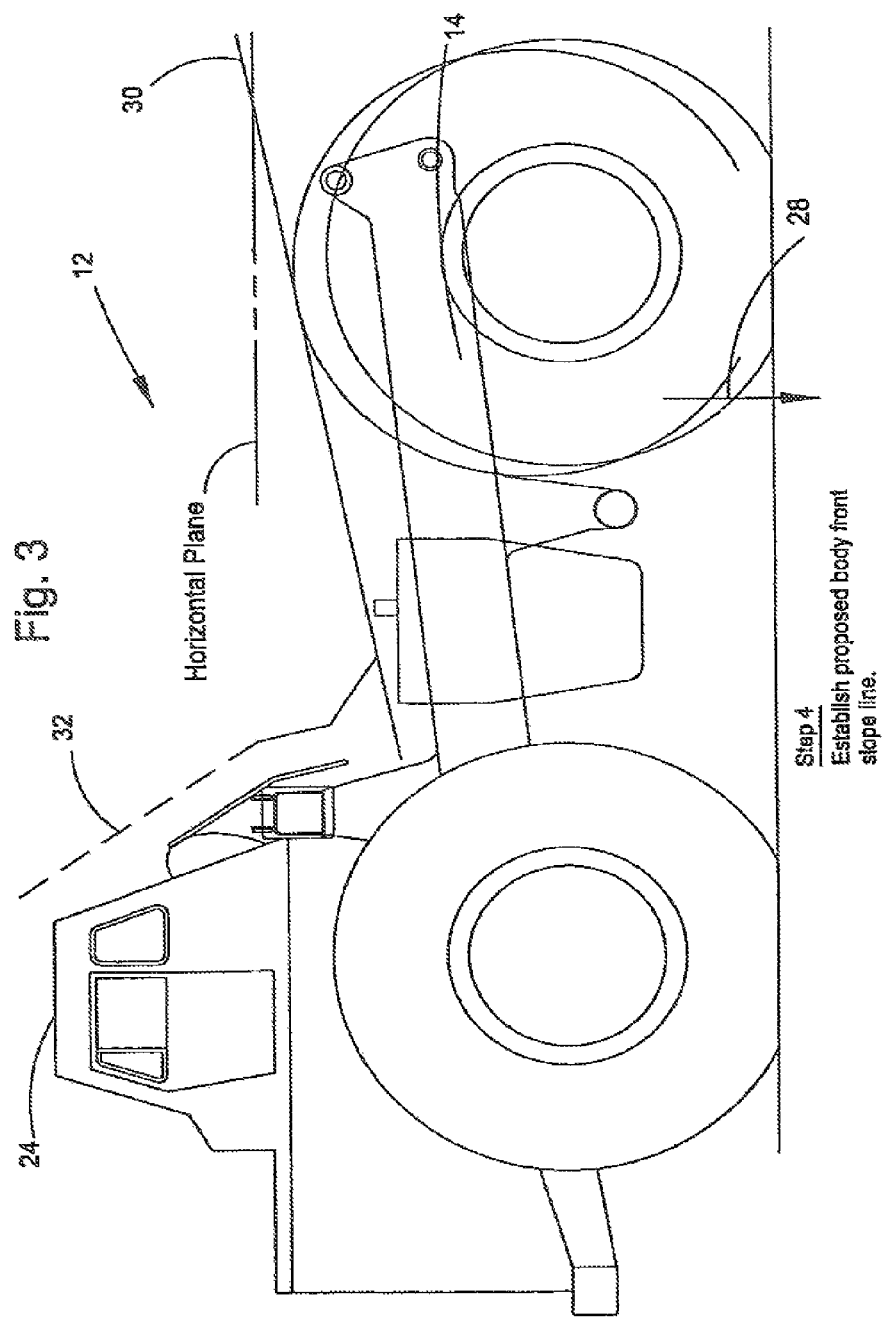
Figure 4:
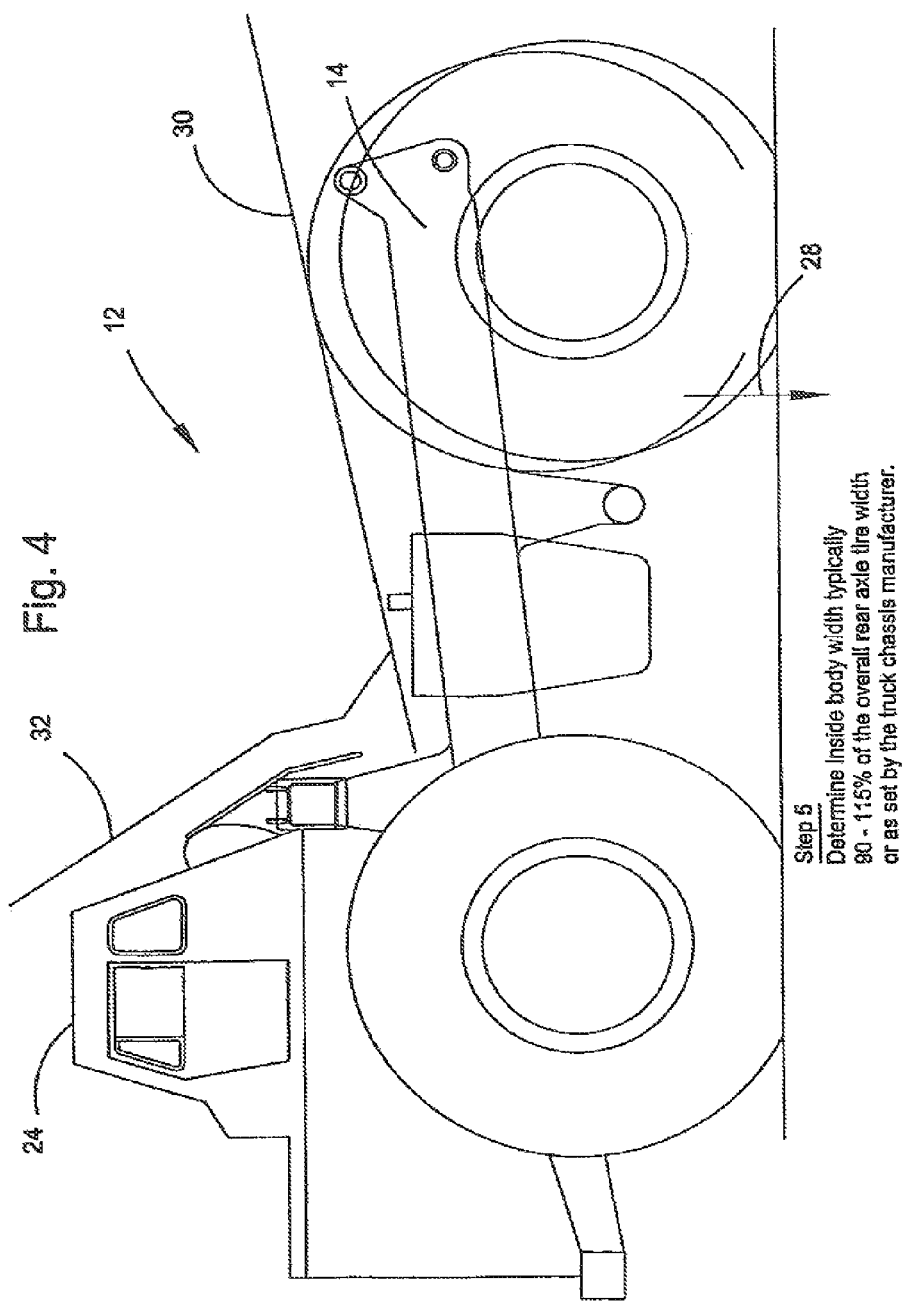

To begin designing the body 10, as shown in FIG. 2, a line 30 is established to represent the plane of the dump body floor. Generally, the angle of the floor line 30 is established to provide an incline with respect to the horizontal plane as illustrated in FIG. 3 and is established at a set minimum distance above the chassis 14 at the front of the body and a set minimum distance above the chassis and/or tires at the rear of the body. A proposed line 32 for the front slope of the dump body is also established, as shown in FIG. 3, at a set minimum distance back from the chassis deck/engine compartment at the bottom end of the front slope and at a set minimum distance back from the chassis cab 24 at the upper portion of the front slope. To minimize the vertical height of the center of gravity of the load, it is preferable to set the initial front slope line 32 as far forward and the initial floor line 30 as low as possible while still maintaining the appropriate clearances for the truck cab 24 and chassis 14. As shown in FIG. 4, the initial proposed inside body width of the body 10 is then set based on 90-115% of the overall rear axle tire width or as set by the truck chassis manufacturer.

Figure 5:
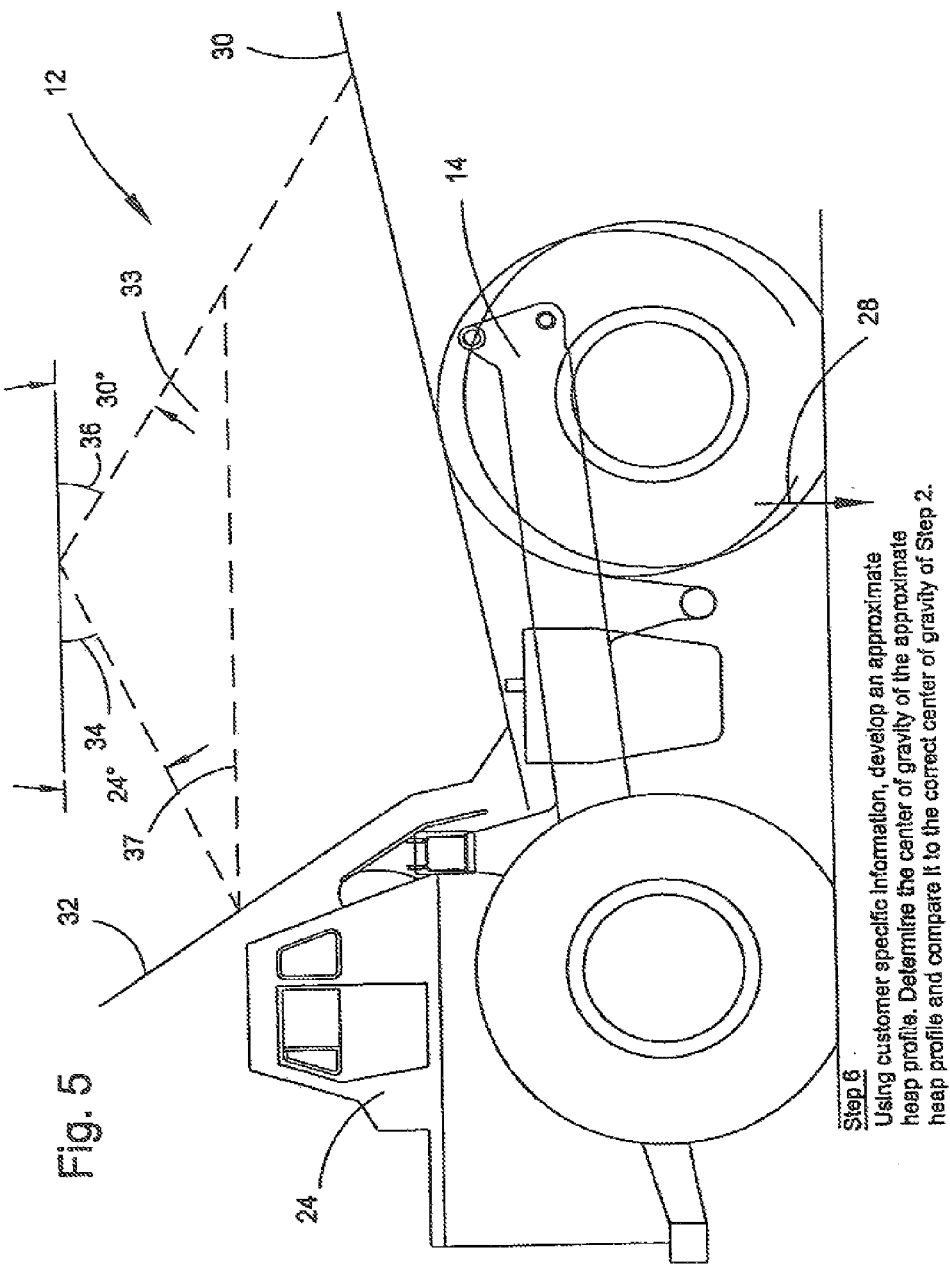
Figure 6:
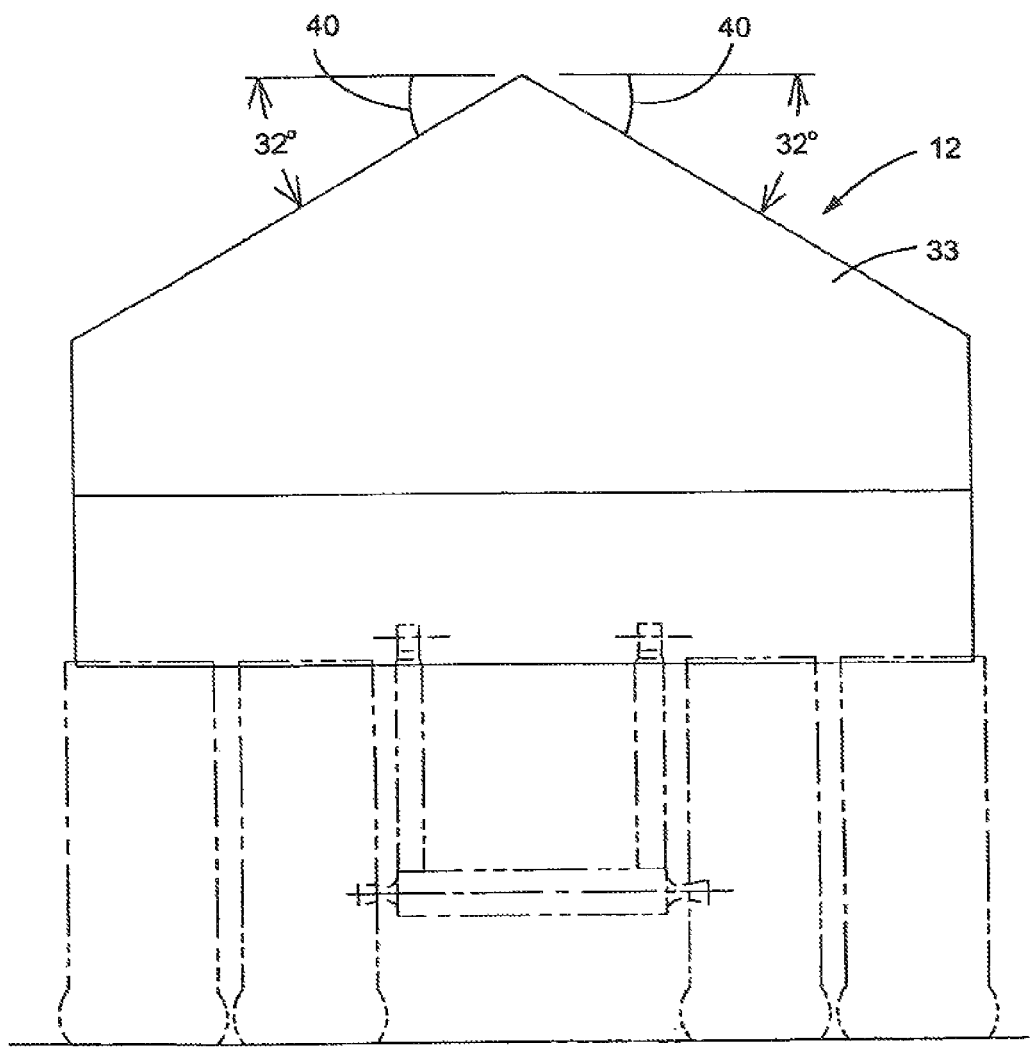
Figure 8A:
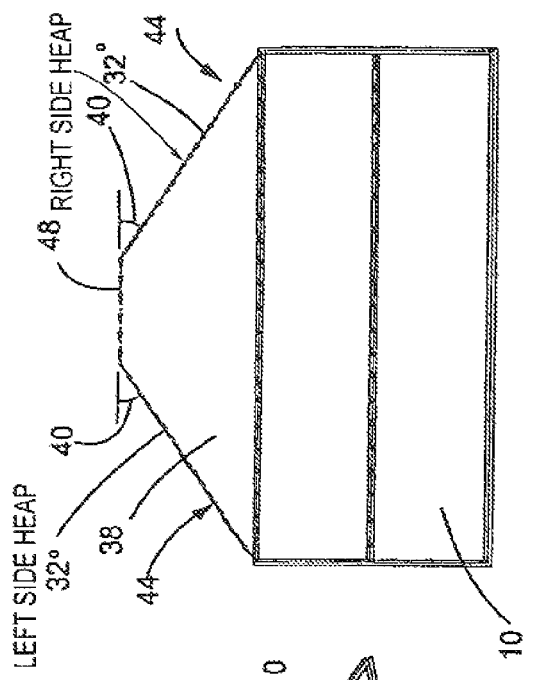
FIG. 8A is a side view of a dump body (outlined in triple solid lines) and a material heap (outline in broken lines) illustrating a process step in the sequence of steps for developing a three-dimensional heaped material load profile based on data collected from a specific haulage environment for use in the dump body design process of the present invention.
Figure 8B:
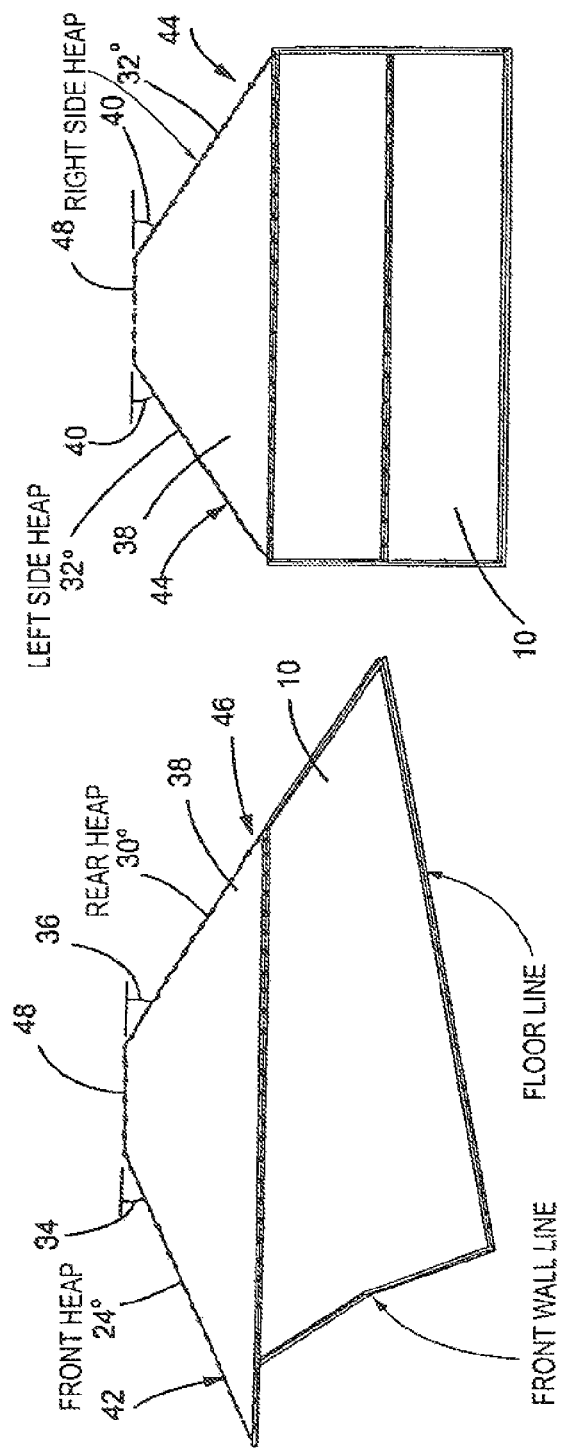
FIG. 8B is a rear view of the dump body (outlined in triple solid lines) and the material heap (outlined in broken lines) of FIG. 3A illustrating a process step in the sequence of steps for developing the three-dimensional heaped load profile.

As shown in FIGS. 5 and 6, using the angles of material repose (i.e. front, rear and sides) data obtained from the analysis of the actual field haulage conditions, an approximate heap profile 33 of the material to be hauled is then generated utilizing the individual average values for the front, rear and sides angles of material, repose 34, 36, 40 (e.g., 24°, 30° and 32° respectively in the illustrated embodiment) taken from the field data. Additionally, as shown in FIG. 5, an initial dump body side height (referenced as line 37) is established at the point where the front angle of material repose 34 contacts the front slope line 32. The placement of the center of gravity of the approximate heap profile 33 along the truck chassis 14 is then determined and compared with the optimal location along the chassis for the load center of gravity (arrow 28).

The angle of the floor line 30, the lengths of the front slope line and floor line and the line defining the height of the sidewalls are adjusted as indicated by the arrows in FIG. 7 so that through an iterative process, the center of gravity of the load can be located as close as possible to the correct truck chassis 14 load center of gravity while maintaining the desired body volume. In adjusting the various parameters, it is preferable to keep the center of gravity of the load as low as possible in order to provide the best truck chassis stability. Accordingly, in one iterative process used to locate the center of gravity of the load in the desired position, it is generally preferable to focus on adjusting the height of the sidewalls and the length of the floor, versus rotating the rear of the floor. For example, either lowering the sidewalls and lengthening the floor to move the center of gravity rearward relative to the chassis 14 or raising the sidewalls and shortening the floor to move the center of gravity forward relative to the chassis 14. Using an iterative process, the width of the body 10 may also be adjusted with the slopes and lengths (within given parameters) of the floor and front slope in order to minimize the overall load height profile. While overall loading height of the dump body influences the size of the loading equipment that is required, lower overall dump body loading heights improve truck stability and lessen the need for larger loading equipment. Lower overall dump body loading heights also necessarily allow the load material to be dropped into the dump body from a lower point, thereby minimizing the impact force of the load material on the dump body. Obviously, the wider the body 10, the lower the center of gravity. As a practical limit, however, the body 10 generally should not be significantly wider than the overall width of the rear axle measured from the outer edges of the rear tires or as preset by the truck chassis manufacturer.

Next, based upon this approximate load profile 33 (e.g., shown in FIG. 6) and the data on the actual field haulage conditions, a three-dimensional model 38 (e.g. shown in FIGS. 8-15) of the load heap is developed which incorporates corner voids and the actual side angles of material repose 40 (e.g., 32°), front and rear angles of material repose 34, 36 (e.g. 24° and 30°) and a top of heaped load plateau 48 as measured from the actual field collected data. The process/steps used to develop the three-dimensional modeled heaped material load profile 38 are generally shown in FIGS. 8-15 with the outline of the truck body 10 shown in triple solid lines and the outline of the three-dimensional model 38 shown in broken lines. To account for corner voids (corners of the body where no hauled material is located) in the three-dimensional modeled load profile 38, the transition areas between the sides and the front and the rear of the load are modeled based on a gradual incremental blending of the side angle of material repose 40 to the front and rear angles of repose 34, 36 (which angles of repose may or may not be different. After the corner voids are so modeled, the modeled voids are then compared to the information collected in the field and the corner voids may then be adjusted so as to as closely as possible match the modeled corner voids with the actual field corner voids. As will be appreciated, the steps described in FIGS. 5-7 are used only to expedite the design process and are not necessary to the present invention. In particular, one can move directly to using the three-dimensional model 38 of the load heap (with the corner voids) and eliminate the steps shown in FIGS. 5-7.

To this end, in one preferred embodiment, the transition areas between the front 42 and the sides 44, and the rear 46 and the sides 44 of the three-dimensional load model 38 are divided into a number of equal segments as shown in FIG. 9. In the illustrated embodiment, the creation of the corner voids (e.g., FIG. 15) through the transitional blending of the angles of repose is only shown with respect to one of the front corners and one of the rear corners of the load. Of course, it will be appreciated that the same methodology described herein can be used to model the voids in the other corners of the load. In the illustrated embodiment, the boundaries of the transition areas between the sides 44 and the front 42 and rear 46 portions of the three-dimensional load model 38 form 90° angles defined by the flat top or plateau 48 (FIGS. 8 and 9), as defined by actual field operating data, of the load model 38, with each of the transition areas being divided into nine equal 10° segments. Planes 50 (FIG. 9) are established in each of these segments which extend at a respective angle of repose that allows, if required, an incremental change in the angle of repose through the corners from the sides 44 to the front 42 and rear 46 of the three-dimensional load model 38. In particular, the difference between the side and rear angles of repose, in this case 2°, and the side and front angles of repose, in this case 8° is divided into nine equal incremental segments as shown in FIG. 9.

Figure 10A:
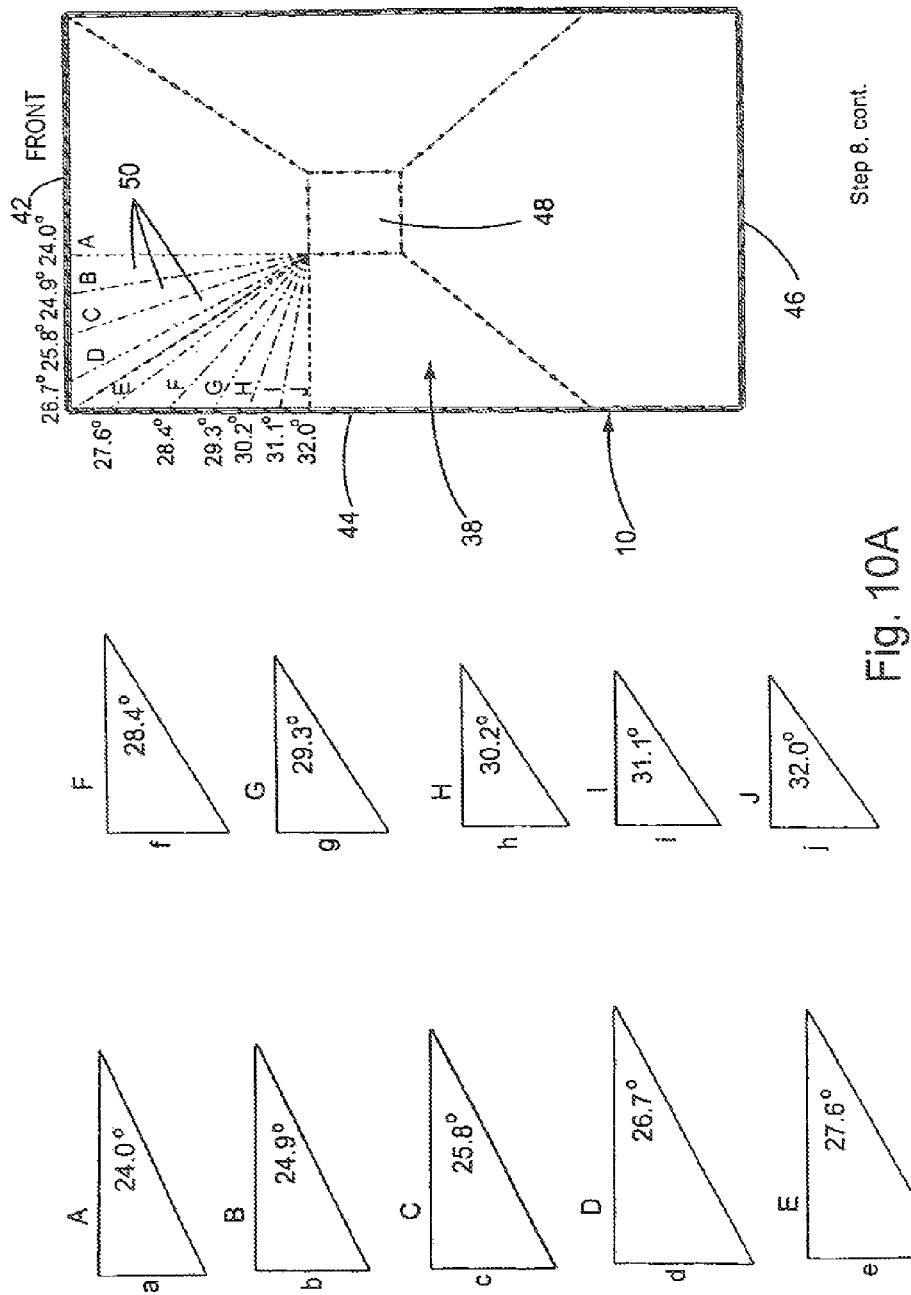
FIGS. 10a and 10b are top views of the dump body and material heap of FIGS. 8A and 8B illustrating in part how the corners of the heaped load are modeled based on an incremental blending of the side angles of material repose to the front and rear angles of material repose to develop the three-dimensional modeled material heap profile.
Figure 10B:
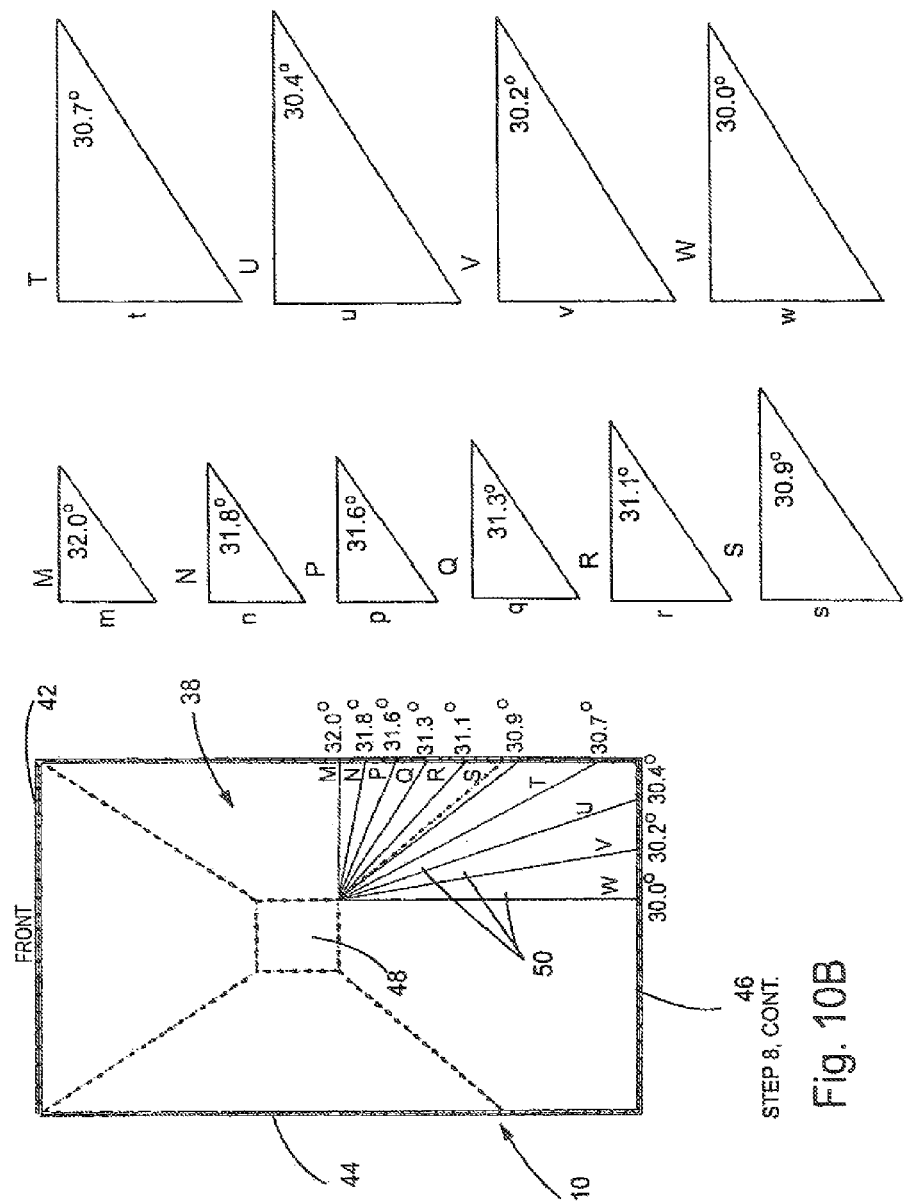

Each of these planes 50 is then extended using standard geometric principles until it intersects a portion of the dump body 10 such as the floor, side walls, front slope or canopy as shown in FIGS. 10a-c and 11. Specifically, as shown in FIGS. 10a-c, end points are established for each of these planes by using the values of the angles of material repose for each of the segments and the horizontal distance for each respective segment from the appropriate corner of the load plateau 48 to the perimeter of the dump body 10 to calculate the horizontal and vertical positions for the end points of the planes. Each plane 50 is then extended to its respective end points (FIG. 11). Next, any portion of the planes 50 which extends beyond the boundaries of the dump body 10 (referenced as 62, 64 and 66 in FIGS. 12-13) is then "cut-off" at the point at which it intersects the dump body to define the corner edges of the three-dimensional load model 38 as shown in FIGS. 12 and 13. The completed three-dimensional load heap profile 38 is shown in FIG. 14 and arranged in the dump body 10 in FIG. 15.

Once the three-dimensional modeling of the material heap is completed, including the modeling of the corner voids along with a subsequent comparison with the field gathered information, the center of gravity of the resulting three-dimensional load model 38 is then determined. This center of gravity is then compared to the center of gravity location (arrow 28) contemplated by the chassis design as shown in FIG. 16. If the center of gravity of the three-dimensional load model 38 is in close proximity to the center of gravity location contemplated by the chassis design then the design of the dump body 10 is complete. It is generally desirable to have the load center of gravity as close as is practical to the desired chassis location. While the distance will vary depending upon the relative length of the wheelbase of the truck, in one preferred embodiment the center of gravity will be considered sufficiently close to the desired location if it is within less than one inch (plus or minus) from the desired location. Due to the inherent design characteristics of off-highway trucks (in an empty condition an inordinate amount of the net weight of the truck is carried on the front axle), in most circumstances, the center of gravity of the three-dimensional load profile should not be allowed to be positioned forward of the center of gravity location contemplated by the chassis design.

In the event that the center of gravity of the three-dimensional load model 38 is not close enough to the desired location, in an iterative process a new three-dimensional profile of the heaped load is generated based on the data collected from the field loading/haulage environment. Through adjustment of the parameters of the dump body (e.g., the dump body floor angle, floor length and side height), the center of gravity of this new three-dimensional heaped load profile is moved through the iterative process until it is in close proximity to the desired location. These steps being repeated in an iterative fashion as necessary until the center of gravity of the three-dimensional load model is adjusted to be approximately coincident with the anticipated center of gravity contemplated by the design of the truck chassis 14.

The final design of the dump body 10 is shown in FIG. 17. In accordance with the present invention, the body 10 is custom modeled/designed based on specific field material, loading and hauling conditions and thus when the body is used in the field it will carry the desired volumetric hauling capacity and the center of gravity of the load will be in closer proximity to the desired center of gravity location than bodies designed using theoretical heap load profiles (see, e.g., FIG. 20).

FIGS. 18a-b are a flow diagram which illustrates the individual steps in the design process of the present invention which are described herein and shown in the drawings of FIGS. 1-17. For ease of reference, the steps in the flow diagram of FIGS. 18a-b are numbered to correspond with the numbering of the steps in FIGS. 1-17. As will be appreciated by those skilled in the art, steps 6 and 7 shown in FIGS. 13a-b can be considered optional in the design process.

Figure 19:
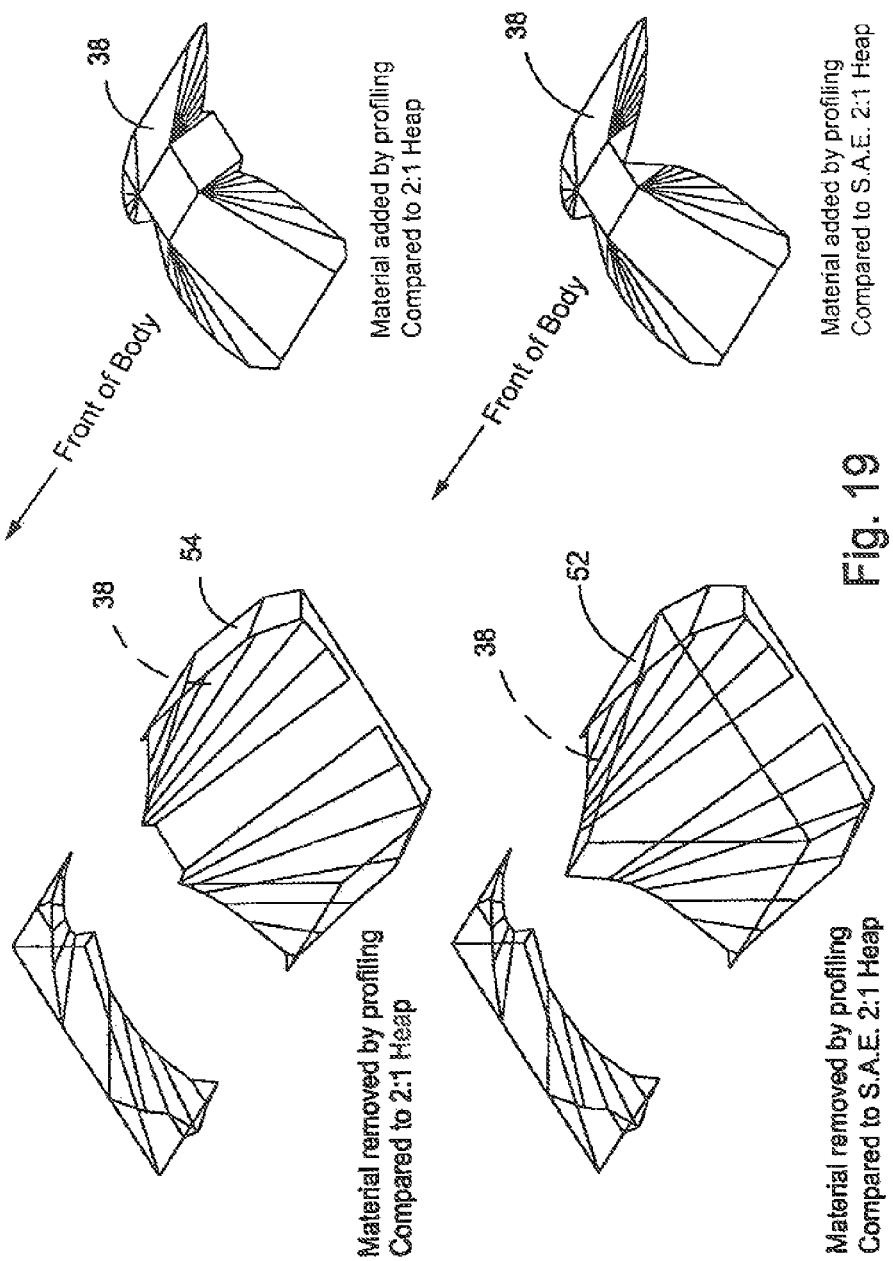
FIG. 19 is perspective drawing illustrating the differences between the three-dimensional heaped load profile of FIG. 15 and a load profile produced using a S.A.E, J 1363 (January 1985) 2:1 heap rating standard and a load profile produced using a 2:1 straight heap rating.

As will be appreciated, the use of actual angles of repose gathered from data taken from the actual field haulage conditions in which the dump body 10 will be employed can have a significant impact on the model of the load and thus ultimately on the design of the dump body. For example, as shown in FIG. 19, in the illustrated example of a load having actual 32° side, 24° front and 30° rear angles of repose, the three-dimensional load modeling process of the present invention results in a significant amount of material being removed from the front and rear and through part of the corners of the three dimensional load model 38 as compared to a standard 2:1 heap model 54 and a S.A.E. 2:1 heap model 52 as defined by S.A.E. Standard No. J 1263 (January 1985) (with the profiled three-dimensional model created using the present invention shown in broken lines and the S.A.E. 2:1 heaped model and standard 2:1 heaped model shown in solid lines). In this case, the three-dimensional load modeling process of the present invention also results in a significant amount of load material being added to the sides in the three-dimensional load model 38 as compared to the S.A.E. 2:1 heap and the standard 2:1 heap.

Figure 20:
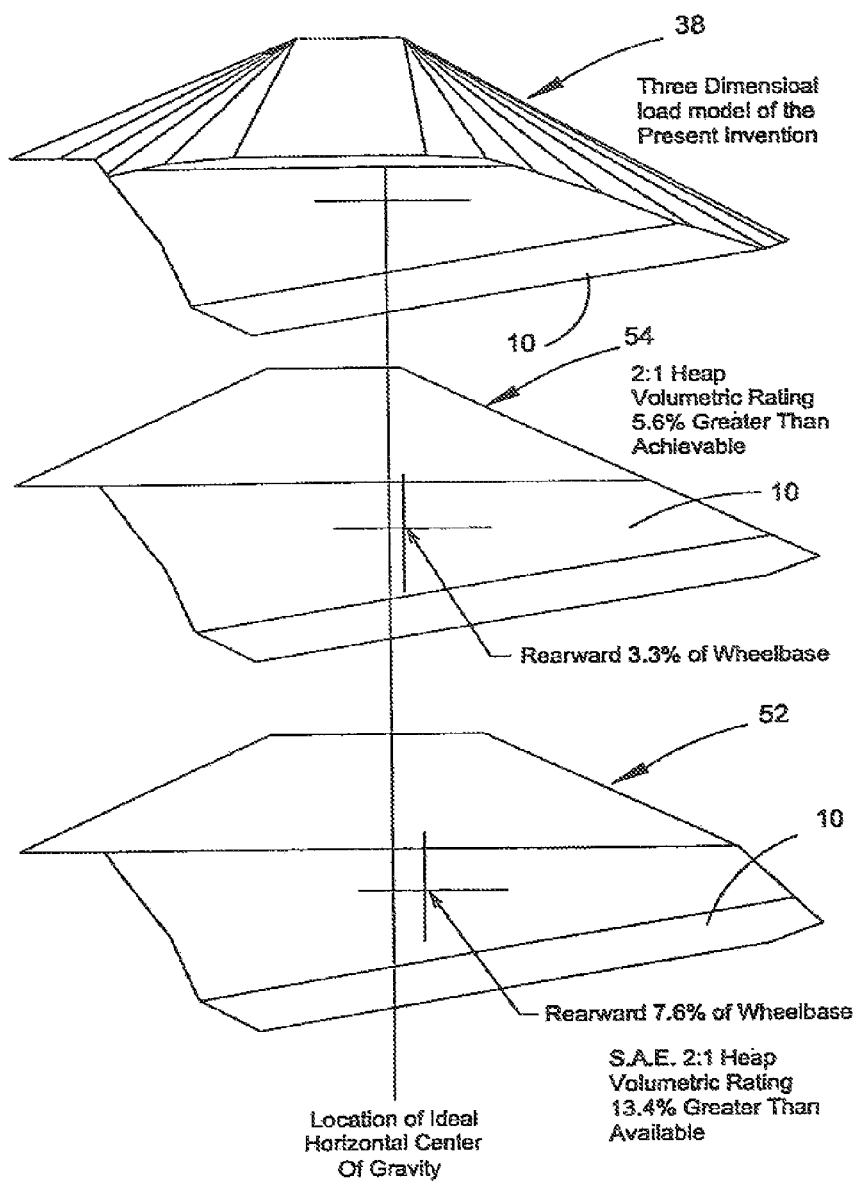
FIG. 20 is a comparison diagram illustrating the differences between the three-dimensional modeled material heap load profile of FIG. 15 as carried in a dump body and a straight 2:1 heap load profile and a S.A.E. 2:1 heap load profile as carried in the same dump body.

An example of how these differences in the load model can impact the location of the center of gravity of the load as it is carried in a dump body and the rated capacity or yardage of the dump body is shown in FIG. 20 (which is a side view of the load models shown in FIG. 19). More particularly, in FIG. 20, the location of the center of gravity and capacity of the three dimensional load model 38 as carried in a dump body is compared to the center of gravity and rated capacity of load models using the S.A.E. 2:1 heap standard model 52 or the 2:1 heap model 54 in the same dump body. As can be seen, the use of the S.A.E. 2:1 standard heap model 52 and the 2:1 neap model 54 results in the center of gravity being offset from the ideal location and in an overstatement of the truck body capacity. Of course, FIGS. 19 and 20 provide just one illustrative example of the differences between the three dimensional modeled heaped load profiles which result from using the process of the present invention as compared to heaped load models created using theoretical load profiles. Since the load modeling process of the present invention is dependent upon angle of repose data collected from the actual field haulage environment, the differences which result from using the load modeling process of the present invention as compared to the theoretical load profiling will vary on a case-by-case basis.

In view of the foregoing, it will be appreciated that, unlike the theoretical load profiling currently being done, the body and design process of the present invention takes into account the field material, loading and hauling conditions in which the dump body will be used and provides a method by which this information can be used in a meaningful manner in designing the dump body. Thus, a much more accurately designed dump body is produced resulting in improved body capacity and corresponding load retention, and proper placement of the load on the truck chassis and tires.

Figure 25:
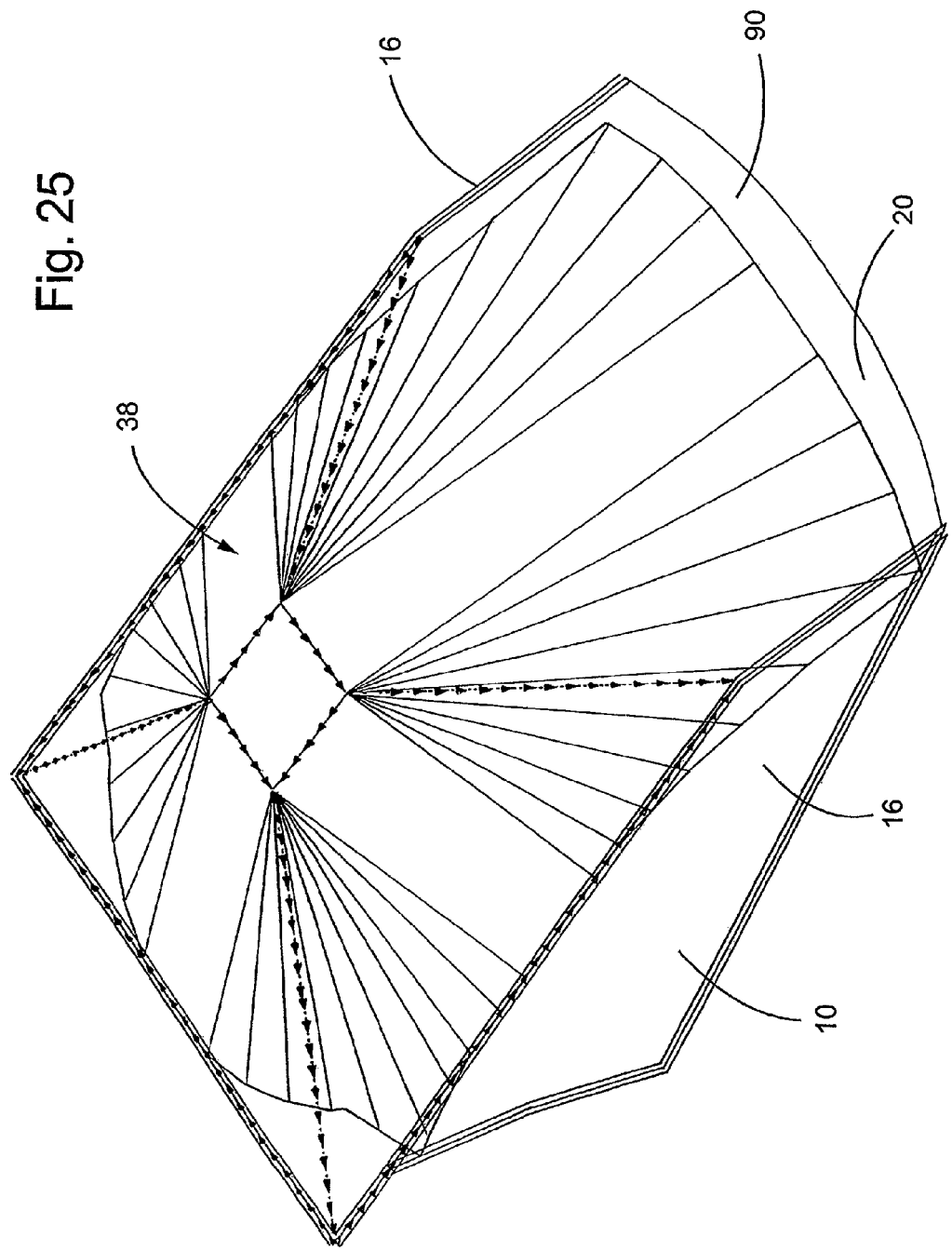
FIG. 25 is a perspective view of an alternative embodiment of dump body according to the present invention have a curved rear edge.

In accordance with a further aspect of the present invention, the floor 20 of the dump body 10 can be configured so as to help ensure that the load is placed in the proper position in the dump body 10 during the loading process. In particular, the rear edge 90 of the floor 20 of the dump body can have a rounded or curved configuration, as shown in FIG. 25, in which the length of the floor 20 is less near the sidewalls 16 than in the middle. The rear edge 90 of the floor 20 can be curved inward adjacent the sidewalls because of the rear corner voids in the heaped load as shown for example in FIG. 15. Curving the rear edge 90 of the floor 20 limits the space available at the rear of the dump body 10 for retaining the load and thereby helps prevent an off-center loading condition. If an operator attempts to load material too far rearward in the dump body 10, the material will simply fall off rear edge 90. The degree to which the rear edge 90 of the floor 20 can be curved is determined by examining the curve of the rear edge of the three dimensional heaped load profile 38 (see, e.g., FIG. 15). Specifically, the curve of the rear edge 90 can be configured to correspond with the curve of the rear edge of the three dimensional heaped load profile 38 (see FIG. 25). As will be appreciated, if a curved rear edge 90 is used for the floor 20, the sidewalls 16 are then modified to follow the curve of the floor 20.

According to another aspect of the present invention, for situations in which a relatively large capacity cable shovel bucket will be used to load material into the dump body, the dump body 10 can be designed with a relatively wider inside body width than conventional dump bodies in order to substantially reduce the impact force of the falling load and ensure that the load is properly placed within the dump body. Specifically, as the size and capacity of the buckets on cable shovels has increased, it has become possible to fill a dump body to capacity in four or less passes with the shovel bucket. However, using such large capacity loading buckets to load dump bodies has led to loads being improperly placed within the dump body and substantial increases in the impact force caused by the material as it drops into the dump body.

Figure 23:
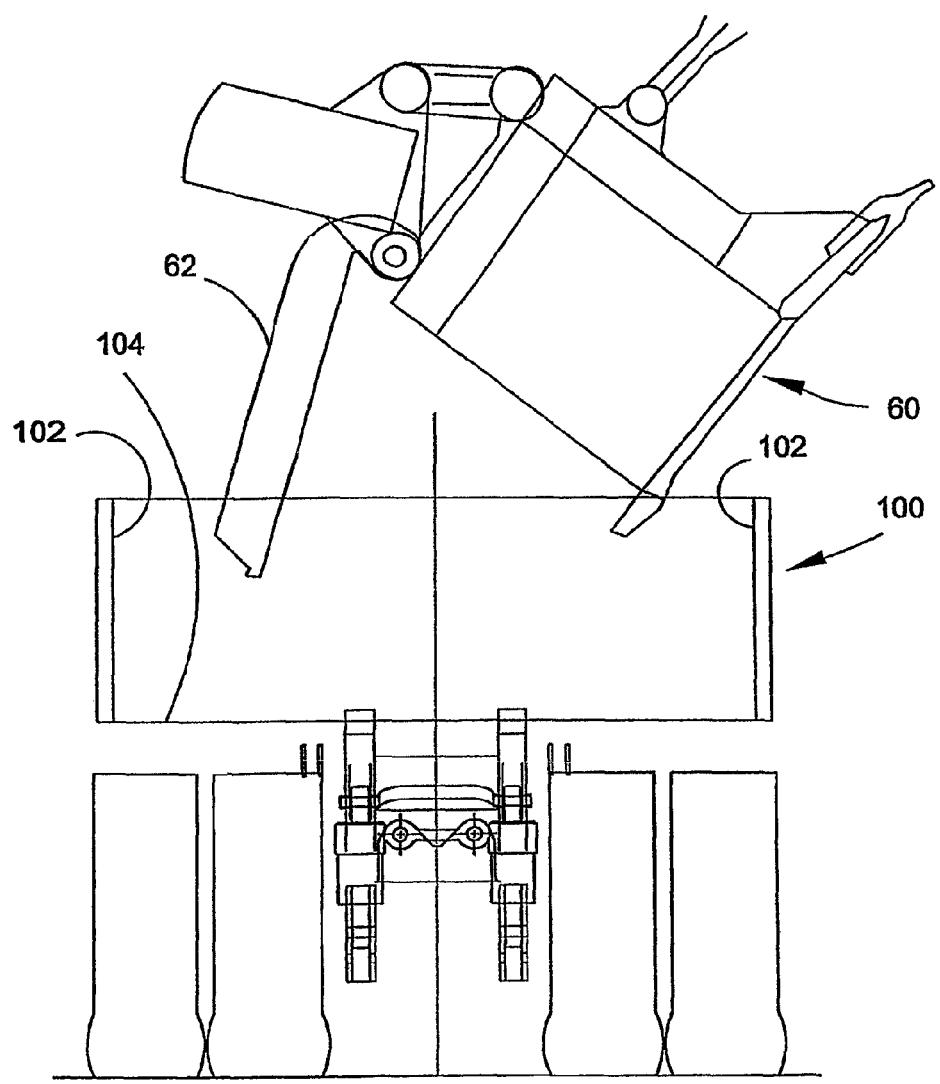
FIG. 23 is an end view of a prior art off-highway dump body being loaded by a large-capacity cable shovel or bucket.

As explained above, cable shovel buckets 60 (FIGS. 23-24) have a swinging door or gate 62 which will swing towards one sidewall of the dump body when opened to allow the material contained in the bucket to drop into the dump body. Accordingly, during a loading operation, the shovel operator must be careful to give sufficient clearance to the sides of the dump body 10 so that the gate 62 will not collide with the sidewall of the dump body when the gate is released. Because conventional dump bodies provided by off-highway truck manufacturers are relatively narrow, operators of large capacity loading buckets must position the bucket relatively close to one of the sidewalls of the dump body to ensure that the swinging gate does not swing into the opposing sidewall when it is released. For example, FIG. 23 is a scaled drawing showing one of the new large-capacity buckets 60 being used to load a conventional relatively narrower dump body 100. As will be appreciated, it is very difficult and time consuming to properly position a large-capacity bucket 60 with respect to a conventional dump body 100. Moreover, since the bucket 60 must be positioned relatively close to one of the sidewalls 102 of the dump body 100, the material is discharged in an off-center position relative to the dump body leading to improper loading of the dump body and truck chassis. However, if the bucket operator attempts to the place the load in the center of the dump body 100, the gate when it is released 62 will swing into the sidewall 102 of the dump body.

Additionally, when loading conventional dump bodies with large capacity buckets, the clearance between the floor 104 of the dump body 100 and the swinging gate 62 in the freed position cannot be minimized because the operator must ensure that the bucket does not come into contact with the sidewalls 102 of the dump body. As a result, the load must be dropped from the bucket 60 at a relatively large distance above the floor 104 of the dump body 100. Because of the extremely large capacity of these large buckets, the dropping material produces a very substantial impact force when it contacts the floor of the dump body. This impact force significantly increases the wear on the dump body and can severely jar the operator of the truck.

Figure 24:
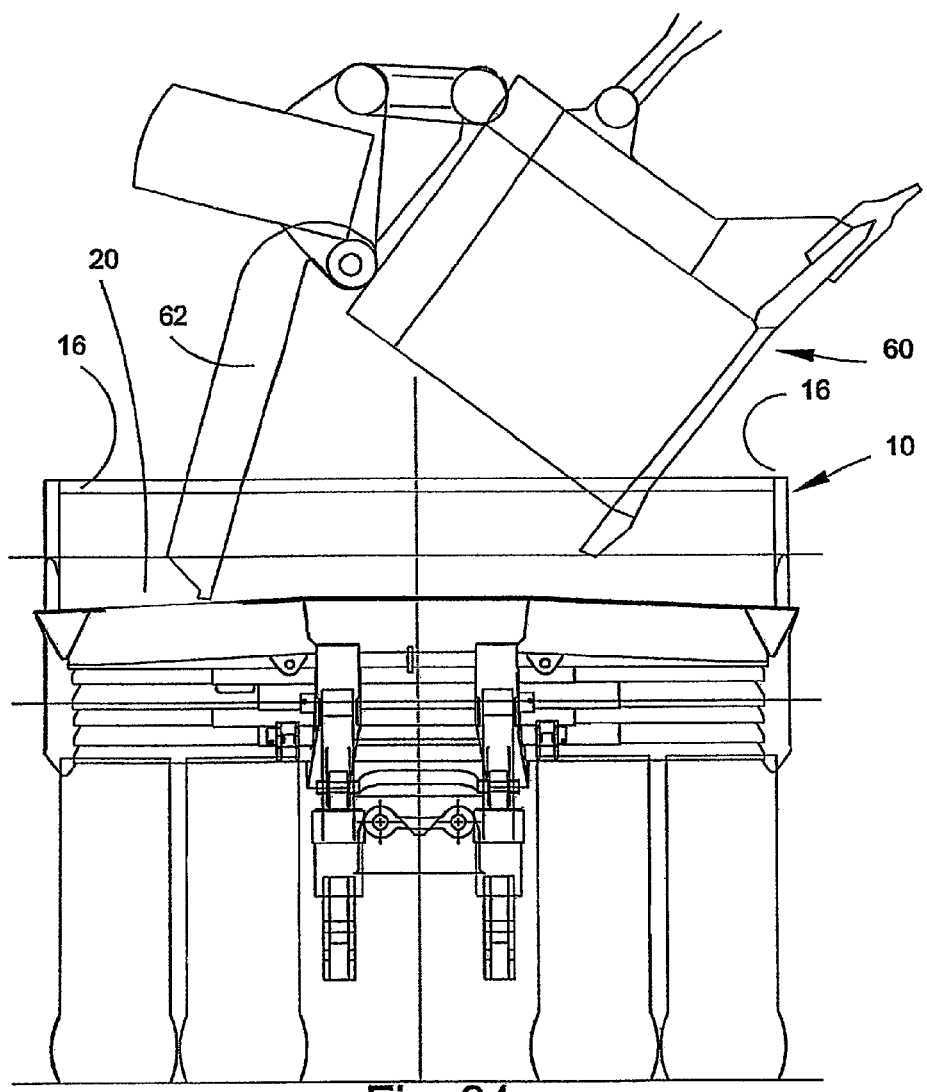
FIG. 24 is an end view of a dump body of the present invention being loaded by a large-capacity cable shovel or bucket.

In contrast to conventional loading operations involving prior art dump bodies and large capacity buckets, the present invention provides a method by which material can be loaded from a minimal height substantially into the center of a dump body 10 using a large capacity bucket 60 whose volumetric capacity is approximately ¼ or more than that of the dump body 10. As shown in FIG. 24, this is accomplished by using a relatively wider dump body 10 that has relatively lower sidewalls 16 than the similar capacity dump bodies conventionally provided by off-highway truck manufacturers. This allows a bucket operator to bring the bucket 60 into a substantially lower position in which just enough clearance is provided from the floor 20 of the dump body for operation of the swinging gate 62 before discharging the load from the bucket. In particular, using a relatively wider dump body 10, enables a shovel operator to lower the bucket 60 to a position that: (1) substantially minimizes the clearance between the floor 20 of the dump body 10 and the swinging gate 62 so as to minimize the impact force of the dropping load and (2) allows the material to be discharged substantially in the center of the clump body 10 while (3) allowing the swinging gate 62 to clear the sidewalls 16 of the dump body as it swings through an arc after it is freed. Thus, the method of the present invention results in a more balanced load on the dump body and a substantially reduced impact force from the discharge of the bucket load.

All of the references cited herein, including patents, patent applications, and publications, are hereby incorporated in their entireties by reference.

While this invention has been described with an emphasis upon preferred embodiments, it will be obvious to those of ordinary skill in the art that variations of the preferred embodiments may be used and that it is intended that the invention may be practiced otherwise than as specifically described herein. Accordingly, this invention includes all modifications encompassed within the spirit and scope of the invention as defined by the following claims.

What is claimed is:

1. A body of a vehicle for hauling material, the body made by the following process:
   (a) determining the desired load distribution of weight on a chassis of the haulage vehicle;
   (b) determining the desired volumetric capacity for the body;
   (c) establishing a line for a floor, a line for a front wall of the body and an inside body width;
   (d) developing a three dimensional model of the hauled material carried in the body, including modeling corner voids of the hauled material, using data collected from an anticipated point of use with the three dimensional model of the hauled material having a distribution of weight on the chassis;

(e) adjusting a set of design parameters of the body until the three dimensional model distribution of weight on the chassis is substantially similar to the desired distribution of weight on the chassis and the volumetric capacity of the body is substantially similar to the desired volumetric capacity, including curving a rear edge of the floor to correspond with rear corner voids in the three-dimensional model; and (f) producing the body in accordance with the set of design parameters.

2. The body of claim 1, wherein the developing the three-dimensional model of a heaped load includes determining a height of a top load plateau profile of the three-dimensional model.

3. The body of claim 1, wherein the collected data includes at least one material angle of repose of a heaped load to be carried by the body.

4. The body of claim 1, wherein the body is a truck body.

5. The body of claim 4, wherein the truck body has an open rear end.

6. The body of claim 4, wherein the truck body has an open top.

* * * * *